United States Patent
Sim et al.

(10) Patent No.: US 11,961,945 B2
(45) Date of Patent: Apr. 16, 2024

(54) LIGHT EMITTING ELEMENT, METHOD OF MANUFACTURING THE SAME, AND DISPLAY DEVICE INCLUDING THE LIGHT EMITTING ELEMENT

(71) Applicant: Samsung Display Co., Ltd., Yongin-si (KR)

(72) Inventors: Jun Bo Sim, Yongin-si (KR); Chang Hee Lee, Yongin-si (KR); Yun Hyuk Ko, Yongin-si (KR); Sang Ho Jeon, Yongin-si (KR); Jae Kook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 281 days.

(21) Appl. No.: 17/350,949

(22) Filed: Jun. 17, 2021

(65) Prior Publication Data

US 2022/0158039 A1    May 19, 2022

(30) Foreign Application Priority Data

Nov. 19, 2020    (KR) .......................... 10-2020-0155887

(51) Int. Cl.
*H01L 33/44*    (2010.01)
*H01L 25/075*   (2006.01)
*H01L 25/16*    (2023.01)
*H01L 33/00*    (2010.01)
*H01L 33/62*    (2010.01)

(52) U.S. Cl.
CPC .......... *H01L 33/44* (2013.01); *H01L 25/0753* (2013.01); *H01L 25/167* (2013.01); *H01L 33/007* (2013.01); *H01L 33/0075* (2013.01); *H01L 33/0093* (2020.05); *H01L 33/62* (2013.01); *H01L 2933/0025* (2013.01)

(58) Field of Classification Search
None
See application file for complete search history.

(56) References Cited

U.S. PATENT DOCUMENTS

| | | | |
|---|---|---|---|
| 7,964,884 B2 | 6/2011 | Lee | |
| 9,653,655 B2 | 5/2017 | Thompson et al. | |
| 2011/0133234 A1* | 6/2011 | Jeong | ...................... H01L 27/15 257/98 |
| 2012/0298954 A1 | 11/2012 | Kim et al. | |
| 2013/0015483 A1* | 1/2013 | Shimokawa | ............ H01L 24/96 257/E33.072 |
| 2022/0199863 A1 | 6/2022 | Kim et al. | |

FOREIGN PATENT DOCUMENTS

| | | |
|---|---|---|
| KR | 10-0670928 B1 | 1/2007 |
| KR | 10-2012-0130840 A | 12/2012 |
| KR | 10-2022-0089806 A | 6/2022 |

* cited by examiner

*Primary Examiner* — Robert K Carpenter
(74) *Attorney, Agent, or Firm* — Lewis Roca Rothgerber Christie LLP

(57) ABSTRACT

A light emitting element includes: a light emitting stack pattern including a first semiconductor layer, an active layer, and a second semiconductor layer that are sequentially stacked along one direction; and an insulating film surrounding an outer surface of at least one of the first semiconductor layer, the active layer, and the second semiconductor layer. The insulating film including a zinc oxide (ZnO) thin film layer.

16 Claims, 27 Drawing Sheets

LIGHT EMITTING ELEMENT, METHOD OF MANUFACTURING THE SAME, AND DISPLAY DEVICE INCLUDING THE LIGHT EMITTING ELEMENT

CROSS-REFERENCE TO RELATED APPLICATION

This application claims priority to and the benefit of Korean patent application 10-2020-0155887 filed on Nov. 19, 2020 in the Korean Intellectual Property Office, the entire disclosure of which is incorporated herein by reference.

BACKGROUND

1. Field

The present disclosure generally relates to a light emitting element, a method of manufacturing the same, and a display device including the light emitting element.

2. Related Art

As interest in information displays and demand for portable information media have increased, there has been a focus on research and commercialization of display devices.

SUMMARY

Some embodiments of the present disclosure provide a light emitting element and a method of manufacturing the same to achieve improved element lifetime and efficiency by controlling a surface defect of the light emitting element.

Some embodiments of the present disclosure also provide a display device including the light emitting element.

In accordance with an aspect of embodiments according to the present disclosure, there is provided a light emitting element including: a light emitting stack pattern (or a light emitting pattern) including a first semiconductor layer, an active layer, and a second semiconductor layer that are sequentially stacked along one direction; and an insulating film surrounding an outer surface (e.g., an outer circumferential surface or an outer periphery) of at least one of the first semiconductor layer, the active layer, and the second semiconductor layer, wherein the insulating film includes a zinc oxide (ZnO) thin film layer.

The insulating film may be doped with at least one of Group III transition metals including yttrium (Y), scandium (Sc), lanthanum (La), actinium (Ac), lutetium (Lu), and lawrencium (Lr).

The insulating film may be directly located on the outer surface of each of the first semiconductor layer, the active layer, and the second semiconductor layer.

The first semiconductor layer may include an n-type semiconductor layer doped with an n-type dopant, and the second semiconductor layer may include a p-type semiconductor layer doped with a p-type dopant.

The light emitting element may further include a protective film (or a first protective film) surrounding an outer surface of the insulating film. The protective film may include an inorganic material.

The inorganic material may include at least one of $SiO_x$, $SiN_x$, $SiO_xN_y$, $AlO_x$, $AlN_x$, $ZrO_x$, $HfO_x$, and $TiO_x$.

The light emitting element may further include an additional protective film (or a second protective film) surrounding an outer surface of the protective film. The additional protective film may include a same material as the protective film.

The light emitting element may further include a protective film (of a first protective film) located between the light emitting stack pattern and the insulating film, the protective film surrounding an outer surface of the light emitting stack pattern. The protective film may include an inorganic material.

The light emitting element may further include an additional protective film (or second protective film) surrounding an outer surface of the insulating film. The additional protective film may include a same material as the protective film.

The light emitting element may further include an additional protective film (or second protective film) located between the protective film and the insulating film, the additional protective film surrounding an outer surface of the protective film. The additional protective film may include a same material as the protective film. The insulating film may entirely surround an outer surface of the additional protective film.

The insulating film may include a first insulating film surrounding an outer surface of the light emitting stack pattern and a second insulating film surrounding an outer surface of the first insulating film. The first insulating film and the second insulating film may include a same material.

The light emitting element may further include a protective film located between the first insulating film and the second insulating film, the protective film surrounding the outer surface of the first insulating film. The protective film includes an inorganic material.

In accordance with another aspect of the present disclosure, there is provided a method of manufacturing a light emitting element, the method including: forming a light emitting stack structure by sequentially stacking a first semiconductor layer, an active layer, a second semiconductor layer, and an additional electrode (or an electrode layer) on a substrate; forming at least one light emitting stack pattern by etching the light emitting stack structure in a vertical direction, and exposing one region of the first semiconductor layer to the outside; coating an insulating material layer made of a zinc acetate solution on the light emitting stack pattern by using a wet chemical process and drying the coated insulating material layer; forming an insulating film surrounding an outer surface of the light emitting stack pattern by etching the dried insulating material layer in a vertical direction; and forming a light emitting element by separating the light emitting stack pattern surrounded by the insulating film from the substrate.

In accordance with still another aspect of the present disclosure, there is provided a display device including: a substrate; a first electrode and a second electrode, spaced from each other along a first direction on one surface of the substrate, the first electrode and the second electrode extending in a second direction different from the first direction; and a plurality of light emitting elements located between the first electrode and the second electrode, each of the plurality of light emitting elements including one end portion electrically connected to the first electrode and the other end portion electrically connected to the second electrode.

Each of the light emitting elements may include: a first semiconductor layer; an active layer on the first semiconductor layer; a second semiconductor layer on the active layer; and an insulating film surrounding an outer surface of at least one of the first semiconductor layer, the active layer, and the second semiconductor layer. The insulating film includes a zinc oxide (ZnO) thin film layer doped with at least one of Group III transition metals including yttrium (Y), scandium (Sc), lanthanum (La), actinium (Ac), lutetium (Lu), and lawrencium (Lr).

BRIEF DESCRIPTION OF THE DRAWINGS

Some embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
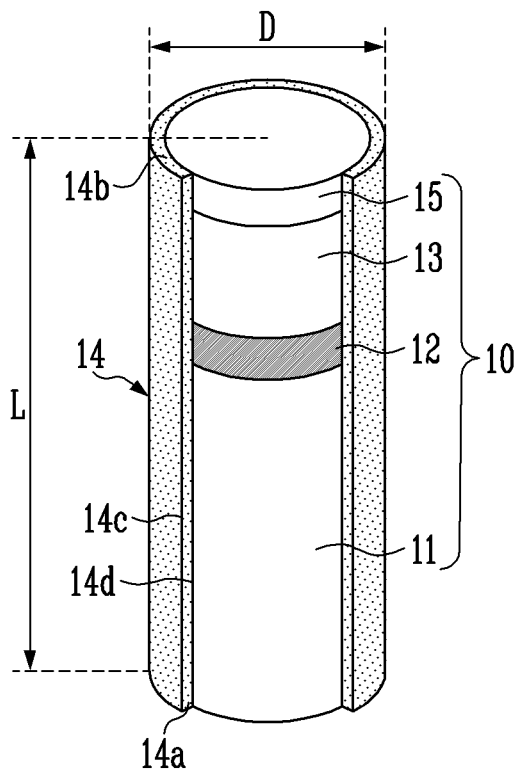
FIG. 1 is a schematic perspective cutaway view illustrating a light emitting element in accordance with an embodiment of the present disclosure.

The present disclosure may apply various changes and different shape, therefore only illustrate in details with some examples. However, the examples do not limit to certain shapes but apply to all the change and equivalent materials and replacements. The drawings included are illustrated a fashion where the figures are expanded for the better understanding.

Like reference numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in the present disclosure, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In the present disclosure, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, embodiments of the present disclosure and items that would enable those skilled in the art to understand the content of the present disclosure will be described in detail with reference to the accompanying drawings. In the following description, singular forms in the present disclosure are intended to include the plural forms as well, unless the context clearly indicates otherwise.

Figure 2:
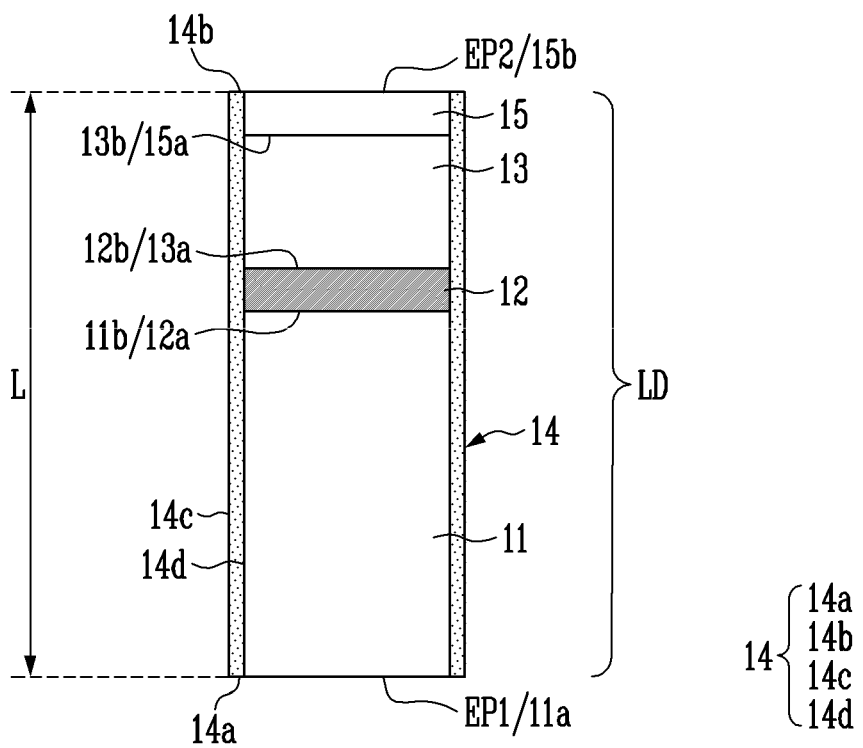
FIG. 2 is a schematic cross-sectional view of the light emitting element shown in FIG. 1.

FIG. 1 is a schematic perspective cutaway view illustrating a light emitting element LD in accordance with an embodiment of the present disclosure. FIG. 2 is a schematic cross-sectional view of the light emitting element LD shown in FIG. 1.

In an embodiment of the present disclosure, the kind and/or shape of the light emitting element LD is not limited to the embodiment shown in FIGS. 1 and 2.

Referring to FIGS. 1 and 2, the light emitting element LD may include a first semiconductor layer 11, a second semiconductor layer 13, and an active layer 12 interposed between the first semiconductor layer 11 and the second semiconductor layer 13. Also, the light emitting element LD may further include an additional electrode 15 (or electrode layer) located on the second semiconductor layer 13.

In an embodiment, the light emitting element LD may be implemented with a light emitting stack pattern (or a light emitting pattern) 10 in which the first semiconductor layer 11, the active layer 12, the second semiconductor layer 13, and the additional electrode 15 are sequentially stacked. In some embodiments, the light emitting element LD may be implemented with a light emitting stack pattern 10 in which the first semiconductor layer 11, the active layer 12, and the second semiconductor layer 13 are sequentially stacked.

The light emitting element LD may be provided in a shape extending in one direction. When assuming that an extending direction of the light emitting element LD is a length direction, the light emitting element LD may include a first end portion EP1 (or lower end portion) and a second end portion EP2 (or upper end portion) along the extending direction. One of the first and second semiconductor layers 11 and 13 may be disposed at the first end portion EP1 (or lower end portion) of the light emitting element LD, and the other one of the first and second semiconductor layers 11 and 13 may be disposed at the second end portion EP2 (or upper end portion) of the light emitting element LD. In an embodiment, the first semiconductor layer 11 may be disposed at the first end portion EP1 (or lower end portion) of the light emitting element LD, and the second semiconductor layer 13 or the additional electrode 15 in ohmic contact with the second semiconductor layer 13 may be disposed at the second end portion EP2 (or upper end portion) of the light emitting element LD.

The light emitting element LD may be provided in various shapes. By way example, the light emitting element LD may have a rod-like shape, a bar-like shape, or a pillar shape, which is long in its length L direction (i.e., its aspect ratio is greater than 1) compared to the diameter D (or a width of a cross-section) of the light emitting element LD. In an embodiment of the present disclosure, a length L of the light emitting element LD in the length direction may be larger than a diameter D (or a width of a cross-section) of the light emitting element LD. The light emitting element LD may include, for example, a pillar-shaped light emitting diode (LED) manufactured small enough to have a diameter D and/or a length L to a degree of nanometer scale to micrometer scale. In some embodiments, the light emitting element LD may have a rod-like shape, a bar-like shape, or a pillar shape, which is short in its length L direction (i.e., its aspect ratio is smaller than 1) compared to the diameter D (or a width of a cross-section) of the light emitting element LD. In other embodiments, the light emitting element LD may have a rod-like shape, a bar-like shape, or a pillar shape, which has the same aspect ratio.

When the light emitting element LD is long in its length L direction (i.e., its aspect ratio is greater than 1), the diameter D of the light emitting element LD may be about 0.5 μm to 6 μm, and the length L of the light emitting element LD may be about 1 μm to 10 μm. However, the diameter D and the length L of the light emitting element LD are not limited thereto, and the size of the light emitting element LD may be modified to be suitable for requirements (or design conditions) of a lighting device or a self-luminescent display device, to which the light emitting element LD is applied.

The first semiconductor layer 11 may include, for example, at least one n-type semiconductor layer. For example, the first semiconductor layer 11 may include any one semiconductor material from among InAlGaN, GaN, AlGaN, InGaN, AlN, and InN, and include an n-type semiconductor layer doped with a first conductive dopant (or n-type dopant) such as Si, Ge, Sn, or Te. However, the material constituting the first semiconductor layer 11 is not limited thereto. In addition, the first semiconductor layer 11 may be configured with various materials. The first semiconductor layer 11 may include an upper surface 11b in contact with the active layer 12 along the length L direction of the light emitting element LD and a lower surface 11a exposed to the outside. The lower surface 11a of the first semiconductor layer 11 may be the first end portion EP1 (or lower end portion) of the light emitting element LD.

The active layer 12 is formed on the first semiconductor layer 11, and may be formed in a single or multiple quantum well structure. By way of example, when the active layer 12 is formed in the multiple quantum well structure, a barrier layer, a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and use a double hetero structure. In an embodiment of the present disclosure, a clad layer doped with a conductive dopant may be formed on the top and/or the bottom of the active layer 12 along the length L direction of the light emitting element LD. By way of example, the clad layer may be formed as an AlGaN layer or InAlGaN layer. In some embodiments, a material such as AlGaN or AlInGaN may be used to form the active layer 12. In addition, the active layer 12 may be configured with various materials. The active layer 12 may include a first surface 12a and a second surface 12b, that are opposite each other in the length L direction of the light emitting element LD. The first surface 12a of the active layer 12 may be in contact with the upper surface 11b of the first semiconductor layer 11.

When an electric field having a suitable voltage (e.g., a predetermined voltage) or more is applied between both the end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting apparatuses, including a pixel of a display device.

The second semiconductor layer 13 is formed on the active layer 12, and may include a semiconductor layer having a type different from that of the first semiconductor layer 11. By way of example, the second semiconductor layer 13 may include at least one p-type semiconductor material. For example, the second semiconductor layer 13 may include at least one semiconductor material from among InAlGaN, GaN, AlGaN, InGaN, AlN, and InN, and include a p-type semiconductor layer doped with a second conductive dopant (or p-type dopant) such as Mg, Zn, Ca, Sr, or Ba. However, the material constituting the second semiconductor layer 13 is not limited thereto. In addition, the second semiconductor layer 13 may be configured with various materials. The second semiconductor layer 13 may include a lower surface 13a located on the active layer 12 along the length L direction of the light emitting element LD and an upper surface 13b in contact with a lower surface 15a of the additional electrode 15. The lower surface 13a of the second semiconductor layer 13 may be in contact with the second surface 12b of the active layer 12.

In an embodiment of the present disclosure, the first semiconductor layer 11 and the second semiconductor layer 13 may have different thicknesses in the length L direction of the light emitting element LD. By way of example, the first semiconductor layer 11 may have a thickness relatively thicker than that of the second semiconductor layer 13 along the length L direction of the light emitting element LD. Accordingly, the active layer 12 of the light emitting element LD may be located more adjacent to the upper surface 13b of the second semiconductor layer 13 than the lower surface 11a of the first semiconductor layer 11. However, the present disclosure is not limited thereto. In some embodiments, the first semiconductor layer 11 and the second semiconductor layer 13 may have the same thickness in the length L direction of the light emitting element LD. The active layer 12 may be located in the middle in the length L direction of the light emitting element LD.

Meanwhile, although it is illustrated that each of the first semiconductor layer 11 and the second semiconductor layer 13 is configured with one layer, the present disclosure is not limited thereto. In an embodiment of the present disclosure, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAInP, p-AlInP or p-AlGaInP, but the present disclosure is not limited thereto.

In some embodiments, the light emitting stack pattern 10 may further include the additional electrode 15 disposed on the second semiconductor layer 13.

The additional electrode 15 may be in contact with the upper surface 13b of the second semiconductor layer 13. The additional electrode 15 may be an ohmic contact electrode electrically connected to the second semiconductor layer 13. The additional electrode 15 may include a conductive material having a certain transmittance (or light transmittance) or more. By way of example, the additional electrode 15 may use one or mixture of chromium (Cr), titanium (Ti), aluminum (Al), gold (Au), nickel (Ni), indium tin oxide (ITO), indium zinc oxide (IZO), indium tin zinc oxide (ITZO), and any oxide or alloy thereof. The additional electrode 15 may be substantially transparent. Accordingly, light generated in the active layer 12 of the light emitting element LD may be transmitted through the additional electrode 15 and then emitted to the outside of the light emitting element LD. The additional electrode may include the lower surface 15a in contact with the second semiconductor layer 13 (e.g., the upper surface 13b of the second semiconductor layer 13) along the length L direction of the light emitting element LD and an upper surface 15b exposed to the outside. In an embodiment, the upper surface 15b of the additional electrode 15 may be the second end portion EP2 (or upper end portion) of the light emitting element LD.

In the above-described embodiment, it has been described and illustrated that the additional electrode 15 is a single layer made of a transparent metal oxide and/or a single conductive layer made of an opaque metal. However, the present disclosure is not limited thereto. In some embodiments, the additional electrode 15 may be configured as a multi-layer in which a conductive layer made of at least one transparent metal oxide and a conductive layer made of at least one opaque metal are stacked.

In an embodiment, the light emitting stack pattern 10 may be provided and/or formed in a shape corresponding to that of the light emitting element LD. For example, when the light emitting element LD is provided and/or formed in a pillar shape such as a cylindrical shape, the light emitting stack pattern 10 may also be provided and/or formed in a cylindrical shape. When the light emitting stack pattern has a cylindrical shape, each of the first semiconductor layer 11, the active layer 12, the second semiconductor layer 13, and the additional electrode 15 may have a cylindrical shape.

The first semiconductor layer 11 may be disposed at the first end portion EP1 (or lower end portion) of the light emitting element LD along the length L direction of the light emitting element LD, and the additional electrode 15 electrically connected to the second semiconductor layer 13 may be disposed at the second end portion EP2 (or upper end portion) of the light emitting element LD. The light emitting element LD may include the lower surface 11a of the first semiconductor layer 11 and the upper surface 15b of the additional electrode 15, which are located at both the end portions EP1 and EP2 of the light emitting element LD and are exposed to the outside. Each of the lower surface 11a of the first semiconductor layer 11 and the upper surface 15b of the additional electrode 15 may be a surface (e.g., an outer surface) exposed to the outside to be electrically connected to an external conductive material, e.g., a contact electrode while being in contact with the contact electrode.

When the light emitting stack pattern 10 is provided and/or formed in a shape corresponding to that of the light emitting element LD, the light emitting stack pattern 10 may have a length substantially similar or equal to the length L of the light emitting element LD.

In an embodiment of the present disclosure, the light emitting element LD may further include an insulating film 14. In some embodiments, the insulating film 14 may be provided to cover only a portion of the light emitting stack pattern 10.

The insulating film 14 can prevent an electrical short circuit that may occur when the active layer 12 is in contact with a conductive material in addition to the first semiconductor layer 11 and the second semiconductor layer 13. Also, the insulating film 14 reduces or minimizes a surface defect of the light emitting element LD, thereby improving the lifetime and light emission efficiency of the light emitting element LD. Also, when a plurality of light emitting elements LD are densely disposed, the insulating film 14 can prevent an unwanted short circuit that may occur between adjacent light emitting elements LD.

The insulating film 14 may be disposed to surround an outer surface (e.g., an outer circumferential surface or an outer peripheral surface) (or surface) of the light emitting stack pattern 10, i.e., at least one of the first semiconductor layer 11, the active layer 12, and the second semiconductor layer 13. In an embodiment, the insulating film 14 may be entirely disposed on the outer surface (e.g., an outer circumferential surface or an outer peripheral surface) (or surface) of the light emitting stack pattern 10, i.e., each of the first semiconductor layer 11, the active layer 12, and the second semiconductor layer 13. However, the present disclosure is not limited thereto. In some embodiments, the insulating film 14 may be partially disposed on the outer surface (e.g., an outer circumferential surface or an outer peripheral surface) (or surface) of the first semiconductor layer 11, the active layer 12, and the second semiconductor layer 13. In an embodiment, the insulating film 14 may be formed in a region having a high surface defect concentration, to effectively control a surface defect.

The insulating film 14 may include an inorganic material which has excellent nano crystallinity and facilitates mass production with low cost. By way of example, the insulating film 14 may be configured as a zinc oxide (ZnO) thin film layer. The insulating film 14 may be formed at the outer surface (e.g., an outer circumferential surface or an outer peripheral surface) (or surface) of the light emitting stack pattern 10 using a wet chemical process, but the present disclosure is not limited thereto. A method of forming the insulating film 14 at the outer surface (e.g., an outer circumferential surface or an outer peripheral surface) (or surface) of the light emitting stack pattern 10 will be described later with reference to FIGS. 3-13. In an embodiment of the present disclosure, the term "zinc oxide" or "ZnO" may be understood in a wide range such that component elements Zn and O constitute most of compound and include any material for maintaining a hexagonal Wurtzite crystal structure.

When the insulating film 14 is configured as a zinc oxide (ZnO) thin film layer having high crystallinity of a geometrical shape and a small surface defect characteristic, a lattice defect between the insulating film 14 and the outer surface (e.g., an outer circumferential surface or an outer peripheral surface) (or surface) of the light emitting stack pattern 10 may be reduced, so that a surface defect of the light emitting stack pattern 10 may be controlled. For example, although a defect part such as a vacancy exists on the surface of the light emitting stack pattern 10, the surface defect concentration can be decreased or the defect part can be protected by a material characteristic of the zinc oxide (ZnO) constituting the insulating film 14. Thus, the surface defect of the light emitting stack pattern 10 may be reduced or minimized.

In general, when a dry etching process is performed to manufacture the light emitting stack pattern 10, atoms of the outer surface (e.g., an outer circumferential surface or an outer peripheral surface) (or surface) of the light emitting stack pattern 10 are partially lacking, and therefore, a vacancy or dangling bond may be generated. Although an additional wet etching process is performed to control the surface defect of the light emitting stack pattern 10, the defect part of the light emitting stack pattern may not be completely removed. In addition, although an insulating film made of silicon oxide ($SiO_x$) is directly formed on the light emitting stack pattern 10, a lattice defect may exist between the light emitting stack pattern 10 and the insulating film made of the silicon oxide ($SiO_x$) due to the vacancy of the light emitting stack pattern Therefore, because the insulating film made of the silicon oxide ($SiO_x$) is not properly grown, the outer surface (e.g., an outer circumferential surface or an outer peripheral surface) (or surface) of the light emitting stack pattern 10 may not be sufficiently protected. That is, the lifetime, efficiency, and crystallinity of the light emitting element LD may be deteriorated due to the surface defect of the light emitting stack pattern 10.

Accordingly, in the light emitting element LD in accordance with the embodiment of the present disclosure, the insulating film 14 is entirely or partially formed at the outer surface (e.g., an outer circumferential surface or an outer peripheral surface) (or surface) of the light emitting stack pattern 10 by using the zinc oxide (ZnO) thin film layer having excellent nano crystallinity and a small surface defect, so that the surface defect of the light emitting stack pattern 10 can be effectively controlled.

In some embodiments, the insulating film 14 configured as the zinc oxide (ZnO) thin film layer may protect the outer surface (e.g., an outer circumferential surface or an outer peripheral surface) (or surface) of the light emitting stack pattern 10 due to a material characteristic of the zinc oxide (ZnO), e.g., a high electrical conductivity characteristic, but may not be appropriate to serve as an insulating film for preventing an electrical short circuit that may occur when a contact is made with an external conductive material.

As a method for utilizing the zinc oxide (ZnO) thin film layer as the insulating film by lowering high electrical conductivity of the zinc oxide (ZnO) thin film layer, a method of doping a Group III transition metal into the zinc oxide (ZnO) thin film layer may be used. When the Group III transition metal is doped into the zinc oxide (ZnO) thin film layer, the electrical conductivity of the zinc oxide (ZnO) thin film layer may be decreased to a level of 1/1000 or less while maintaining a film characteristic of the zinc oxide (ZnO) thin film layer. Accordingly, an insulating characteristic of the zinc oxide (ZnO) thin film layer can be ensured. In an embodiment, the Group III transition metal may include at least one of yttrium (Y), scandium (Sc), lanthanum (La), actinium (Ac), lutetium (Lu), and lawrencium (Lr). However, the kind of the Group III transition metal is not limited to the above-described embodiment.

The insulating film 14 configured as the above-described zinc oxide (ZnO) thin film layer may be provided in the form of a single layer or may be provided in the form of a multi-layer including at least two layers. The insulating film 14 may be formed and/or provided at the outer surface (e.g., an outer circumferential surface or an outer peripheral surface) (or surface) of the light emitting stack pattern 10 to surround the outer surface (e.g., an outer circumferential surface or an outer peripheral surface) of at least the active layer 12. In addition, the insulating film 14 may further surround the outer surface (e.g., an outer circumferential surface or an outer peripheral surface) of each of the first semiconductor layer 11, the active layer 12, the second semiconductor layer 13, and the additional electrode 15. For convenience, a state in which a portion of the insulating film 14 is removed has been illustrated in FIG. 1, and the first semiconductor layer 11, the active layer 12, the second semiconductor layer 13, and the additional electrode 15, that are included in the actual light emitting element LD, may be surrounded by the insulating film 14. In an embodiment, the insulating film 14 may completely surround each of the outer surface (e.g., an outer circumferential surface or an outer peripheral surface) of the first semiconductor layer 11 and the outer surface (e.g., an outer circumferential surface or an outer peripheral surface) of the additional electrode 15, but the present disclosure is not limited thereto. In some embodiments, the insulating film 14 may surround only a portion of the outer surface (e.g., an outer circumferential surface or an outer peripheral surface) of the first semiconductor layer 11 and/or a portion of the outer surface (e.g., an outer circumferential surface or an outer peripheral surface) of the additional electrode 15.

The insulating film 14 may include a lower surface 14a parallel to the lower surface 11a of the first semiconductor layer 11 in a direction crossing the length L direction of the light emitting element LD, an upper surface 14b that is opposite the lower surface 14a in the length L direction, an inner side surface 14d in direct contact (or touch) with the light emitting stack pattern 10, and an outer side surface 14c corresponding to an outermost side surface of the light emitting element LD while being opposite the inner side surface 14d. The lower surface 14a of the insulating film 14, the upper surface 14b of the insulating film 14, the outer side surface 14c of the insulating film 14, and the inner side surface 14d of the insulating film 14 may be connected to each other to be continuous. The upper surface 14b of the insulating film 14 may be defined as a virtual surface including an upper end circumference (or an upper end periphery) of the insulating film 14, and the lower surface 14a of the insulating film 14 may be defined as a virtual surface including a lower end circumference (or a lower end periphery) of the insulating film 14.

The lower surface 14a of the insulating film 14 may be located at the same surface (or same line or same plane) as the lower surface 11a of the first semiconductor layer 11, and the upper surface 14b of the insulating film 14 may be located on the same surface (or same line or same plane) as the upper surface 15b of the additional electrode 15. The lower surface 14a of the insulating film 14 and the lower surface 11a of the first semiconductor layer 11 are not necessarily located at the same surface (or same line or same plane). In some embodiments, the lower surface 14a of the insulating film 14 and the lower surface 11a of the first semiconductor layer 11 may be located at different surfaces (or different lines or different planes). Similarly, the upper surface 14b of the insulating film 14 and the upper surface 15b of the additional electrode 15 are not necessarily located at the same surface (or same line or same plane). In some embodiments, the upper surface 14b of the insulating film 14 and the upper surface 15b of the additional electrode 15 may be located at different surfaces (or different lines or different planes).

The first semiconductor layer 11, the active layer 12, the second semiconductor layer 13, and the additional electrode 15, which are sequentially stacked along the length L direction of the light emitting element LD, may have different thicknesses, but the present disclosure is not limited thereto.

The above-described light emitting element LD may be manufactured by being grown on a substrate for epitaxial growth.

The above-described light emitting element LD may be used as a light source (or light emitting source) of various display devices. The light emitting element LD may be manufactured through a surface treatment process. For example, when a plurality of light emitting elements LD are mixed in a liquid solution (or solvent) to be supplied to each pixel area (e.g., a light emitting area of each pixel or a light emitting area of each sub-pixel), each light emitting element LD may be surface-treated such that the light emitting elements LD are not unequally condensed (e.g., non-uniformly concentrated) in the solution but equally or substantially equally (e.g., uniformly or substantially uniformly) dispersed in the solution.

A light emitting unit (or light emitting apparatus) including the above-described light emitting element LD may be used in various types of devices that require a light source, including a display device. When a plurality of light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used for other types of devices that require a light source, such as a lighting device.

In some embodiments, the above-described light emitting element LD may additionally include a separate protective film disposed to surround the outer surface (e.g., an circumferential surface or an outer peripheral surface) (or surface) of the insulating film 14 configured as the zinc oxide (ZnO) thin film layer or to surround the outer surface (e.g., an outer circumferential surface or an outer peripheral surface) (or surface) of the light emitting stack pattern 10 while being located between the light emitting stack pattern 10 and the insulating film 14. An embodiment in which the light emitting element LD additionally includes the protective film in addition to the insulating film 14 will be described in detail later with reference to FIGS. 14A, 14B, and 17A-21B.

FIGS. 3-13 are schematic cross-sectional views sequentially illustrating a method of manufacturing the light emitting element LD shown in FIGS. 1 and 2.

Figure 3:
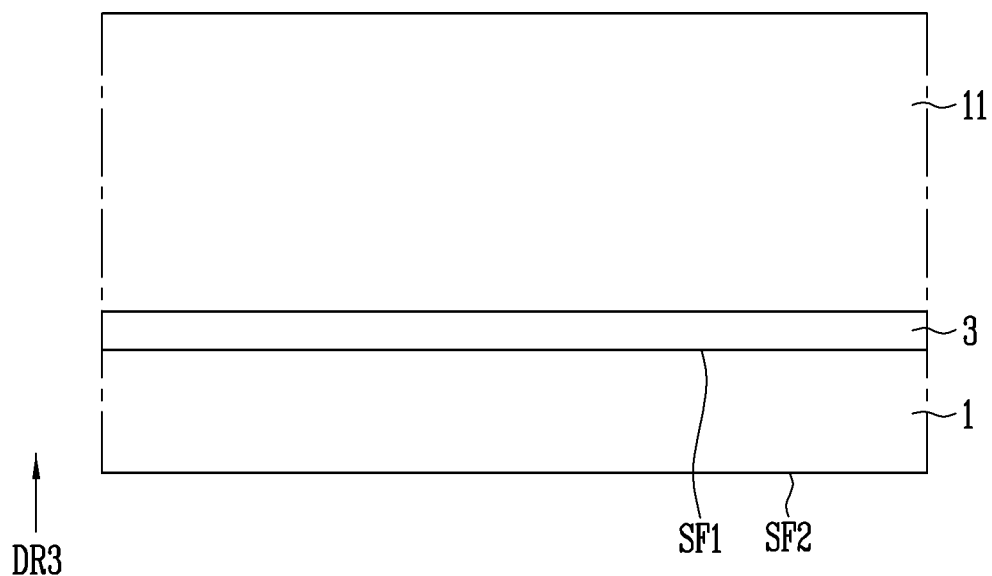
FIGS. 3-13 are schematic cross-sectional views sequentially illustrating a method of manufacturing the light emitting element shown in FIGS. 1 and 2.
Figure 4:
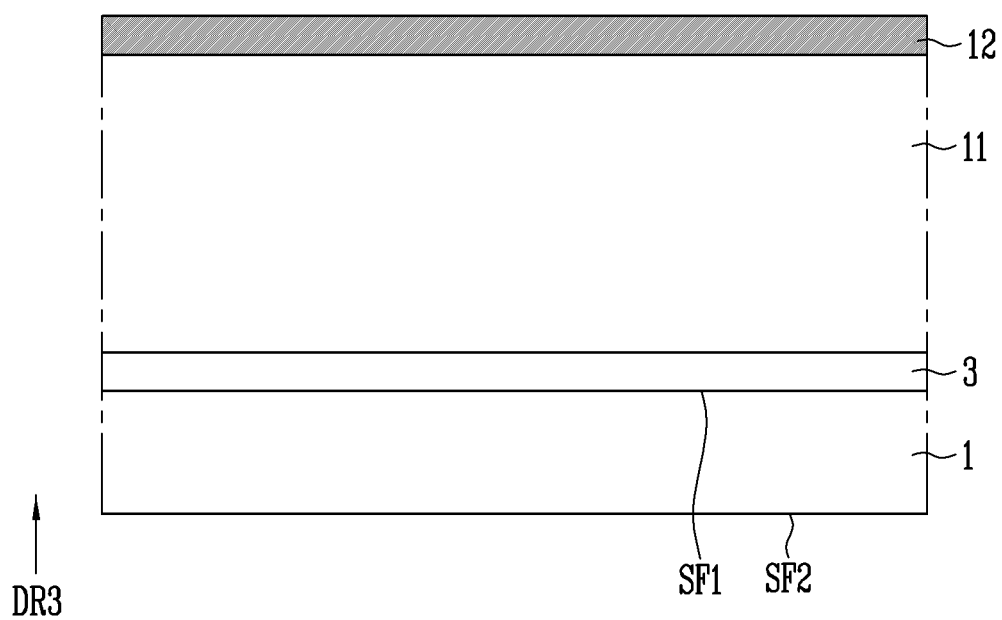
Figure 5:
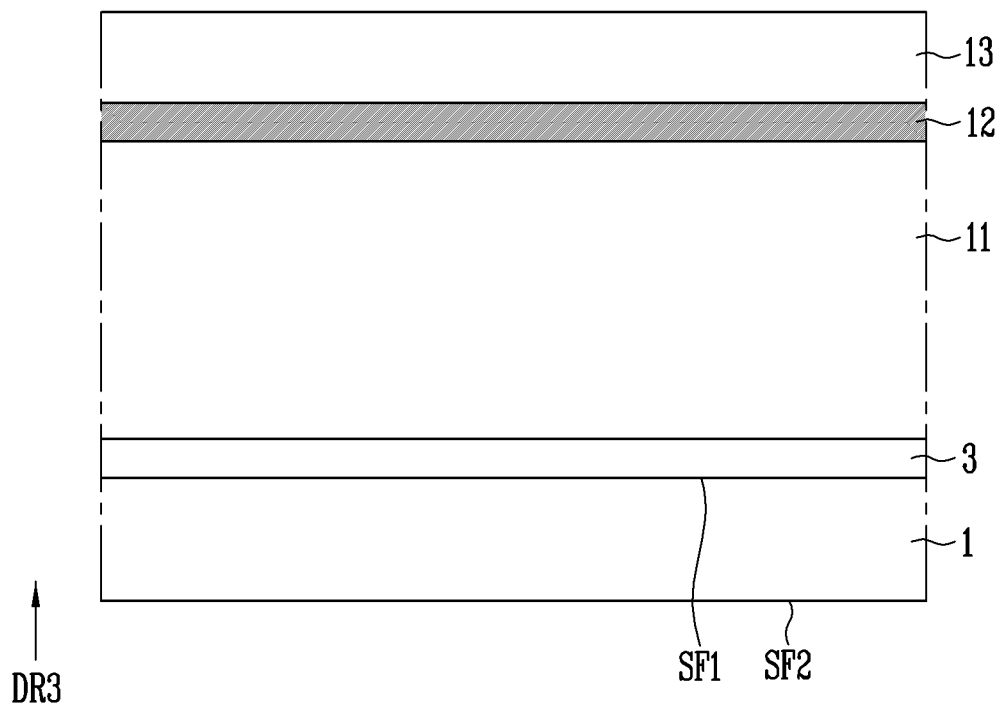
Figure 6:
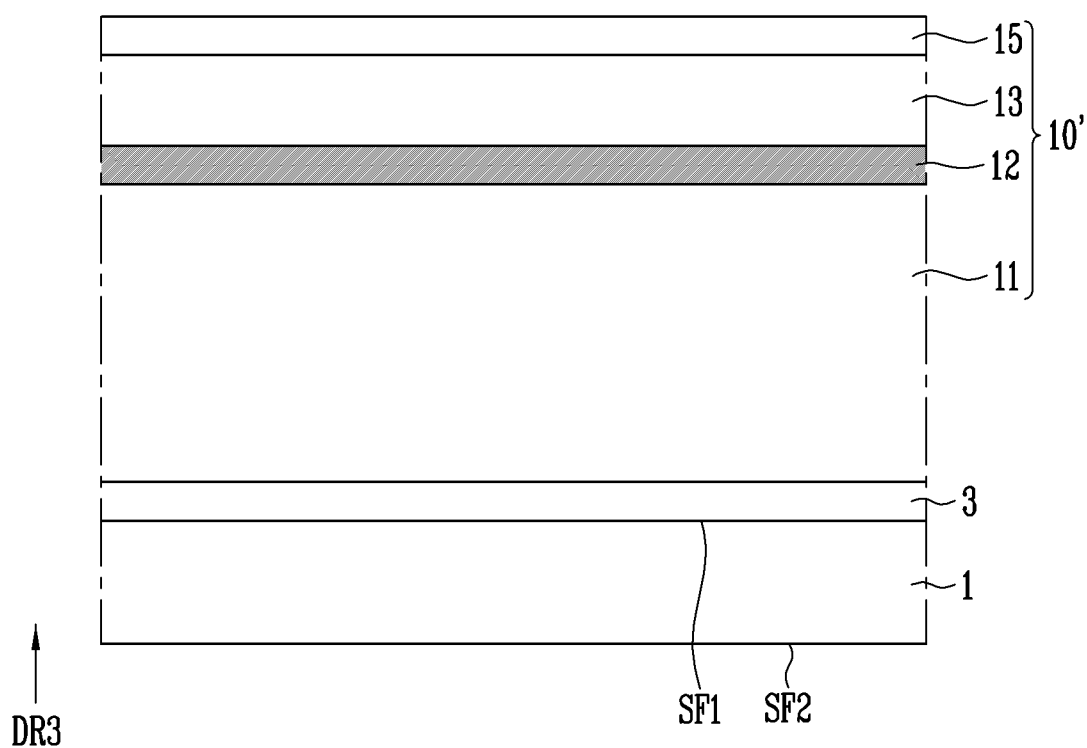
Figure 7:
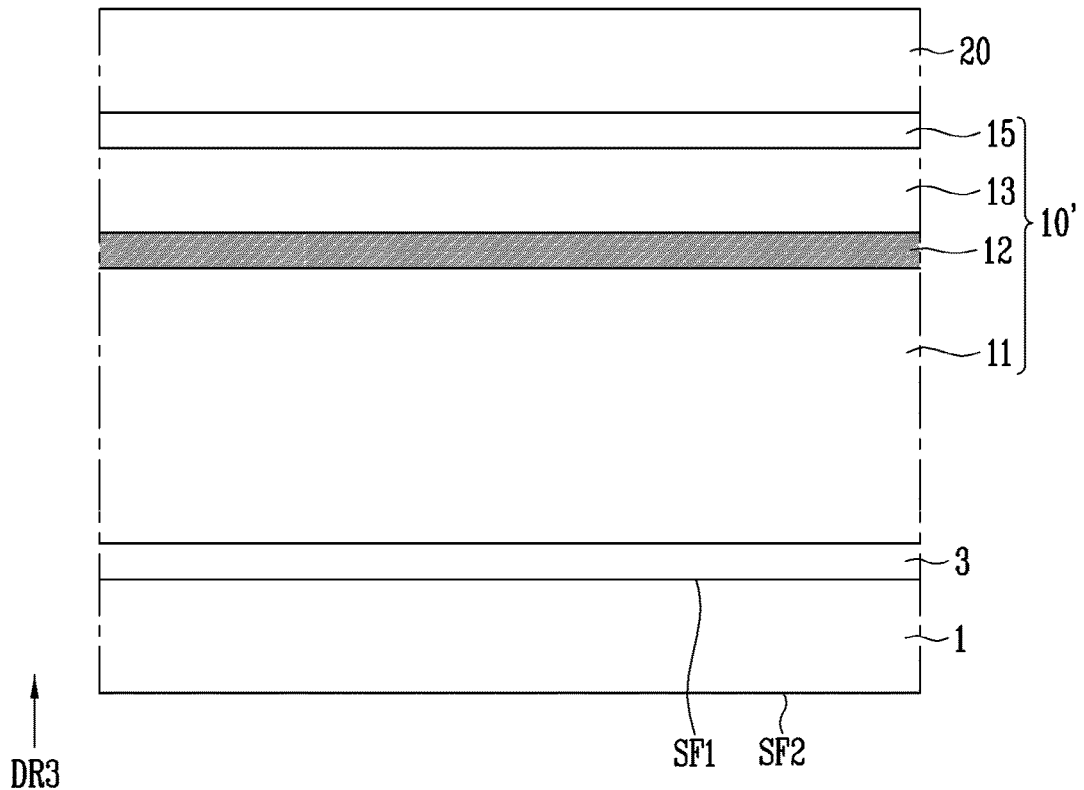
Figure 8:
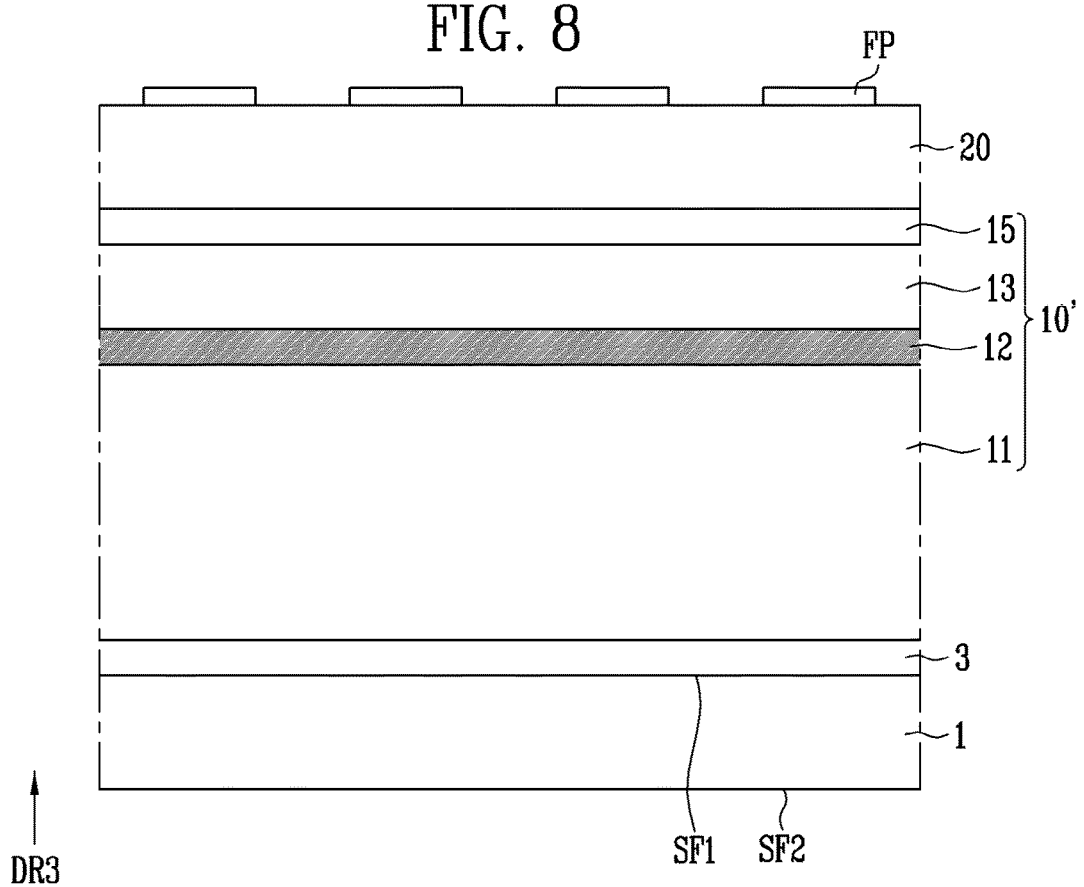
Figure 9:
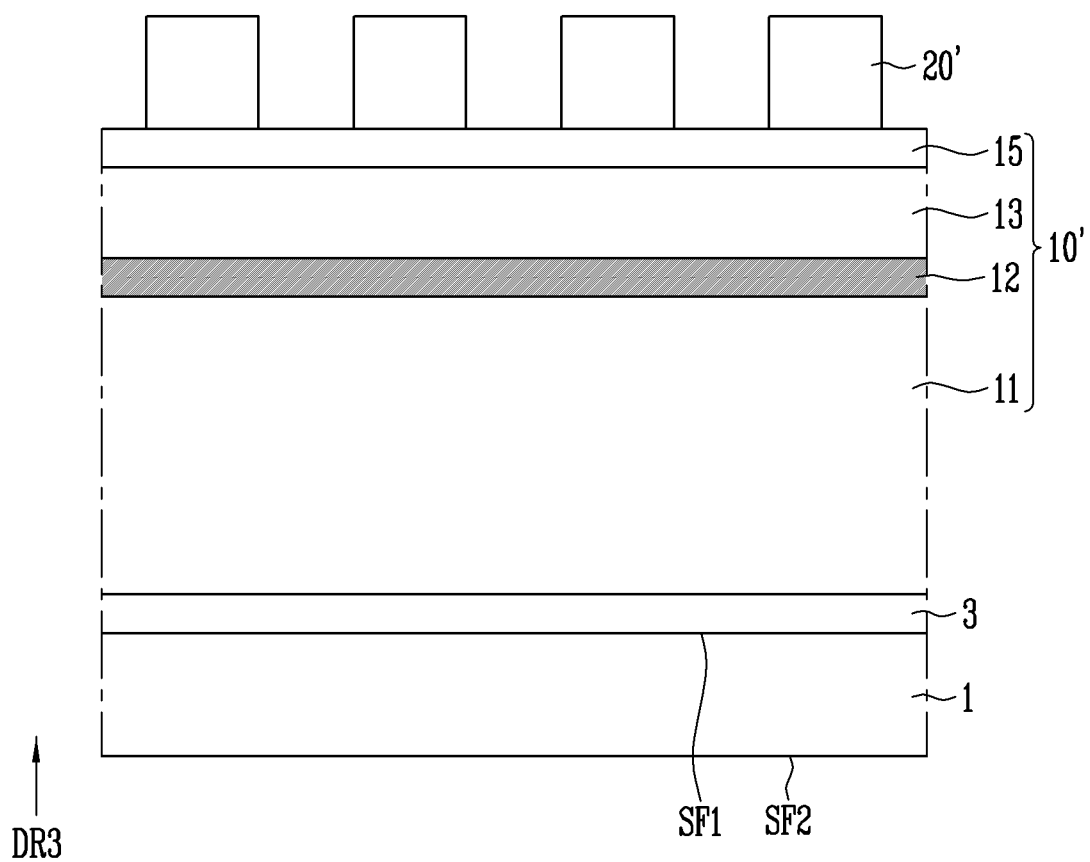
Figure 10:
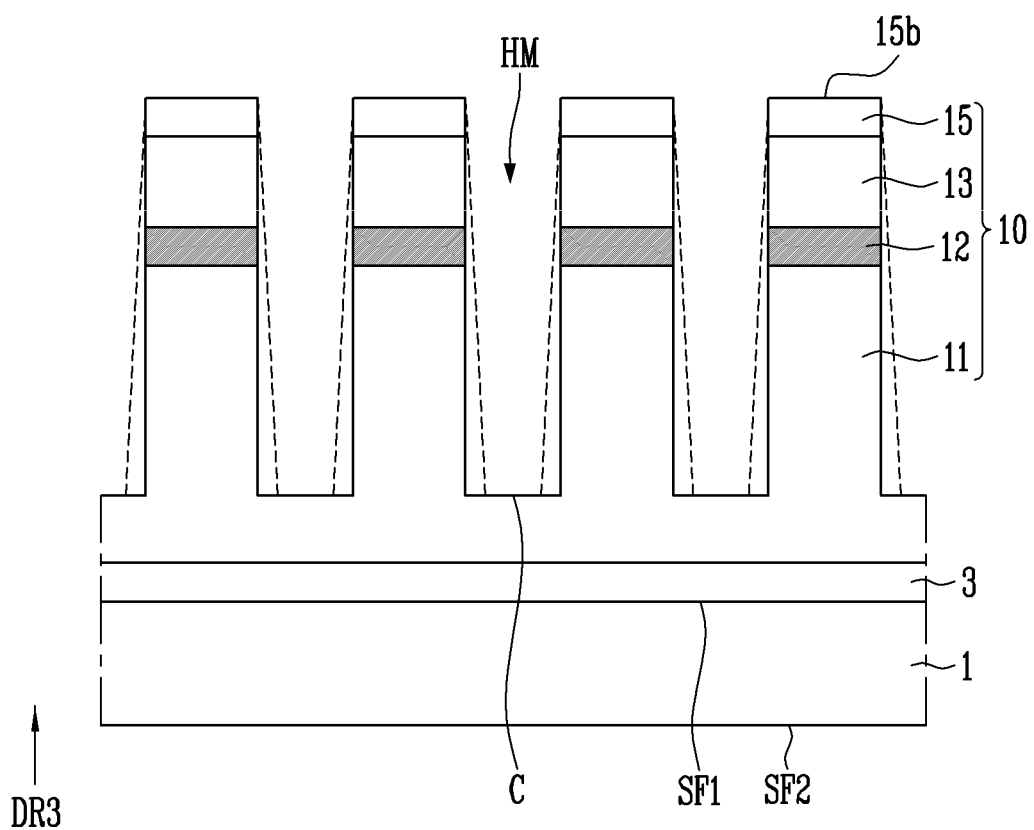
Figure 11:
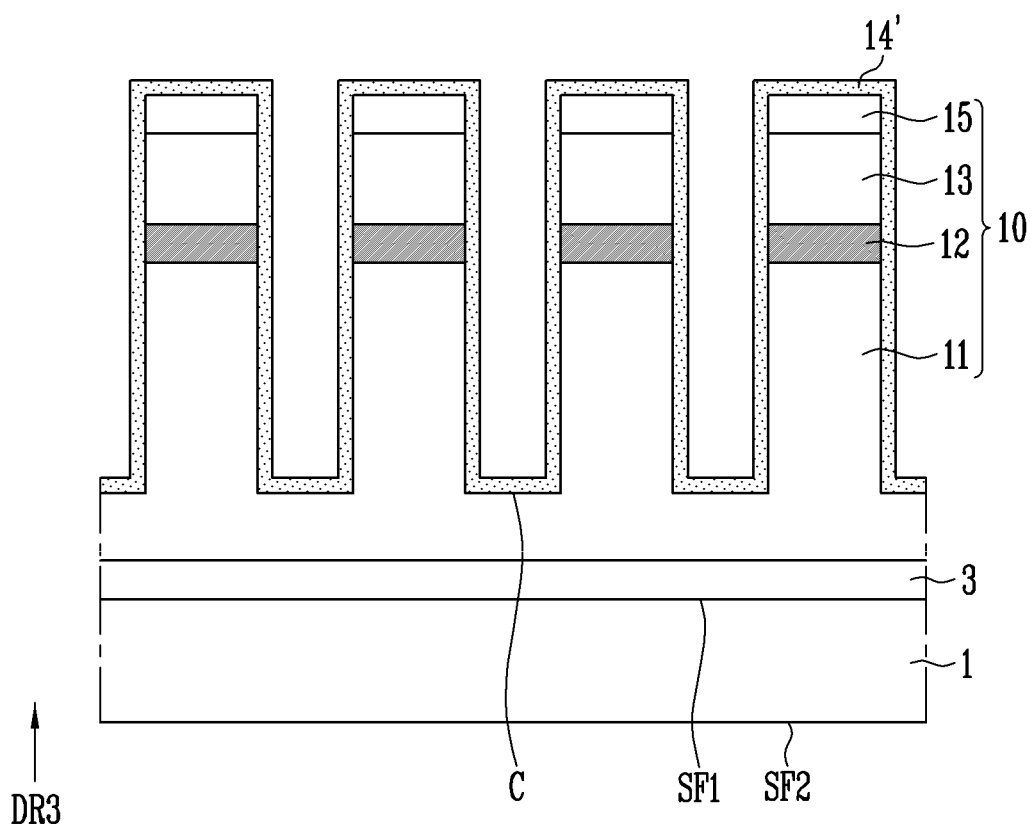

Referring to FIGS. 1-3, a substrate 1 configured to support the light emitting element LD is prepared.

The substrate 1 may be a GaAS, GaP or InP substrate. The substrate 1 may be a wafer (or growth substrate) that is suitable for epitaxial growth. The substrate 1 may include a ZnO substrate having a GaAs layer on a surface thereof. In addition, a Ge substrate having a GaAs layer on a surface thereof and a Si substrate having a GaAs layer on a wafer with a buffer layer interposed therebetween may be applied.

The substrate 1 may use a single crystalline substrate as an article on the market, which is manufactured through a manufacturing process known in the art. A material of the substrate is not limited thereto as long as the material satisfies a selectivity for manufacturing the light emitting element LD and facilitates smooth epitaxial growth.

A surface of the substrate 1, on which the epitaxial growth takes place, may be flat or substantially flat. The substrate 1 may have a size and diameter, which are changed according to a product to which the substrate 1 is applied, and may be manufactured in a shape capable of reducing flexure caused by a stack structure due to the epitaxial growth. The shape of the substrate 1 is not limited to a circular shape, and the substrate 1 may have a polygonal shape such as a rectangular shape.

A sacrificial layer 3 is formed on a first surface SF1 (or upper surface) of the substrate 1. The sacrificial layer 3 may be located between the light emitting element LD and the substrate 1 in a process of manufacturing the light emitting element LD on the first surface SF1 of the substrate 1, to allow the light emitting element LD and the substrate 1 to be physically spaced from each other. A second surface SF2 (or rear surface) that is opposite the first surface SF1 of the substrate 1 may face downward along a thickness direction DR3 (hereinafter, referred to as a "third direction") of the substrate 1 as shown in FIG. 3.

The sacrificial layer 3 may have various types structures, and may be provided in a single-layer structure or a multi-layer structure. The sacrificial layer 3 may be a layer removed in a final manufacturing process of the light emitting element LD. When the sacrificial layer 3 is removed, layers located on the top and the bottom of the sacrificial layer 3 may be separated from each other. The sacrificial layer 3 may be formed of GaAs, AlAs or AlGaAs.

A first semiconductor layer 11 is formed on the sacrificial layer 3. The first semiconductor layer 11 may be formed through the epitaxial growth, and may be formed through a Metal-Organic Chemical Vapor Deposition (MOCVD) process, a Molecular Beam Epitaxy (MBE) process, a Vapor Phase Epitaxy (VPE) process, a Liquid Phase Epitaxy (LPE) process, or the like. In some embodiments, an additional semiconductor layer for crystallinity improvement, including a buffer layer, a non-doping semiconductor layer, etc., may be further formed between the first semiconductor layer 11 and the sacrificial layer 3.

The first semiconductor layer 11 may include a semiconductor material composed of Group III (Ga, Al, In)—Group V (P, As), and include a semiconductor layer doped with a first conductive dopant (or n-type dopant) such as Si, Ge, Sn or Te. For example, the first semiconductor layer 11 may include at least one semiconductor material from among GaP, GaAs, GaInP, and AlGaInP, doped with Si. That is, the first semiconductor layer 11 may include at least one n-type semiconductor layer.

Referring to FIGS. 1-4, an active layer 12 is formed on the first semiconductor layer 11. The active layer 12 is a region in which electrons and holes are recombined with each other. The active layer 12 may be changed to a low energy level as the electrons and the holes are recombined with each other, and emit light having a wavelength corresponding to the low energy level. The active layer 12 may be formed on the first semiconductor layer 11, and may be formed in a single or multiple quantum well structure. The position of the active layer 12 may be variously changed according to a size, etc. of the light emitting element LD.

The active layer 12 may include at least one material from among GaInP, AlGaInP, GaAs, AlGaAs, InGaAs, InGaAsP, InP, and InAs. The active layer 12 may emit light having a wavelength of 400 nm to 900 nm. The active layer 12 may use a double hetero structure. In some embodiments, a clad layer doped with a conductive dopant may be further formed on the first surface 12a and/or the second surface 12b of the active layer 12. In other embodiments, a tensile strain barrier reducing (TSBR) layer may be further formed on the first surface 12a of the active layer 12.

Referring to FIGS. 1-5, a second semiconductor layer 13 is formed on the active layer 12. The second semiconductor layer 13 may include a semiconductor layer having a type different from that of the first semiconductor layer 11. The second semiconductor layer 13 may include a semiconductor material composed of Group III (Ga, Al, In)— Group V (P, As), and include a semiconductor layer doped with a second conductive dopant (or p-type dopant) such as Mg, Zn, Ca, Sr or Ba. For example, the second semiconductor layer 13 may include at least one semiconductor material from among GaP, GaAs, GaInP, and AlGaInP, doped with Mg. That is, the second semiconductor layer 13 may include a p-type semiconductor layer.

Referring to FIGS. 1-6, an additional electrode 15 (or electrode layer) is formed on the second semiconductor layer 13. The additional electrode 15 may use one or mixture of chromium (Cr), titanium (Ti), aluminum (Al), gold (Au), nickel (Ni), indium tin oxide (ITO), indium zinc oxide (IZO), indium tin zinc oxide (ITZO), and any oxide or alloy thereof. In an embodiment, the additional electrode 15 reduces or minimizes loss of light generated in the active layer 12 and then emitted to the outside of the light emitting element LD, and may be made of a transparent conductive oxide such as indium tin oxide (ITO) so as to improve an effect that current is spread in the second semiconductor layer 13.

The additional electrode 15 may be an ohmic contact electrode. By way of example, the additional electrode 15 may be in ohmic contact with the second semiconductor layer 13. However, the present disclosure is not limited thereto. In some embodiments, the additional electrode 15 may be a schottky contact electrode.

The additional electrode 15 may be deposited on the second semiconductor layer 13 through a sputtering process. However, a method of forming the additional electrode 15 on the second semiconductor layer 13 is not limited to the above-described embodiment, and a general deposition method, etc. may be applied. A thickness of the additional electrode 15 is determined by considering (or based on) an oxygen amount, a deposition temperature, and/or a deposition time in a chamber in which a deposition process is performed when the corresponding electrode is formed, and may be determined within a range in which loss of light emitted in the active layer 12 is reduced or minimized.

The first semiconductor layer 11, the active layer 12, the second semiconductor layer 13, and the additional electrode 15, which are sequentially stacked on the sacrificial layer 3 formed on the substrate 1, may constitute a light emitting stack structure (or a light emitting structure) 10'.

Referring to FIGS. 1-7, a mask 20 is formed on the additional electrode 20. The mask 20 may include an insulating layer and a metal layer. The insulating layer may be formed on the additional electrode 15. The insulating layer may serve as a mask for continuous etching of the light emitting stack structure 10'. The insulating layer may use oxide or nitride. By way of example, the insulating layer may include silicon oxide ($SiO_x$), silicon nitride ($SiN_x$), or the like. The metal layer may include a metal such as chromium (Cr), but the present disclosure is not limited thereto.

Referring to FIGS. 1-8, at least one fine pattern FP may be formed on the mask layer 20. The fine pattern FP may be formed through a polymer layer. The fine pattern FP may be formed by forming a polymer layer on the mask layer 20 and forming a pattern at a distance of nanometer scale to micrometer scale in the polymer layer. For example, the fine pattern FP may be formed at a distance of nanometer scale to micrometer scale by patterning the polymer layer on the mask layer 20 through a process such as photo-lithography, electron beam lithography, or nano-imprint lithography (NIL).

Referring to FIGS. 1-9, a mask pattern 20' is formed by patterning the mask layer 20, using the fine pattern FP as a mask. The mask pattern 20' may be formed in a shape corresponding to the fine pattern FP. The above-described mask pattern 20' may be used as an etching mask for forming a light emitting stack pattern by etching the light emitting stack structure 10'. The fine pattern FP may be removed through a general wet etching process, a general dry etching process, or the like. However, the present disclosure is not limited thereto, and the fine pattern FP may be removed through a general removal process.

Referring to FIGS. 1-10, light emitting stack patterns 10 are formed by etching the light emitting stack structure 10' in a vertical direction, e.g., the third direction DR3 at a distance of nanometer scale to micrometer scale through an etching process using the mask pattern 20' as an etching mask.

A groove portion HM exposing one region C of the first semiconductor layer 11 to the outside may be formed by etching one region of the light emitting stack structure 10', which does not correspond to the mask pattern 20' in the above-described etching process. One region of the light emitting stack structure 10', which corresponds to the mask pattern 20', may not be etched.

The groove portion HM may have a shape sunken down to the one region C of the first semiconductor layer 11 along the third direction DR3 from the upper surface of the additional electrode 15 of the light emitting stack pattern 10.

A plurality of light emitting stack patterns 10 may be etched by using a dry etching process such as reactive ion etching (RIE), reactive ion beam etching (RIBE), or inductively coupled plasma reactive ion etching (ICP-RIE). Unlike the wet etching process, in the dry etching process, etching in one direction is possible, and thus the dry etching process is suitable for forming the light emitting stack patterns 10. That is, in the wet etching process, because isotropic etching is performed, etching is performed in all directions. On the other hand, in the dry etching process, because etching performed in a depth direction for forming the groove portion HM is possible, the size, distance, etc. of groove portions HM may be formed with a desired pattern. In some embodiments, the etching of the light emitting stack patterns 10 may be performed by using a combination of dry etching and wet etching. By way of example, after etching in the depth direction is performed through dry etching, a sidewall may be formed to have a surface (or side) that is on a plane perpendicular to a surface of the substrate 1 through wet etching, which is an isotropic etching.

In an embodiment, each of the light emitting stack patterns 10 may have a size of nanometer scale to micrometer scale.

After the above-described etching process is performed, residual substances, e.g., the mask pattern 20' remaining on the light emitting stack patterns 10 may be removed through a general wet etching process or a general dry etching process, but the present disclosure is not limited thereto. By way of example, the mask pattern 20' may be removed through a general removal process.

Referring to FIGS. 1-11, an insulating material layer 14' formed through a wet chemical process is coated on the light emitting stack patterns 10 and the one region of the first semiconductor layer 11.

The insulating material layer 14' may include an upper insulating material layer, a side insulating material layer, and a lower insulating material layer. The upper insulating material layer may completely cover an upper surface of each of the light emitting stack patterns 10. The upper surface of each of the light emitting stack patterns 10 may be the upper surface 15b of the additional electrode 15. That is, the upper insulating material layer may completely cover the upper surface 15b of the additional electrode 15 of each of the light emitting stack patterns 10. The side insulating material layer may completely cover a side surface of each of the light emitting stack patterns 10. The lower insulating material layer may completely cover the one region C of the first semiconductor layer 11, which is exposed to the outside by the groove portion HM.

The upper insulating material layer, the side insulating material layer, and the lower insulating material layer may be connected to each other to be continued on the light emitting stack patterns 10.

The wet chemical process of forming the insulating material layer 14' is as follows.

First, a mixed solution is prepared, which is obtained by putting and mixing zinc acetate dehydrate ($Zn(CH_3COO)_2 2H_2O$) as a precursor in a mixed liquid of ethanol and monoethanolamine ($H_2NCH_2CH_2OH$) in a concentration of 0.1 to 1 mole. A molar ratio of zinc acetate and monoethanolamine may be between 1:1 and 1:5.

The above-described mixed solution is stirred at a high temperature, e.g., 50° C. to 60° C. for about 1 hour to about 2 hours. After the mixed solution is stirred, the mixed solution is aged at a room temperature or a high temperature for about 2 hours to about 24 hours, thereby improving solution stability.

The mixed solution that is completely aged is coated on the substrate 1 on which the light emitting stack patterns 10 are formed through a spin coating process or a dip coating process. When the above-described mixed solution is coated on the substrate 1 by using the spin coating process, a coating time may be about 10 to 60 seconds, and revolutions per minute (rpm) may be about 1000 to 10000. In addition, when the above-described mixed solution is coated on the substrate 1 by using the dip coating process, a coating time may be about 1 to 60 seconds.

After a washing process using deionized water is performed on the mixed solution coated on the substrate 1, the mixed solution may be formed as the insulating material layer 14' by undergoing a primary drying process on a hot plate. A drying temperature may be about 50° C. to about 100° C., and a drying time may be about 30 minutes to about 60 minutes.

In order to form a desired thickness of the insulating material layer 14', the spin coating process or the dip coating process may be repeated a few times after the above-described primary drying process is performed. When the coating process is performed a few times, the above-described primary drying process may also be repeatedly performed a few times following each of the coating processes and washing processes.

After the insulating material layer 14' is coated on the light emitting stack patterns 10, a secondary drying process is finally performed. A drying temperature of the secondary drying process may be about 400° C. to about 700° C., and a drying time may be about 1 hour to about 2 hours.

In order to further improve an insulating characteristic of the insulating material layer 14' during the above-described process, a Group III transition metal such as yttrium (Y) may be doped into the mixed solution. A method of doping the Group III transition metal may be as follows.

Before the mixed solution which is completely aged is coated on the substrate 1 on which the light emitting stack patterns 10 are formed during the above-described process, yttrium nitrate hexahydrate as a precursor is added to the mixed solution. An appropriate concentration of the yttrium nitrate hexahydrate may be within 5% of the ratio of the zinc acetate dehydrate in the mixed solution. The insulating material layer 14' doped with the Group III transition metal may be formed on the outer surface (e.g., an outer circumferential surface or an outer peripheral surface) (or surface) of each of the light emitting stack patterns 10 by sequentially performing the coating process, the washing process, and the drying process, using the mixed solution to which the yttrium nitrate hexahydrate is added.

The insulating material layer 14' coated on each of the light emitting stack patterns 10 through the above-described process may have a thickness of about a few nm to about a few tens of nm.

The wet chemical process proposed in the present disclosure is not limited to the above-described embodiment, and the ratio of each sample and conditions of reaction may be variously modified as those for setting a specific thickness.

Referring to FIGS. 1-12, an insulating film 14 is formed by removing a portion of the insulating material layer 14' through an etching process. The above-described etching process may be a dry etching process.

The upper insulating material layer and the lower insulating material layer may be removed through the above-described etching process, so that the insulating film 14 including only the side insulating material layer covering the side surface of each of the light emitting stack patterns 10 is finally formed. The upper insulating material layer may be removed through the above-described etching process, so that the upper surface 15b of the additional electrode 15 may be exposed to the outside. The upper surface 14b of the insulating film 14 may be provided and/or formed at the same surface (or the same line or same plane) as the upper surface 15b of the additional electrode 15. In addition, the lower insulating material layer may be removed through the above-described etching process, so that the one region C of the first semiconductor layer 11 is exposed.

A plurality of light emitting elements LD including the light emitting stack patterns 10 and the insulating film 14 surrounding the outer surface (e.g., an outer circumferential surface or an outer peripheral surface) (or surface) of each of the light emitting stack patterns 10 may be finally formed through the above-described etching process. The upper surface 15b of the additional electrode 15 that is exposed to the outside, may become the second end portion EP2 (or upper surface) of each of the light emitting elements LD.

The above-described insulating film 14 may be formed on the outer surface (e.g., an outer circumferential surface or an outer peripheral surface) (or surface) of each of the light emitting stack patterns 10 by finally performing the etching process after a series of processes of coating and drying the insulating material layer 14' formed through the wet chemical process on each of the light emitting stack patterns 10. The insulating film 14 may be configured as the zinc oxide (ZnO) thin film layer.

Referring to FIGS. 1-13, an empty space is formed between the light emitting elements LD and the substrate 1, and the light emitting elements LD are separated from the substrate 1 by using a physical separation process of applying a small physical force, impact, or the like. The lower surface 11a of the first semiconductor layer 11 of each of the light emitting elements LD may be exposed to the outside. The lower surface 11a of the first semiconductor layer 11, which is exposed to the outside, may become the first end portion EP1 (or lower surface) of each of the light emitting elements LD.

A method of separating the light emitting elements LD from the substrate 1 is not limited to the above-described embodiment. In some embodiments, the light emitting elements LD may be separated from the substrate 1 by using laser lift-off (LLO) using laser, chemical lift-off (CLO) using an etchant, or the like.

Each of the light emitting elements LD finally manufactured through the above-described manufacturing process may include the insulating film 14 configured as the zinc oxide (ZnO) thin film layer surrounding the outer surface (e.g., an circumferential surface or an outer peripheral surface) (or surface) of the light emitting stack pattern 10 of the corresponding light emitting element LD. Accordingly, a surface defect of the light emitting stack pattern 10 (or light emitting element LD) may be effectively controlled by using a material characteristic of the insulating film 14 configured as the zinc oxide (ZnO) thin film layer, so that the light emission efficiency of each of the light emitting elements LD can be improved.

In addition, in one or more embodiments, the insulating material layer 14' is coated on the outer surface (e.g., an outer circumferential surface or an outer peripheral surface) (or surface) of each of the light emitting stack patterns 10 by using the wet chemical process which facilitates mass production with low cost, as compared with an atomic layer deposition (ALD) process which has a long manufacturing time and high manufacturing cost because high-temperature and high-vacuum process is required due to process characteristics, so that the manufacturing process of the light emitting elements LD can be simplified and the manufacturing cost of the light emitting elements LD can be reduced.

Figure 14A:
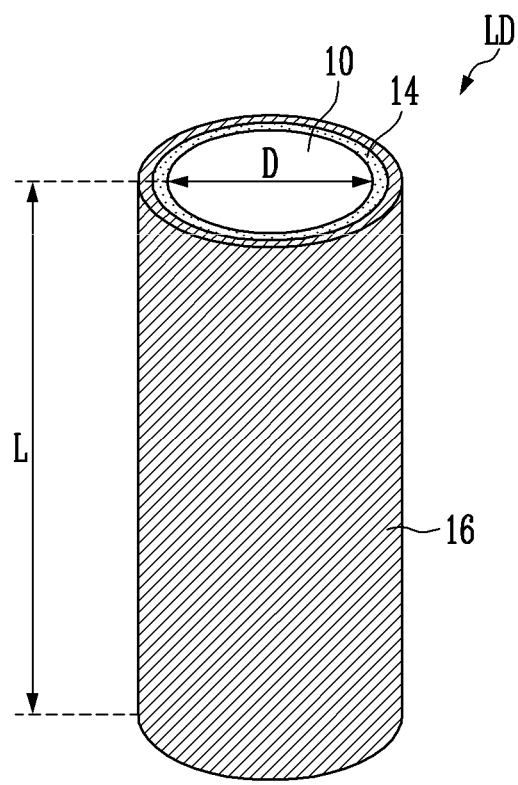
FIG. 14A is a schematic perspective view illustrating a light emitting element in accordance with another embodiment of the present disclosure.
Figure 14B:
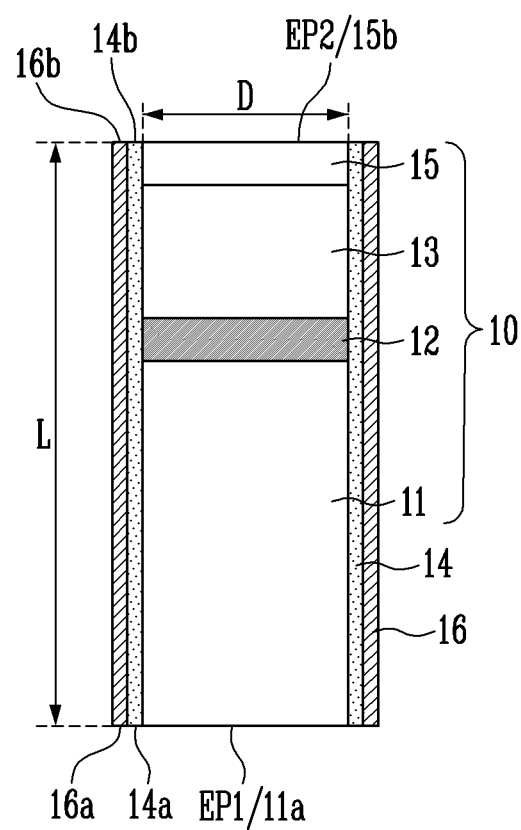
FIG. 14B is a schematic cross-sectional view of the light emitting element shown in FIG. 14A.

FIG. 14A is a schematic perspective view illustrating a light emitting element LD in accordance with an embodiment of the present disclosure, and FIG. 14B is a schematic cross-sectional view of the light emitting element shown in FIG. 14A. FIGS. and 16 illustrate a method of manufacturing a protective film (or a first protective film) 16 in a method of manufacturing the light emitting element LD shown in FIGS. 14A and 14B, and are cross-sectional views schematically illustrating a process after the method shown in FIG. 12.

The light emitting element LD shown in FIGS. 14A and 14B may have a configuration substantially identical or similar to that of the light emitting element LD shown in FIGS. 1 and 2, except that a protective film 16 is provided on an outer surface (e.g., an outer circumferential surface or an outer peripheral surface) (or surface) of an insulating film 14.

Accordingly, in relation to the light emitting element LD shown in FIGS. 14A and 14B, portions different from those of the above-described embodiment will be mainly described to avoid redundancy.

Referring to FIGS. 14A and 14B, the light emitting element LD in accordance with the embodiment of the present disclosure may include a light emitting stack pattern 10, the insulating film 14 surround an outer circumferential surface (or surface) of the light emitting stack pattern 10, and the protective film 16 disposed to surround an outer surface (e.g., an outer circumferential surface or an outer peripheral surface) (or surface) of the insulating film 14.

The light emitting stack pattern 10 may include a first semiconductor layer 11, an active layer 12, a second semiconductor layer 13, and an additional electrode that are sequentially stacked in a length L direction of the light emitting element LD.

The insulating film 14 may be configured as a zinc oxide (ZnO) thin film layer. In some embodiments, the insulating film 14 may be a zinc oxide (ZnO) thin film layer doped with a Group III transition metal. The group III transition metal may be at least one of yttrium (Y), scandium (Sc), lanthanum (La), actinium (Ac), lutetium (Lu), and lawrencium (Lr). The insulating film 14 may have the configuration identical to that of the insulating film 14 described with reference to FIGS. 1 and 2.

The protective film 16 may be disposed to surround the outer surface (e.g., an outer circumferential surface or an outer peripheral surface) (or surface) of the insulating film 14. The protective film 16 may be disposed to entirely or partially surround the outer surface (e.g., an outer circumferential surface or an outer peripheral surface) (or surface) of the insulating film 14. In an embodiment, the protective film 16 may surround the outer surface (e.g., an outer circumferential surface or an outer peripheral surface) (or surface) of the insulating film 14 while being in direct contact with the outer surface (e.g., an outer circumferential surface or an outer peripheral surface) (or surface) of the insulating film 14. A thickness of the protective film 16 may be equal to or different from that of the insulating film 14.

The protective film 16 may include a transparent insulating material. For example, the protective film 16 may include an inorganic insulating material. By way of example, the protective film 16 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium-strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TnO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various materials having insulating properties may be used as the material of the protective film 16. In an embodiment, the protective film 16 may be configured as a silicon oxide ($SiO_x$) thin film layer.

The protective film 16 may be provided in the form of a single layer or may be provided in the form of a multi-layer including at least two layers. By way of example, when the protective film 16 may be configured as a double layer including a first layer and a second layer that are sequentially stacked, the first layer and the second layer may be made of different materials (or ingredients), and may be formed through different processes. In some embodiments, the first layer and the second layers may be formed of the same material through a continuous process.

In some embodiments, the protective film 16 may expose both end portions (e.g., EP1 and EP2) of the light emitting stack pattern 10 that have different polarities. By way of example, the protective film 16 may expose a portion the first semiconductor layer 11 located at a first end portion EP1 of the light emitting stack pattern 10 and a portion of the additional electrode 15 located at a second end portion EP2 of the light emitting stack pattern 10. In another embodiment, the protective film 16 may expose side portions of the first and second semiconductor layers 11 and 13 adjacent to the first and second end portions EP1 and EP2 of the light emitting stack pattern 10.

In case that the protective film 16 is provided and/or formed on the light emitting stack pattern 10 and the insulating film 14, the active layer 12 may be prevented from being short-circuited with an electrode (e.g., at least one of contact electrodes connected to both the end portions EP1 and EP2 of the light emitting element LD), etc. that will be described later. Accordingly, the electrical stability of the light emitting element LD may be further ensured. In addition, when the protective film 16 is provided on a surface of the light emitting element LD, a surface defect of the light emitting element LD is minimized or reduced, so that the lifetime and efficiency of the light emitting element LD may be further improved. Additionally, because the protective film 16 is provided on an outer surface (e.g., an outer circumferential surface or an outer peripheral surface) (or surface) of the light emitting element LD, occurrence of an unwanted short-circuit between a plurality of light emitting elements LD may be prevented even when the light emitting elements LD are disposed close (or adjacent) to each other.

In some embodiments, the light emitting element LD may further include an additional component in addition to the light emitting stack pattern 10, the insulating film 14, and the protective film 16. For example, the light emitting element LD may additionally include at least one phosphor layer, at least one active layer, at least one semiconductor material, and/or at least one electrode layer, disposed at at least one end of the first semiconductor layer 11, the active layer, 12, and/or the second semiconductor layer 13.

The above-described protective film 16 may be provided and/or formed on the outer surface (e.g., an outer circumferential surface or an outer peripheral surface) (or surface) of the insulating film 14 by using a manufacturing method as follows.

Figure 12:
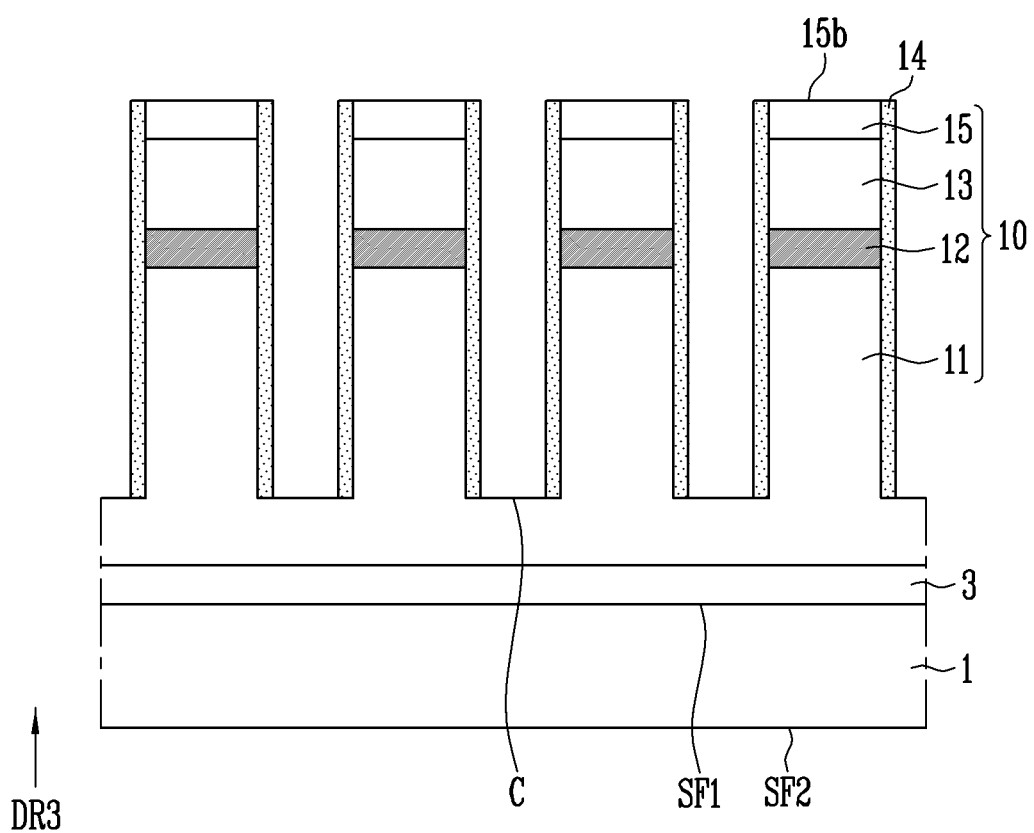
Figure 13:
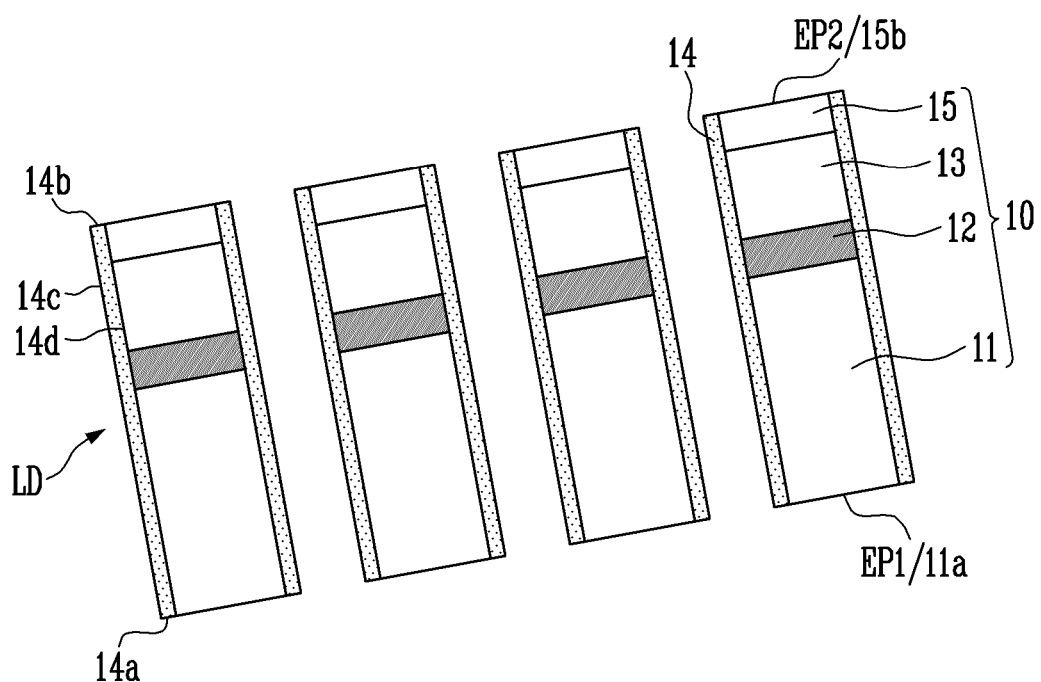
Figure 13:
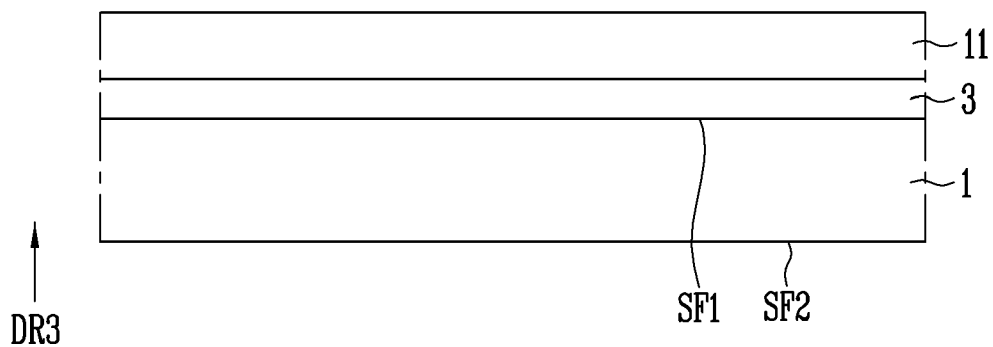
Figure 15:
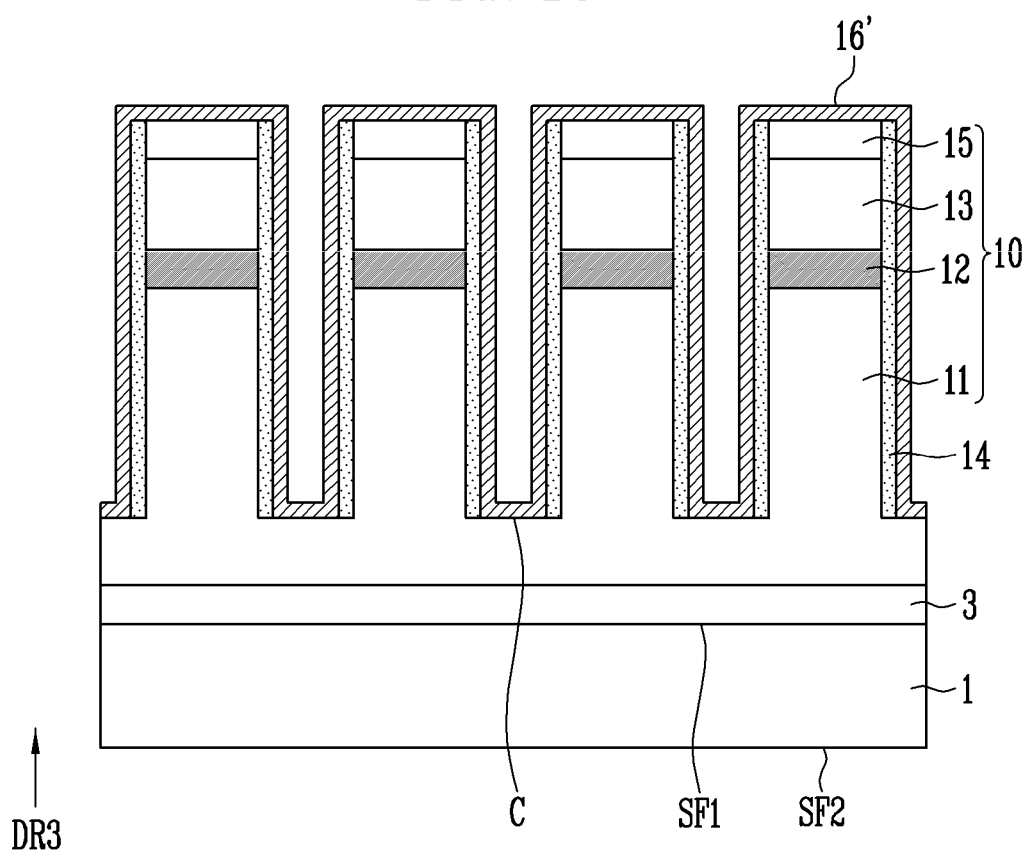
FIGS. 15 and 16 illustrate a method of manufacturing a protective film in a method of manufacturing the light emitting element shown in FIGS. 14A and 14B, and are sectional views schematically illustrating a process after the method shown in FIG. 12.

First, referring to FIGS. 12, 14B, and 15, a protective material layer 16' is formed on an insulating film 14 formed on an outer surface (e.g., an outer circumferential surface or an outer peripheral surface) (or surface) of each of light emitting stack patterns 10 and one region C of a first semiconductor layer 11 that is exposed to the outside.

The protective material layer 16' may include an upper protective material layer, a side protective material layer, and a lower protective material layer. The upper protective material layer may completely cover an upper surface 15b of an additional electrode 15 of each of the light emitting stack patterns 10 and an upper surface of the insulating film 14. The side protective material may completely cover a side surface of the insulating film 14 that surrounds the outer surface (e.g., an outer circumferential surface or an outer peripheral surface) (or surface) of each of the light emitting stack patterns 10. The lower protective material layer may completely cover the one region C of the first semiconductor layer 11 that is exposed to the outside.

The upper protective material layer, the side protective material layer, and the lower protective material layer may be connected to each other to be continued on the light emitting stack patterns 10.

The protective material layer 16' may be formed through an atomic layer deposition (ALD) process, and a thin film may be formed, using chemical absorption and desorption, by supplying trimethyl aluminum (TMA) and $H_2O$ source in a pulse form. However, the present disclosure is not limited thereto. In some embodiments, the protective material layer 16' may be formed on the light emitting stack patterns 10 by using a wet process (e.g., a wet chemical process, etc.).

Figure 16:
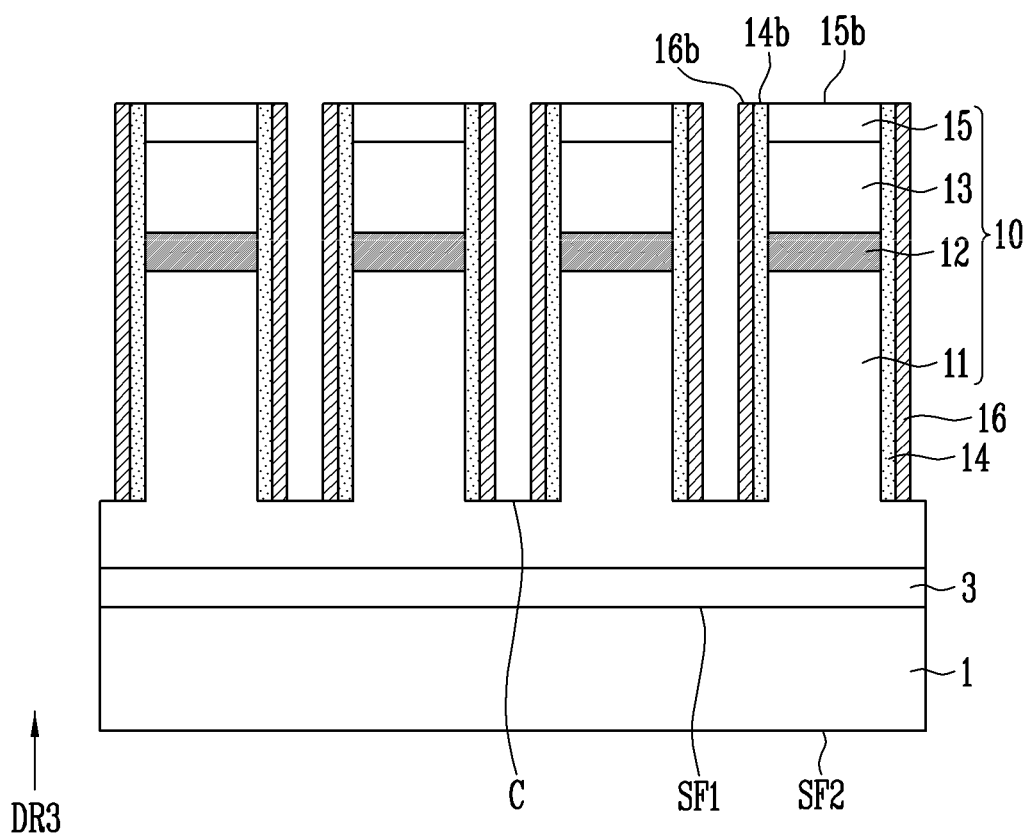

Subsequently, a protective film 16 is formed as shown in FIG. 16 by removing a portion of the protective material layer 16' through an etching process in a vertical direction. The above-described etching process may be performed by using a dry etching process.

The upper protective material layer and the lower protective material layer may be removed through the above-described etching process, so that the protective film 16 including only the side protective material layer covering the side surface of the insulating film 14 located on the outer surface (e.g., an outer circumferential surface or an outer peripheral surface) (or surface) of each light emitting stack pattern 10 is finally formed. Because the upper protective material layer is removed through the above-described etching process, the upper surface 15b of the additional electrode 15 may be exposed to the outside. An upper surface 16b of the protective film 16 may be provided and/or formed at the same surface (or same line or same plane) as the upper surface 15b of the additional electrode 15 and the upper surface 14b of the insulating film 14, but the present disclosure is not limited thereto. In addition, because the lower protective material layer is removed through the above-described etching process, the one region C of the first semiconductor layer 11 may be exposed.

After the above-described process is performed, a process of separating, from a substrate 1, light emitting elements LD including the light emitting stack pattern the insulating film 14, and the protective film 16 may be performed by using at least one process from among a physical separation process, a chemical separation process, and a laser separation process.

Figure 17A:
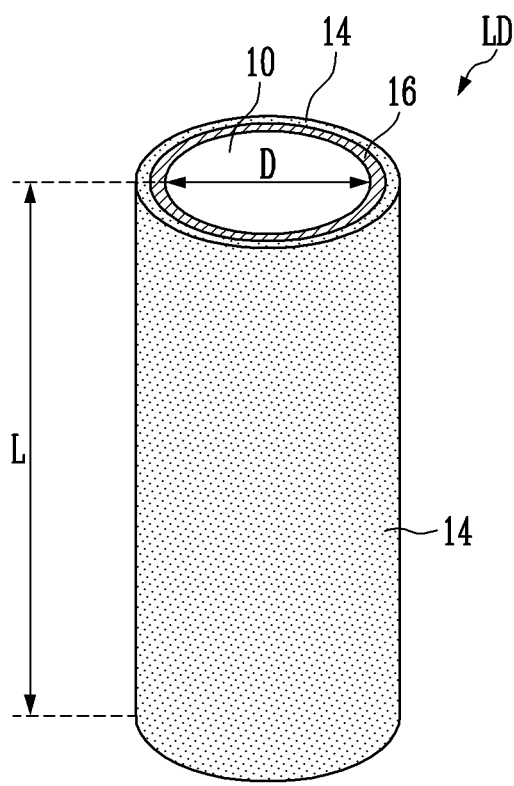
FIG. 17A is a schematic perspective view illustrating a light emitting element in accordance with an embodiment of the present disclosure.
Figure 17B:
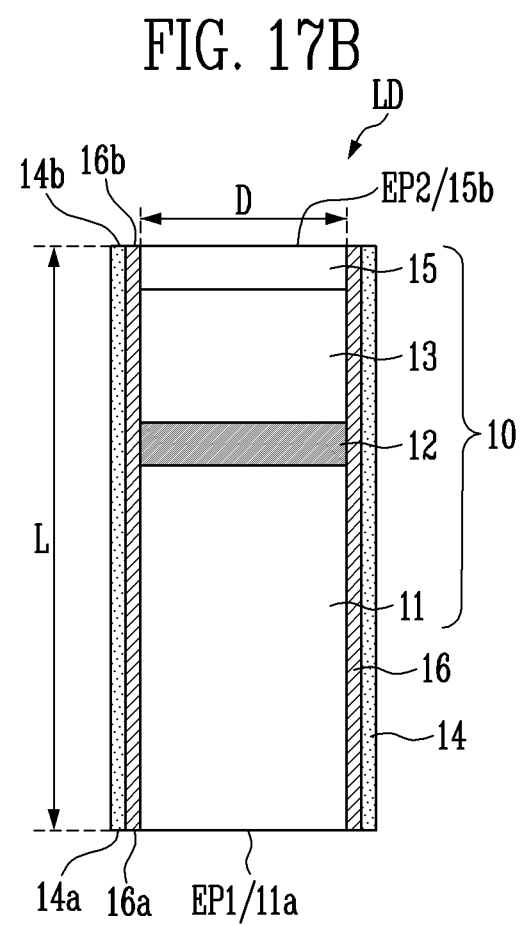
FIG. 17B is a schematic cross-sectional view of the light emitting element shown in FIG. 17A.

FIG. 17A is a schematic perspective view illustrating a light emitting element LD in accordance with an embodiment of the present disclosure, and FIG. 17B is a schematic cross-sectional view of the light emitting element LD shown in FIG. 17A.

The light emitting element LD shown in FIGS. 17A and 17B may have a configuration substantially identical or similar to that of the light emitting element LD shown in FIGS. 14A and 14B, except that a protective film 16 is provided on an outer surface (e.g., an outer circumferential surface or an outer peripheral surface) (or surface) of a light emitting stack pattern 10, and an insulating film 14 is provided on an outer surface (e.g., an outer circumferential surface or an outer peripheral surface) (or surface) of the protective film 16.

Accordingly, in relation to the light emitting element LD shown in FIGS. 17A and 17B, portions different from those of the above-described embodiment will be mainly described to avoid redundancy.

Referring to FIGS. 17A and 17B, the light emitting element LD in accordance with the embodiment of the present disclosure may include a light emitting stack pattern 10, the insulating film 14 surround the outer surface (e.g., an outer circumferential surface or an outer peripheral surface) (or surface) of the light emitting stack pattern 10, and the protective film 16 disposed to surround an outer surface (e.g., an outer circumferential surface or an outer peripheral surface) (or surface) of the insulating film 14.

The light emitting stack pattern 10 may include a first semiconductor layer 11, an active layer 12, a second semiconductor layer 13, and an additional electrode that are sequentially stacked along a length L direction of the light emitting element LD. In some embodiments, the additional electrode 15 may be omitted.

The protective film 16 may include an inorganic insulating material. By way of example, the protective film 16 may be configured as a silicon oxide ($SiO_x$) thin film layer. The protective film 16 may be provided and/or formed on the outer surface (e.g., an outer circumferential surface or an outer peripheral surface) (or surface) of the light emitting stack pattern 10 by using an atomic layer deposition (ALD) process, or the like.

The insulating film 14 may include an inorganic material. By way of example, the insulating film 14 may be a zinc oxide (ZnO) thin film layer. The insulating film 14 may be provided and/or formed on the outer surface (e.g., an outer circumferential surface or an outer peripheral surface) (or surface) of the protective film 16 provided on the outer surface (e.g., an outer circumferential surface or an outer peripheral surface) (or surface) of the light emitting stack pattern 10 by using a wet chemical process or the like. In some embodiments, the insulating film 14 may be a zinc oxide (ZnO) thin film layer doped with a Group III transition metal. The Group III transition metal is a component for further improving an insulating characteristic of the zinc oxide (ZnO) thin film layer, and may be at least one of yttrium (Y), scandium (Sc), lanthanum (La), actinium (Ac), lutetium (Lu), and lawrencium (Lr).

A lower surface 11a of the light emitting stack pattern 10, a lower surface 16a of the protective film 16, and a lower surface 14a of the insulating film 14 may be located at the same surface (or same line or same plane), but the present disclosure is not limited thereto. In some embodiments, the lower surface 11a of the light emitting stack pattern 10, the lower surface 16a of the protective film 16, and the lower surface 14a of the insulating film 14 may be located at different surfaces (or different lines or different planes).

In addition, an upper surface 15b of the light emitting stack pattern 10, an upper surface 16b of the protective film 16, and an upper surface 14b of the insulating film 14 may be located at the same surface (or same line or same plane), but the present disclosure is not limited thereto. In some embodiments, the upper surface of the light emitting stack pattern 10, the upper surface 16b of the protective film 16, and the upper surface 14b of the insulating film 14 may be located at different surfaces (or different lines or different planes).

As described above, when the insulating film 14 is located at an outermost portion in a side surface of the light emitting element LD, a lattice defect that may exist between the light emitting stack pattern 10 and the protective film 16 may be reduced by using a material characteristic of the insulating film 14. Accordingly, a surface defect of the light emitting stack pattern 10 that occurs in a manufacturing process of the light emitting element LD, may be reduced or minimized, so that the light emission efficiency of the light emitting element LD can be further improved.

In the above-described embodiment, a case where the protective film 16 is the silicon oxide ($SiO_x$) thin film layer has been described as an example, but the present disclosure is not limited thereto. In some embodiments, the protective film 16 may be an aluminum oxide (AlO$_x$) thin film layer.

Figure 18A:
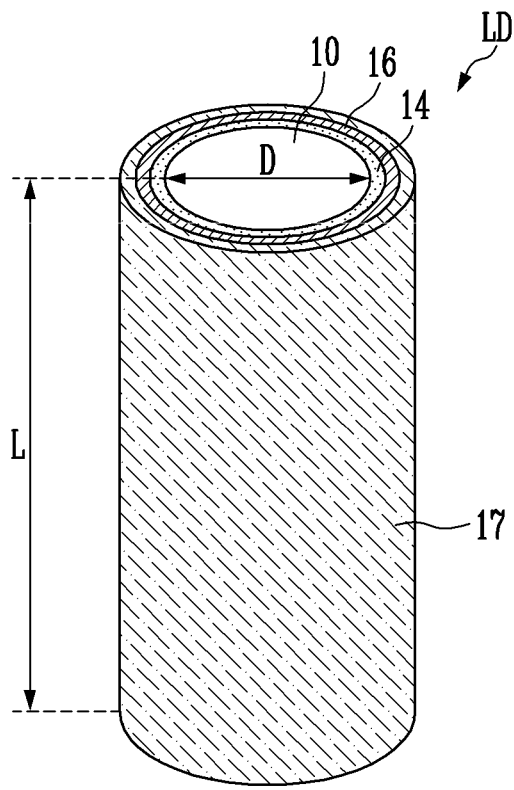
FIG. 18A is a schematic perspective view schematically illustrating a light emitting element in accordance with an embodiment of the present disclosure.
Figure 18B:
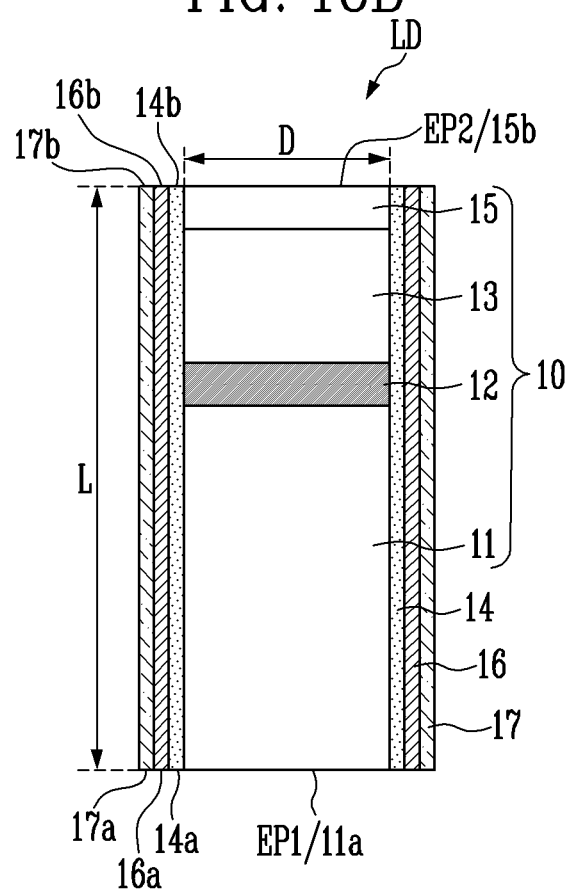
FIG. 18B is a schematic cross-sectional view of the light emitting element shown in FIG. 18A.

FIG. 18A is a schematic perspective view illustrating a light emitting element LD in accordance with an embodiment of the present disclosure, and FIG. 18B is a schematic cross-sectional view of the light emitting element LD shown in FIG. 18A.

The light emitting element LD shown in FIGS. 18A and 18B may have a configuration substantially identical or similar to that of the light emitting element LD shown in FIGS. 14A and 14B, except that an additional protective film (or a second protective film) 17 surrounding an outer surface (e.g., an outer circumferential surface or an outer peripheral surface) of a protective film 16 is provided.

Accordingly, in relation to the light emitting element LD shown in FIGS. 18A and 18B, portions different from those of the above-described embodiment will be mainly described to avoid redundancy.

Referring to FIGS. 18A and 18B, the light emitting element LD in accordance with the embodiment of the present disclosure may include a light emitting stack pattern 10, an insulating film 14 surrounding an outer surface (e.g., an outer circumferential surface or an outer peripheral surface) (or surface) of the light emitting stack pattern 10, the protective film 16 surrounding an outer surface (e.g., an outer circumferential surface or an outer peripheral surface) (or surface) of the insulating film 14, and the additional protective film 17 surrounding the outer surface (e.g., an outer circumferential surface (or surface) or an outer peripheral surface) of the protective film 16.

The light emitting stack pattern 10 may include a first semiconductor layer 11, an active layer 12, a second semiconductor layer 13, and an additional electrode that are sequentially stacked along a length L direction of the light emitting element LD.

The insulating film 14 may be configured as a zinc oxide (ZnO) thin film layer. In some embodiments, the insulating film 14 may be a zinc oxide (ZnO) thin film layer doped with a Group III transition metal.

The protective film 16 may be disposed to surround the outer surface (e.g., an outer circumferential surface or an outer peripheral surface) (or surface) of the insulating film 14, and include an inorganic insulating material. The protective film 16 may include at least one of the inorganic insulating materials described with reference to FIGS. 14A and 14B. By way of example, the protective film 16 may be a silicon oxide (SiO$_x$) thin film layer. In some embodiments, the protective film 16 may be provided in the form of a single layer or be provided in the form of a multi-layer including at least two layers.

The additional protective film 17 may be disposed to surround the outer surface (e.g., an outer circumferential surface or an outer peripheral surface) (or surface) of the protective film 16, and include an inorganic insulating material. By way of example, the additional protective film 17 may include at least one insulating material selected from the group consisting of silicon oxide (SiO$_x$), silicon nitride (SiN$_x$), silicon oxynitride (SiO$_x$N$_y$), aluminum oxide (AlO$_x$), titanium oxide (TiO$_x$), hafnium oxide (HfO$_x$), titanium-strontium oxide (SrTiO$_x$), cobalt oxide (Co$_x$O$_y$), magnesium oxide (MgO), zinc oxide (ZnO), ruthenium oxide (RuO$_x$), nickel oxide (NiO), tungsten oxide (WO$_x$), tantalum oxide (TnO$_x$), gadolinium oxide (GdO$_x$), zirconium oxide (ZrO$_x$), gallium oxide (GaO$_x$), vanadium oxide (V$_x$O$_y$), ZnO:Al, ZnO:B, InxOy:H, niobium oxide (Nb$_x$O$_y$), magnesium fluoride (MgF$_x$), aluminum fluoride (AlF$_x$), Alucone polymer film, titanium nitride (TiN), tantalum nitride (TaN), aluminum nitride (AlN$_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various materials having insulating properties may be used as the material of the additional protective film 17.

In some embodiments, the additional protective film 17 and the protective film 16 may be formed of different materials (or ingredients) through processes separate from each other, but the present disclosure is not limited thereto. In some embodiments, the additional protective film 17 and the protective film 16 may include the same material (or ingredient), and may be formed through a continued process.

The additional protective film 17 may be provided in the form of a single layer or may be provided in the form of a multi-layer including at least two layers.

In some embodiments, the additional protective film 17 may expose both end portions (e.g., EP1 and EP2) of the light emitting stack pattern 10, which have different polarities. By way of example, the additional protective film 17 may expose a portion of each of the first semiconductor layer 11 located at a first end portion EP1 of the light emitting stack pattern 10 and the additional electrode 15 located at a second end portion EP2 of the light emitting stack pattern 10.

When the additional protective film 17 is provided and/or formed on the light emitting stack pattern 10, the insulating film 14, and the protective film 16, the active layer 12 is further prevented from being short-circuited with an external conductive material, so that the electrical stability of the light emitting element LD can be further ensured.

In the above-described embodiment, it has been described that the insulating film 14 surrounds the outer surface (e.g., an outer circumferential surface or an outer peripheral surface) (or surface) of the light emitting stack pattern 10, the protective film 16 surrounds the outer surface (e.g., an outer circumferential surface or an outer peripheral surface) (or surface) of the insulating film 14, and the additional protective film 17 surrounds the outer surface (e.g., an outer circumferential surface or an outer peripheral surface) (or surface) of the protective film 16, but the present disclosure is not limited thereto. An order in which the insulating film 14, the protective film 16, and the additional protective film 17 are disposed with respect to the outer surface (e.g., an outer circumferential surface or an outer peripheral surface) (or surface) of the light emitting stack pattern 10 may be variously changed.

Figure 19A:
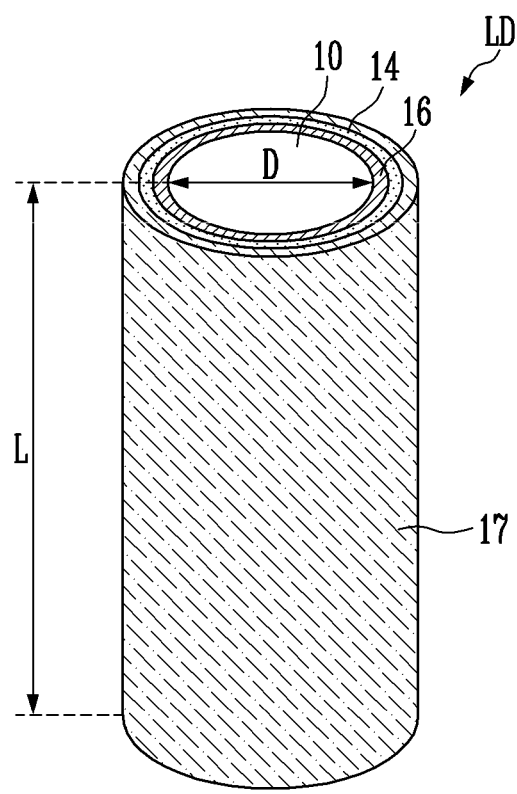
FIG. 19A is a schematic perspective view illustrating a light emitting element in accordance with an embodiment of the present disclosure.
Figure 19B:
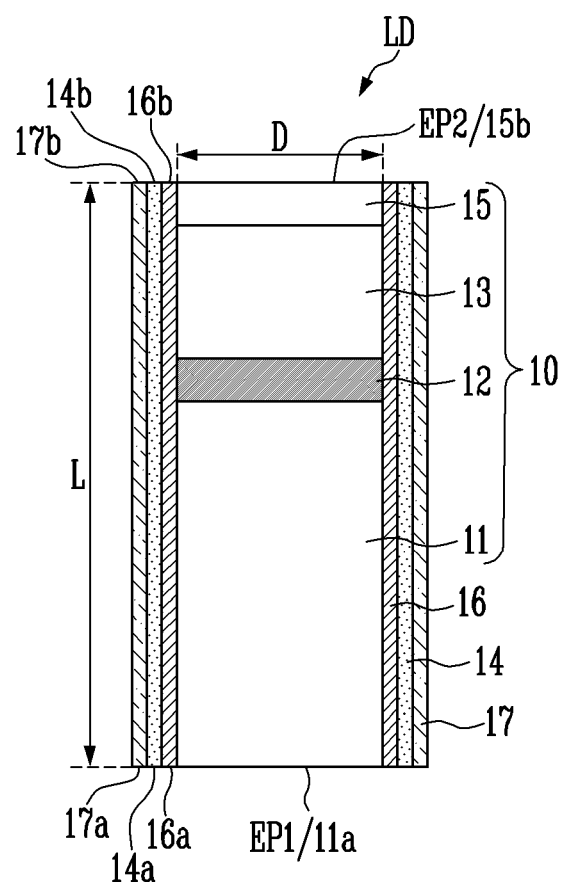
FIG. 19B is a schematic cross-sectional view of the light emitting element shown in FIG. 19A.

FIG. 19A is a schematic perspective view illustrating a light emitting element LD in accordance with an embodiment of the present disclosure, and FIG. 19B is a schematic cross-sectional view of the light emitting element LD shown in FIG. 19A.

The light emitting element LD shown in FIGS. 19A and 19B may have a configuration substantially identical or similar to that of the light emitting element LD shown in FIGS. 18A and 18B, except that a protective film 16 is provided on an outer surface (e.g., an outer circumferential surface or an outer peripheral surface) of a light emitting stack pattern 10, an insulating film 14 is provided on an outer surface (e.g., an outer circumferential surface or an outer peripheral surface) of the protective film 16, and an additional protective film 17 is provided on an outer surface (e.g., an outer circumferential surface or an outer peripheral surface) of the insulating film 14.

Accordingly, in relation to the light emitting element LD shown in FIGS. 19A and 19B, portions different from those of the above-described embodiment will be mainly described to avoid redundancy.

Referring to FIGS. 19A and 19B, the light emitting element LD in accordance with the embodiment of the present disclosure may include a light emitting stack pattern 10, the protective film 16 surrounding the outer surface (e.g., an outer circumferential surface or an outer peripheral surface) (or surface) of the light emitting stack pattern 10, the insulating film 14 surrounding the outer surface (e.g., an outer circumferential surface or an outer peripheral surface) (or surface) of the protective film 16, and the additional protective film 17 surrounding the outer surface (e.g., an outer circumferential surface or an outer peripheral surface) (or surface) of the insulating film 14.

The light emitting stack pattern 10 may include a first semiconductor layer 11, an active layer 12, a second semiconductor layer 13, and an additional electrode that are sequentially stacked along a length L direction of the light emitting element LD.

The protective film 16 may be disposed to surround the outer surface (e.g., an outer circumferential surface or an outer peripheral surface) (or surface) of the light emitting stack pattern 10, and include an inorganic insulating material. By way of example, the protective film 16 may be a silicon oxide ($SiO_x$) thin film layer, but the present disclosure is not limited thereto. The protective film 16 may expose both end portions of the light emitting stack pattern 10, which have different polarities. By way of example, the protective film 16 may expose a portion of each of the first and second semiconductor layers 11 and 13 (or the additional electrode layer 15) located at first and second end portions EP1 and EP2 of the light emitting stack pattern 10. As shown in the drawings, when the light emitting stack pattern 10 includes the additional electrode 15, the protective film 16 may expose a portion of each of the first semiconductor layer 11 located at the first end portion EP1 of the light emitting stack pattern 10 and the additional electrode 15 located at the second end portion EP2 of the light emitting stack pattern 10.

The insulating film 14 may be disposed to surround the outer surface (e.g., an outer circumferential surface or an outer peripheral surface) (or surface) of the protective film 16, and may be a zinc oxide (ZnO) thin film layer. The insulating film 14 may be provided and/or formed on the outer surface (e.g., an outer circumferential surface or an outer peripheral surface) (or surface) of the protective film 16 by using a wet chemical process or the like. In some embodiments, the insulating film 14 may be a zinc oxide (ZnO) thin film layer doped with a Group III transition metal. The insulating film 14 may expose, together with the protective film 16, a portion of each of the first semiconductor layer 11 located at the first end portion EP1 of the light emitting stack pattern 10 and the additional electrode 15 located at the second end portion EP2 of the light emitting stack pattern 10.

The additional protective film 17 may be disposed to surround the outer surface (e.g., an outer circumferential surface or an outer peripheral surface) (or surface) of the insulating film 14, and include an inorganic insulating material. For example, the additional protective film 17 may be the same silicon oxide ($SiO_x$) thin film layer as the protective film 16. However, the present disclosure is not limited thereto. In some embodiments, the additional protective film 17 may be an aluminum oxide ($AlO_x$) thin film layer. The additional protective film 17 may expose, together with the protective film 16 and the insulating film 14, a portion of each of the first semiconductor layer 11 located at the first end portion EP1 of the light emitting stack pattern 10 and the additional electrode 15 located at the second end portion EP2 of the light emitting stack pattern 10.

In an embodiment, the insulating film 14 may be disposed between the protective film 16 and the additional protective film 17, to be respectively in contact with the outer surface (e.g., an outer circumferential surface or an outer peripheral surface) (or surface) of the protective film 16 and an inner side surface of the additional protective film 17.

A lower surface 11a of the light emitting stack pattern 10, a lower surface 16a of the protective film 16, a lower surface 14a of the insulating film 14, and a lower surface 17a of the additional protective film 17 may be located at the same surface (or same line or same plane), but the present disclosure is not limited thereto.

In addition, an upper surface 15b of the light emitting stack pattern 10, an upper surface 16b of the protective film 16, an upper surface 14b of the insulating film 14, and an upper surface 17b of the additional protective film 17 may be located at the same surface (or same line or same plane), but the present disclosure is not limited thereto.

As described above, when the insulating film 14 is located between the protective film 16 and the additional protective film 17, the active layer 12 can be further prevented from being short-circuited with an external conductive material while reducing a lattice defect which may exist between the light emitting stack pattern 10 and the protective film 16 by using a material characteristic of the insulating film 14. Accordingly, the electrical stability of the light emitting element LD is further ensured while reducing a surface defect of the light emitting stack pattern 10 that occurs in a manufacturing process of the light emitting element LD, so that the light emission efficiency of the light emitting element LD may be further improved.

Figure 20A:
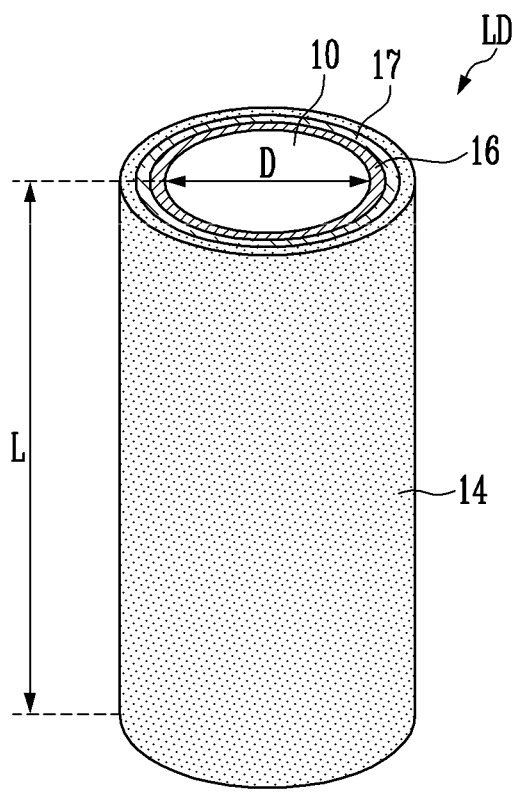
FIG. 20A is a schematic perspective view illustrating a light emitting element in accordance with an embodiment of the present disclosure.
Figure 20B:
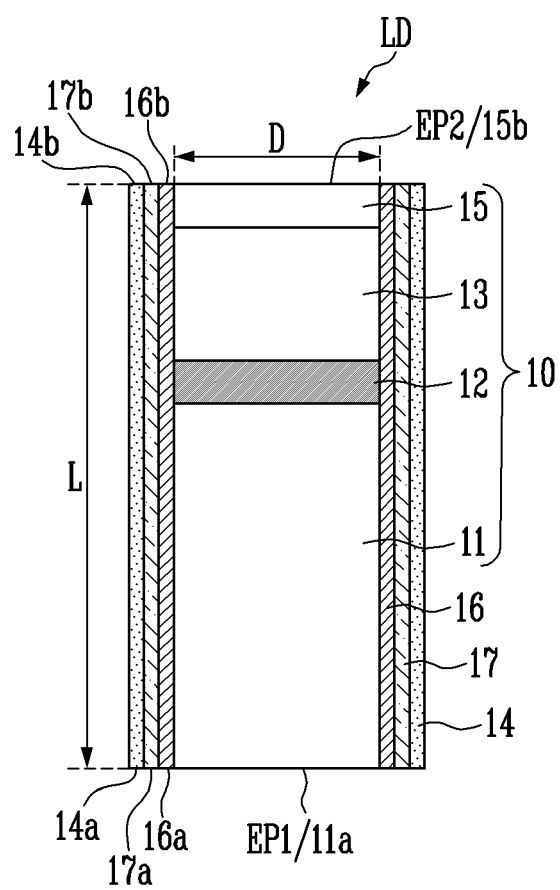
FIG. 20B is a schematic cross-sectional view of the light emitting element shown in FIG. 20A.

FIG. 20A is a schematic perspective view illustrating a light emitting element LD in accordance with an embodiment of the present disclosure, and FIG. 20B is a schematic cross-sectional view of the light emitting element LD shown in FIG. 20A.

The light emitting element LD shown in FIGS. 20A and 20B may have a configuration substantially identical or similar to that of the light emitting element LD shown in FIGS. 19A and 19B, except that a protective film 16 is provided on an outer surface (e.g., an outer circumferential surface or an outer peripheral surface) of a light emitting stack pattern 10, an additional protective film 17 is provided on an outer surface (e.g., an outer circumferential surface or an outer peripheral surface) of the protective film 16, and an insulating film 14 is provided on an outer surface (e.g., an outer circumferential surface or an outer peripheral surface) of the additional protective film 17.

Accordingly, in relation to the light emitting element LD shown in FIGS. 20A and 20B, portions different from those of the above-described embodiment will be mainly described to avoid redundancy.

Referring to FIGS. 20A and 20B, the light emitting element LD in accordance with the embodiment of the present disclosure may include a light emitting stack pattern 10, the protective film 16 surrounding the outer surface (e.g., an outer circumferential surface or an outer peripheral surface) (or surface) of the light emitting stack pattern 10, the additional protective film 17 surrounding the outer surface (e.g., an outer circumferential surface or an outer peripheral surface) (or surface) of the protective film 16, and the insulating film 14 surrounding the outer surface (e.g., an outer circumferential surface or an outer peripheral surface) (or surface) of the additional protective film 17.

The light emitting stack pattern 10 may include a first semiconductor layer 11, an active layer 12, a second semiconductor layer 13, and an additional electrode that are sequentially stacked along a length L direction of the light emitting element LD.

The protective film 16 may be disposed to surround the outer surface (e.g., an outer circumferential surface or an outer peripheral surface) (or surface) of the light emitting stack pattern 10, and include an inorganic insulating material. By way of example, the protective film 16 may be a silicon oxide ($SiO_x$) thin film layer. In an embodiment, the protective film 16 may be provided and/or formed on the outer surface (e.g., an outer circumferential surface or an outer peripheral surface) (or surface) of the light emitting stack pattern 10 by using an atomic layer deposition (ALD) process.

The additional protective film 17 may be disposed to surround the outer surface (e.g., an outer circumferential surface or an outer peripheral surface) (or surface) of the protective film 16, and include an inorganic insulating material. By way of example, the additional protective film 17 may be a silicon oxide ($SiO_x$) thin film layer. In an embodiment, the additional protective film 17 may be provided and/or formed on the outer surface (e.g., an outer circumferential surface or an outer peripheral surface) (or surface) of the protective film 16 by using an atomic layer deposition (ALD) process or the like.

The insulating film 14 may be provided to surround the outer surface (e.g., an outer circumferential surface or an outer peripheral surface) (or surface) of the additional protective film 17, and may be a zinc oxide (ZnO) thin film layer. The insulating film 14 may be provided and/or formed on the outer surface (e.g., an outer circumferential surface or an outer peripheral surface) (or surface) of the additional protective film 17 by using a wet chemical process or the like. In some embodiments, the insulating film 14 may be a zinc oxide (ZnO) thin film layer doped with a Group III transition metal.

As described above, when the insulating film is located at an outermost portion in a side surface of the light emitting element LD, a lattice defect which may exist each of between the light emitting stack pattern 10 and the protective film 16 and between the light emitting stack pattern 10 and the additional protective film 17 may be reduced by using a material characteristic of the insulating film 14. Accordingly, a surface defect of the light emitting stack pattern 10 that occurs in a manufacturing process of the light emitting element LD, may be reduced or minimized, so that the light emission efficiency of the light emitting element LD may be further improved.

In some embodiments, another separate protective film that surrounds the outer surface (e.g., an outer circumferential surface or an outer peripheral surface) (or surface) of the insulating film 14 may be provided and/or formed. The another protective film may include an inorganic insulating material, and may include the same material as the protective film 16 and/or the additional protective film 17. Like the protective film 16 and the additional protective film 17, the another protective film may be provided and/or formed on the outer surface (e.g., an outer circumferential surface or an outer peripheral surface) (or surface) of the insulating film 14 by using an atomic layer deposition (ALD) process or the like.

In the above-described embodiments, it has been described that the light emitting element LD includes only one insulating film 14 configured as a zinc oxide (ZnO) thin film layer, but the present disclosure is not limited thereto.

In some embodiments, the light emitting element LD may include two or more insulating films each configured as a zinc oxide (ZnO) thin film layer. This will be described in detail later with reference to FIGS. 21A and 21B.

Figure 21A:
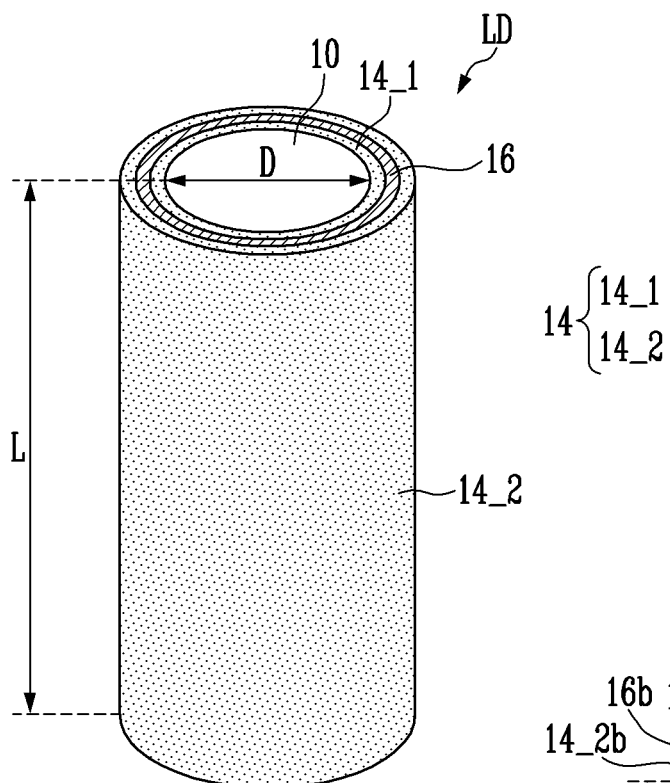
FIG. 21A is a schematic perspective view illustrating a light emitting element in accordance with an embodiment of the present disclosure.
Figure 21B:
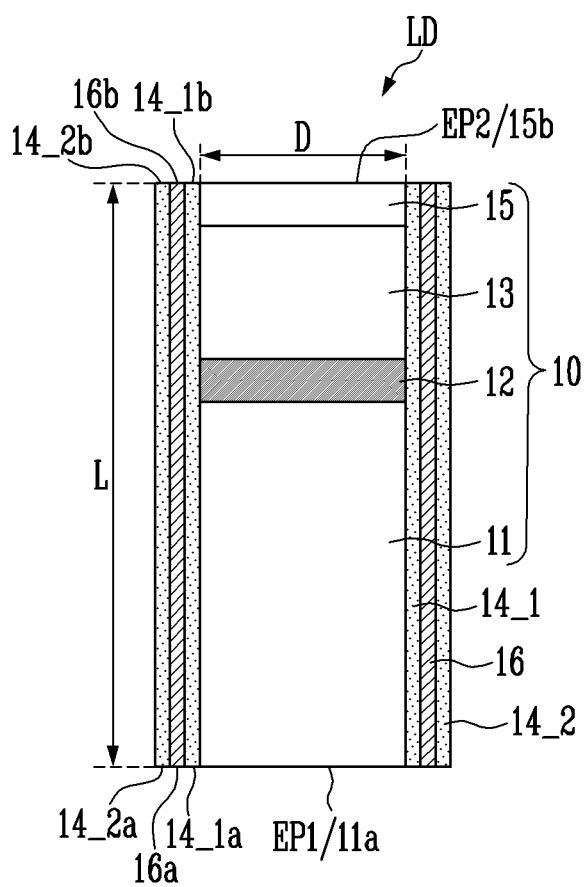
FIG. 21B is a schematic cross-sectional view of the light emitting element shown in FIG. 21A.

FIG. 21A is a schematic perspective view illustrating a light emitting element LD in accordance with an embodiment of the present disclosure, and FIG. 21B is a schematic cross-sectional view of the light emitting element LD shown in FIG. 21A.

The light emitting element LD shown in FIGS. 21A and 21B may have a configuration substantially identical or similar to that of the light emitting element LD shown in FIGS. 14A and 14B, except that an insulating film 14 includes a first insulating film 14_1 and a second insulating film 14_2.

Accordingly, in relation to the light emitting element LD shown in FIGS. 21A and 21B, portions different from those of the above-described embodiment will be mainly described to avoid redundancy.

Referring to FIGS. 21A and 21B, the light emitting element LD in accordance with the embodiment of the present disclosure may include a light emitting stack pattern 10, an insulating film 14, and a protective film 16.

The light emitting stack pattern 10 may include a first semiconductor layer 11, an active layer 12, a second semiconductor layer 13, and an additional electrode that are sequentially stacked along a length L direction of the light emitting element LD.

The insulating film 14 may include the first insulating film 14_1 and the second insulating film 14_2.

The first insulating film 14_1 may be disposed to surround an outer surface (e.g., an outer circumferential surface or an outer peripheral surface) (or surface) of the light emitting stack pattern 10, and may be a zinc oxide (ZnO) thin film layer. The first insulating film 14_1 may be provided and/or formed on the outer surface (e.g., an outer circumferential surface or an outer peripheral surface) (or surface) of the light emitting stack pattern 10 by using a wet chemical process or the like. In some embodiments, the first insulating film 14_1 may be a zinc oxide (ZnO) thin film layer doped with a Group III transition metal. The first insulating film 14_1 may expose a portion of each of the first semiconductor layer 11 located at a first end portion EP1 of the light emitting stack pattern 10 and the additional electrode 15 located at a second end portion EP2 of the light emitting stack pattern 10.

The protective film 16 may be disposed to surround an outer surface (e.g., an outer circumferential surface or an outer peripheral surface) (or surface) of the first insulating film 14_1, and may include an inorganic insulating material. For example, the protective film 16 may be a silicon oxide ($SiO_x$) thin film layer, but the present disclosure is not limited thereto. In some embodiments, the protective film 16 may be an aluminum oxide ($AlO_x$) thin film layer. The protective film 16 may be provided and/or formed on the outer surface (e.g., an outer circumferential surface or an outer peripheral surface) (or surface) of the first insulating film 14_1 by using an atomic layer deposition (ALD) process or the like.

The second insulating film 14_2 may be disposed to surround an outer surface (e.g., an outer circumferential surface or an outer peripheral surface) (or surface) of the protective film 16, and may include the same material as the first insulating film 14_1. By way of example, the second insulating film 14_2 may be a zinc oxide (ZnO) thin film layer. The second insulating film 14_2 may be provided and/or formed on the outer surface (e.g., an outer circumferential surface or an outer peripheral surface) (or surface) of the protective film 16 by using a wet chemical process or the like. In some embodiments, the second insulating film 14_2 may be a zinc oxide (ZnO) thin film layer doped with a Group III transition metal.

A lower surface 11a of the light emitting stack pattern 10, a lower surface 14_1a of the first insulating film 14_1, a lower surface 16a of the protective film 16, and a lower surface 14_2a of the second insulating film 14_2 may be located at the same surface (or same line or same plane), but the present disclosure is not limited thereto. In some embodiments, the lower surface 11a of the light emitting stack pattern 10, the lower surface 14_1a of the first insulating film 14_1, the lower surface 16a of the protective film 16, and the lower surface 14_2a of the second insulating film 14_2 may be located at different surfaces (or different lines or different planes).

In addition, an upper surface 15b of the light emitting stack pattern 10, an upper surface 14_1b of the first insulating film 14_1, an upper surface 16b of the protective film 16, and an upper surface 14_2b of the second insulating film 14_2 may be located at the same surface (or same line or same plane), but the present disclosure is not limited thereto. In some embodiments, the upper surface 15b of the light emitting stack pattern 10, the upper surface 14_1b of the first insulating film 14_1, the upper surface 16b of the protective film 16, and the upper surface 14_2b of the second insulating film 14_2 may be located at different surfaces (or different lines or different planes).

As described above, when the first insulating film 14_1 configured as a zinc oxide (ZnO) thin film layer is located on the outer surface (e.g., an outer circumferential surface or an outer peripheral surface) (or surface) of the light emitting stack pattern 10 and the second insulating film 14_2 configured as a zinc oxide (ZnO) thin film layer is located at an outermost portion in a side surface of the light emitting element LD, a surface defect of the light emitting stack pattern 10 that occurs in a manufacturing process of the light emitting element LD may be reduced or minimized, and the active layer 12 may be further prevented from being short-circuited with an external conductive material while reducing a lattice defect that may exist between the light emitting stack pattern 10 and the protective film 16 by using a material characteristic of the first and second insulating films 14_1 and 14_2. Accordingly, the light emission efficiency of the light emitting element LD may be further improved.

In some embodiments, another separate protective film that surrounds an outer surface (e.g., an outer circumferential surface or an outer peripheral surface) (or surface) of the second insulating film 14_2 may be provided and/or formed. The another protective film may include an inorganic insulating material, and may include a material equal to or different from that of the protective film 16. By way of example, the protective film 16 may be configured as a silicon oxide ($SiO_x$) thin film layer, and the another protective film may be configured as an aluminum oxide ($AlO_x$) thin film layer. Like the protective film 16, the another protective film may be provided and/or formed on the outer surface (e.g., an outer circumferential surface or an outer peripheral surface) (or surface) of the second insulating film 14_2 by using an atomic layer deposition (ALD) process or the like.

In the above-described embodiment, it has been described that only one protective film 16 is disposed between the first insulating film 14_1 and the second insulating film 14_2, but the present disclosure is not limited thereto. In some embodiments, at least two protective films may be disposed between the first insulating film 14_1 and the second insulating film 14_2. When the protective film 16 and an additional protective film surrounding the outer surface (e.g., an outer circumferential surface or an outer peripheral surface) (or surface) of the protective film 16 are located between the first insulating film 14_1 and the second insulating film 14_2, the protective film may be configured as a silicon oxide ($SiO_x$) thin film layer, and the additional protective film may configured as an aluminum oxide ($AlO_x$) thin film layer. Like the protective film 16, the additional protective film may be provided and/or formed on the outer surface (e.g., an outer circumferential surface or an outer peripheral surface) (or surface) of the protective film 16 by using an atomic layer deposition (ALD) process or the like.

Hereinafter, an example of a display device using the above-described light emitting element LD as a light source (or light emitting source) will be described.

Figure 22:
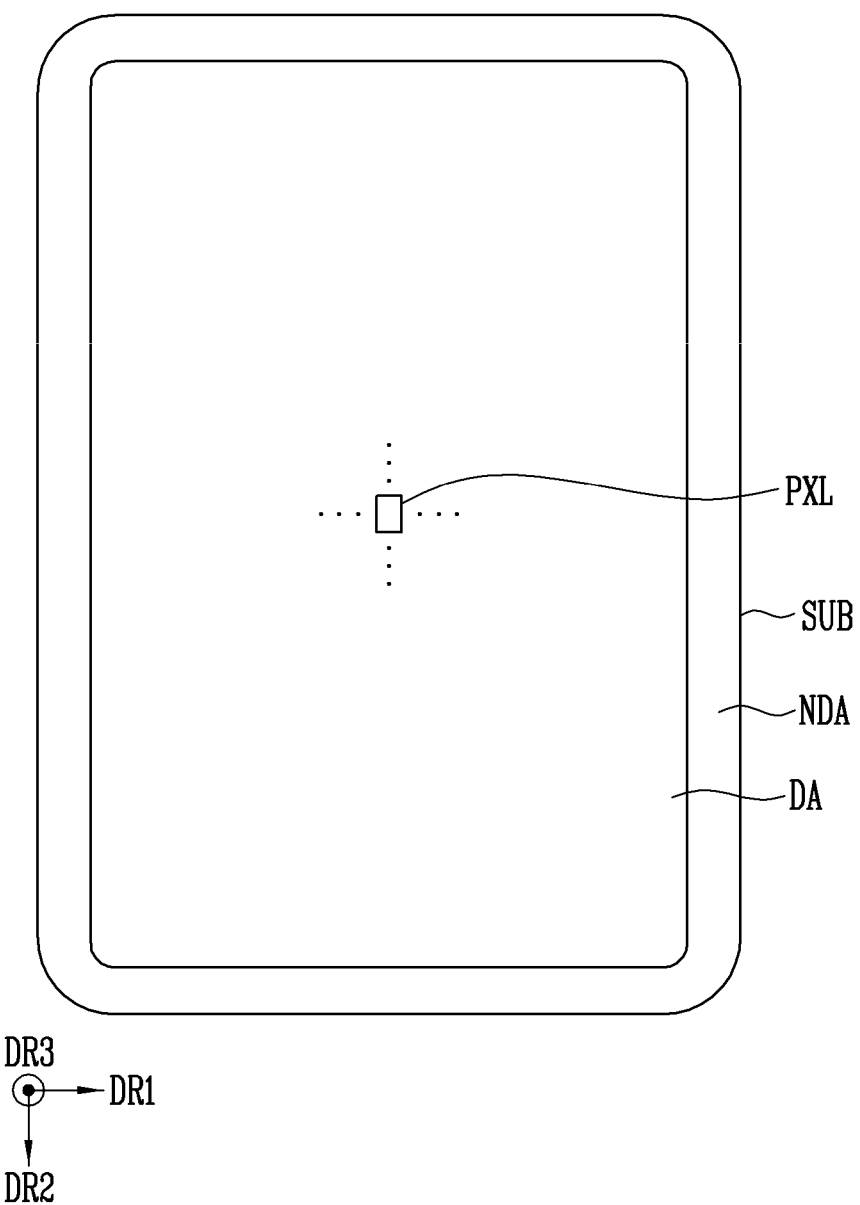
FIG. 22 illustrates a display device in accordance with an embodiment of the present disclosure, and for example, is a schematic plan view of a display device using, as a light source, the light emitting element shown in FIGS. 1 and 2.

FIG. 22 illustrates a display device in accordance with an embodiment of the present disclosure, and for example, is a schematic plan view of a display device using, as a light source, the light emitting element LD shown in FIGS. 1 and 2.

In FIG. 22, for convenience, a structure of the display device is briefly illustrated based on a display area DA in which an image is displayed.

Referring to FIGS. 1, 2, and 22, the display device in accordance with the embodiment of the present disclosure may include a substrate SUB, a plurality of pixels PXL that are provided on the substrate SUB, and each pixel includes at least one light emitting element LD. The display device further includes a driving unit provided on the substrate SUB to drive the pixels PXL, and a line unit to connect the pixels PXL and the driving unit.

The present disclosure may be applied as long as the display device is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The display device may be classified into a passive matrix type display device and an active matrix type display device according to a method of driving the light emitting element LD. By way of example, when the display device is implemented as the active matrix type display device, each of the pixels PXL may include a driving transistor for controlling an amount of current supplied to the light emitting element LD, a switching transistor for transferring a data signal to the driving transistor, and the like.

The display device may be provided in various shapes. By way of example, the display device may be provided in a rectangular plate shape having two pairs of sides parallel to each other, but the present disclosure is not limited thereto. When the display device is provided in the rectangular plate shape, any one pair of sides from among the two pairs of sides may be provided longer than the other pair of sides. For convenience, a case where the display device is provided in a rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device provided in the rectangular plate shape, a corner portion at which one long side and one short side are in contact with (or meet) each other may have a round shape, but the present disclosure is not limited thereto.

The substrate SUB may include the display area DA and a non-display area NDA.

The display area DA may be an area in which the pixels PXL for displaying an image are provided. The non-display area NDA may be an area in which the driving unit for driving the pixels PXL and a portion of the line unit that connects the pixels PXL and the driving unit are provided. For convenience, only one pixel PXL is illustrated in FIG. 22, but a plurality of pixels PXL may be substantially provided in the display area DA of the substrate SUB.

The non-display area NDA may be provided at at least one side of the display area DA. The non-display area NDA may surround the display area DA along the periphery (or edge) of the display area DA. The non-display area NDA may be provided with the line unit connected to the pixels PXL and the driving unit that is connected to the line part and drives the pixels PXL.

The line unit may electrically connect the driving unit and the pixels PXL. The line unit may be a fan-out line that provides a signal to each pixel PXL and is connected to signal lines, e.g., a scan line, a data line, an emission control line, and the like, that are connected to each pixel PXL. Also, the line unit may be a fan-out line connected to signal lines, e.g., a control line, a sensing line, and the like, that are connected to each pixel PXL, so as to compensate for an electrical characteristic change of each pixel PXL in real time.

The substrate SUB may include a transparent insulating material to enable light to be transmitted therethrough. The substrate SUB may be a rigid substrate or a flexible substrate.

One area on the substrate SUB may be provided as the display area DA such that the pixels PXL are disposed therein, and the other area on the substrate SUB may be provided as the non-display area NDA. By way of example, the substrate SUB may include the display area including pixel areas in which the respective pixels PXL are disposed and the non-display area NDA disposed at the periphery of the display area DA (or adjacent to the display area DA).

Each of the pixels PXL may be provided in the display area DA on the substrate SUB. In an embodiment of the present disclosure, the pixels PXL may be arranged in a stripe or a PENTILE® arrangement structure on in the display area DA, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA in various structures and/or manners.

Each pixel PXL may include at least one light emitting element LD driven by a corresponding scan signal and a corresponding data signal. The light emitting element LD may have a small size in a range of nanometer scale to micrometer scale, and may be connected in parallel to light emitting elements disposed adjacent thereto. However, the present disclosure is not limited thereto. The light emitting element LD may constitute a light source of each pixel PXL.

Each pixel PXL may include at least one light source, e.g., the light emitting element LD shown in FIGS. 1 and 2, which is driven by a signal (e.g., a predetermined signal) (e.g., a scan signal and a data signal) and/or a power source (e.g., a predetermined power source) (e.g., a first driving power source and a second driving power source). However, in the embodiment of the present disclosure, the kind/type of the light emitting element LD that can be used as the light source of the pixel PXL is not limited thereto.

The driving unit provides a signal (e.g., a predetermined signal) and a power source (e.g., a predetermined power source) to each pixel PXL through the line unit, and accordingly, the driving of the pixel PXL can be controlled. The driving unit may include a scan driver, an emission driver, a data driver, and a timing controller.

Figure 23:
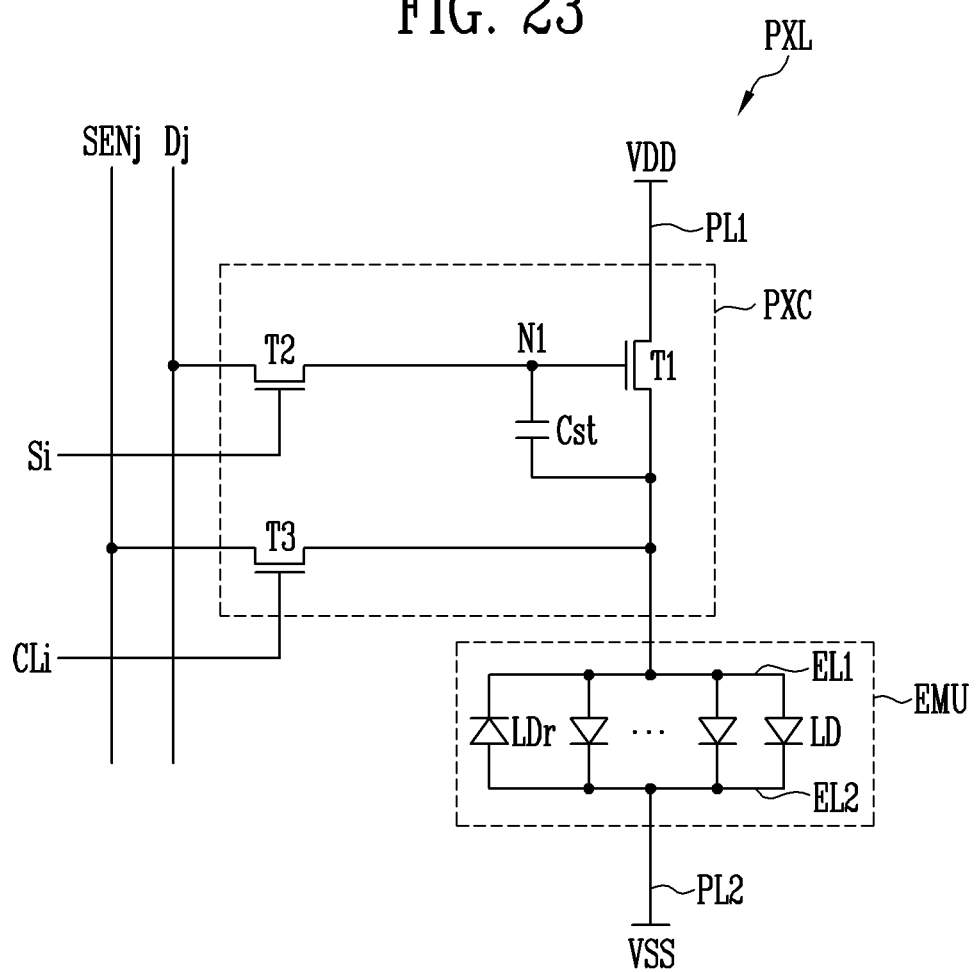
FIG. 23 is a circuit diagram illustrating an embodiment of an electrical connection relationship of components included in one pixel shown in FIG. 22.

FIG. 23 is a circuit diagram illustrating an embodiment of an electrical connection relationship of components included in one pixel PXL shown in FIG. 22.

For example, FIG. 23 illustrates an embodiment of an electrical connection relationship between components included in the pixel PXL applicable to an active display device. However, the kinds/types of the components included in the pixel PXL to which the embodiment of the present disclosure is applicable are not limited thereto.

In FIG. 23, the pixel PXL comprehensively includes not only components included in each of the pixels shown in FIG. 22 but also an area in which the components are provided.

Referring to FIGS. 1, 2, 22, and 23, one pixel PXL (hereinafter, referred to as a "pixel") may include a light emitting unit EMU that generates light with a luminance corresponding to a data signal. Also, the pixel PXL may selectively further include a pixel circuit PXC for driving the light emitting unit EMU.

In some embodiments, the light emitting unit EMU may include a plurality of light emitting elements LD connected in parallel between a first power line PL1 to which a voltage of a first driving power source VDD is applied and a second power line PL2 to which a voltage of a second driving power source VSS is applied. For example, the light emitting unit EMU may include a first electrode EL1 (or "first alignment electrode") connected to the first driving power source VDD via the pixel circuit PXC and the first power line PL1, a second electrode EL2 (or "second alignment electrode") connected to the second driving power source VSS through the second power line PL2, and a plurality of light emitting elements LD connected in parallel in the same direction between the first and second electrodes EU and EL2. In an embodiment of the present disclosure, the first electrode EL1 may be an anode electrode, and the second electrode EL2 may be a cathode electrode.

Each of the light emitting elements LD included in the light emitting unit EMU may include one end portion connected to the first driving power source VDD through the first electrode EU, the pixel circuit PXC, and the first power line PL1, and the other end portion connected to the second driving power source VSS through the second electrode EL2 and the second power line PL2. The first driving power source VDD and the second driving power source VSS may have different potentials. By way of example, the first driving power source VDD may be set as a high-potential power source, and the second driving power source VSS may be set as a low-potential power source. A potential difference between the first and second driving power sources VDD and VSS may be set to a threshold voltage of the light emitting elements LD during an emission period of the pixel PXL.

As described above, the light emitting elements LD connected in parallel in the same direction (e.g., a forward direction) between the first electrode EL1 and the second electrode EL2, to which voltages having different potentials are respectively supplied, may form effective light sources. The effective light sources may constitute the light emitting unit EMU of the pixel PXL.

The light emitting element LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU may emit light with a luminance corresponding to the driving current while each light emitting element LD is emitting light with a luminance corresponding to a current flowing therethrough.

Although an embodiment in which both the end portions of the light emitting elements LD that are connected in the same direction between the first and second driving power sources VDD and VSS has been illustrated, the present disclosure is not limited thereto. In some embodiments, the light emitting unit EMU may further include at least one ineffective light source, e.g., a reverse light emitting element LDr, in addition to the light emitting elements LD forming the respective effective light sources. The reverse light emitting element LDr is connected in parallel together with the light emitting elements LD forming the effective light sources between the first and second electrodes EL1 and EL2, and may be connected between the first and second electrodes EL1 and EL2 in a direction opposite to that in which the light emitting elements LD are connected. Although a driving voltage (e.g., a predetermined driving voltage) (e.g., a forward driving voltage) is applied between the first and second electrodes EL1 and EL2, the reverse light emitting element LDr maintains an inactive state, and accordingly, no current substantially flows through the reverse light emitting element LDr.

The pixel circuit PXC may be connected to a scan line Si and a data line Dj of a corresponding pixel PXL. By way of example, when assuming that a pixel PXL is disposed on an ith (i is a natural number) row and a jth (j is a natural number) column of the display area DA, the pixel circuit PXC of the pixel PXL may be connected to an ith scan line Si and a jth data line Dj of the display area DA. Also, the pixel circuit PXC may be connected to an ith control line CLi and a jth sensing line SENj of the display area DA.

The above-described pixel circuit PXC may include first to third transistors T1 to T3 and a storage capacitor Cst.

A first terminal of the first transistor T1 (e.g., a driving transistor) may be connected to the first driving power source VDD, and a second terminal of the first transistor T1 may be electrically connected to the first electrode EL1 of each of the light emitting elements LD. A gate electrode of the first transistor T1 may be connected to a first node N1. The first transistor T1 may control of an amount of driving current supplied to the light emitting elements LD, corresponding to a voltage of the first node N1.

A first terminal of the second transistor T2 (e.g., a switching transistor) may be connected to the jth data line Dj, and a second terminal of the second transistor T2 may be connected to the first node N1. The first terminal and the second terminal of the second transistor T2 are different terminals. For example, when the first terminal is a source electrode, the second terminal may be a drain electrode. In addition, a gate electrode of the second transistor T2 may be connected to the ith scan line Si.

The second transistor T2 is turned on when a scan signal having a voltage (e.g., a high-level voltage) at which the second transistor T2 can be turned on is supplied from the ith scan line Si, to electrically connect the jth data line Dj and the first node N1. A data signal of a corresponding frame is supplied to the jth data line Dj. Accordingly, the data signal is transferred to the first node N1. The data signal transferred to the first node N1 is charged in the storage capacitor Cst. In other words, the storage capacitor Cst may hold a charge corresponding to the data signal transferred to the first node N1.

The third transistor T3 may be connected between the first transistor T1 and the jth sensing line SENj. For example, a first terminal of the third transistor T3 may be connected to the second terminal (e.g., a source electrode) of the first transistor T1 connected to the first electrode EIJI, and a second terminal of the third transistor T3 may be connected to the jth sensing line SENj. A gate electrode of the third transistor T3 may be connected to the jth control line CLi. The third transistor T3 is turned on by a control signal having a gate-on voltage (e.g., a high-level voltage), which is supplied to the ith control line CLi during a sensing period (e.g., a predetermined sensing period), to electrically connect the jth sensing line SENj and the first transistor T1.

The sensing period may be a period in which characteristic information (e.g., a threshold voltage of the first transistor T1, etc.) of each of the pixels PXL arranged in the display area DA may be supplied to a circuit outside the pixel PXL.

One electrode of the storage capacitor Cst may be connected to the second terminal of the first transistor T1 or the first electrode EL1, and the other electrode of the storage capacitor Cst may be connected to the first node N1. The storage capacitor Cst may charge a voltage (or hold a charge) corresponding to the data signal supplied to the first node N1, and maintain the charged voltage until a data signal of a next frame is supplied.

Although an embodiment in which all the first to third transistors T1, T2, and T3 are N-type transistors is illustrated in FIG. 23, the present disclosure is not limited thereto. For example, at least one of the first to third transistors T1, T2, and T3 may be replaced with a P-type transistor. Also, although an embodiment in which the light emitting unit EMU is connected between the pixel circuit PXC and the second driving power source VSS is illustrated in FIG. 23, the light emitting unit EMU may be connected between the first driving power source VDD and the pixel circuit PXC.

The structure of the pixel circuit PXC may be variously modified and embodied. By way of example, the pixel circuit PXC may further include at least one transistor such as a transistor for initializing the first node N1 and/or a transistor for controlling an emission time of the light emitting elements LD, or other circuit elements such as a boosting capacitor for boosting the voltage of the first node N1.

Also, although an embodiment in which the light emitting elements LD constituting each light emitting unit EMU are all connected in parallel has been illustrated in FIG. 23, the present disclosure is not limited thereto. In some embodiments, the light emitting unit EMU may be configured to include at least one serial stage including a plurality of light emitting elements LD connected in parallel to each other. That is, the light emitting unit EMU may be configured in a series/parallel hybrid structure.

The structure of a pixel PXL applied to the present disclosure is not limited to the embodiment shown in FIG. 23, and the corresponding pixel PXL may have various structures. For example, each pixel PXL may be configured at the inside of a passive type light emitting display device, etc. The pixel circuit PXC may be omitted, and both the end portions of the light emitting elements LD included in the light emitting unit EMU may be directly connected to the ith scan line Si, the jth data line Dj, the first power line PL1 to which the first driving power source VDD is applied, the second power line PL2 to which the second driving power source VSS is applied, and/or a control line (e.g., a predetermined control line).

Figure 24:
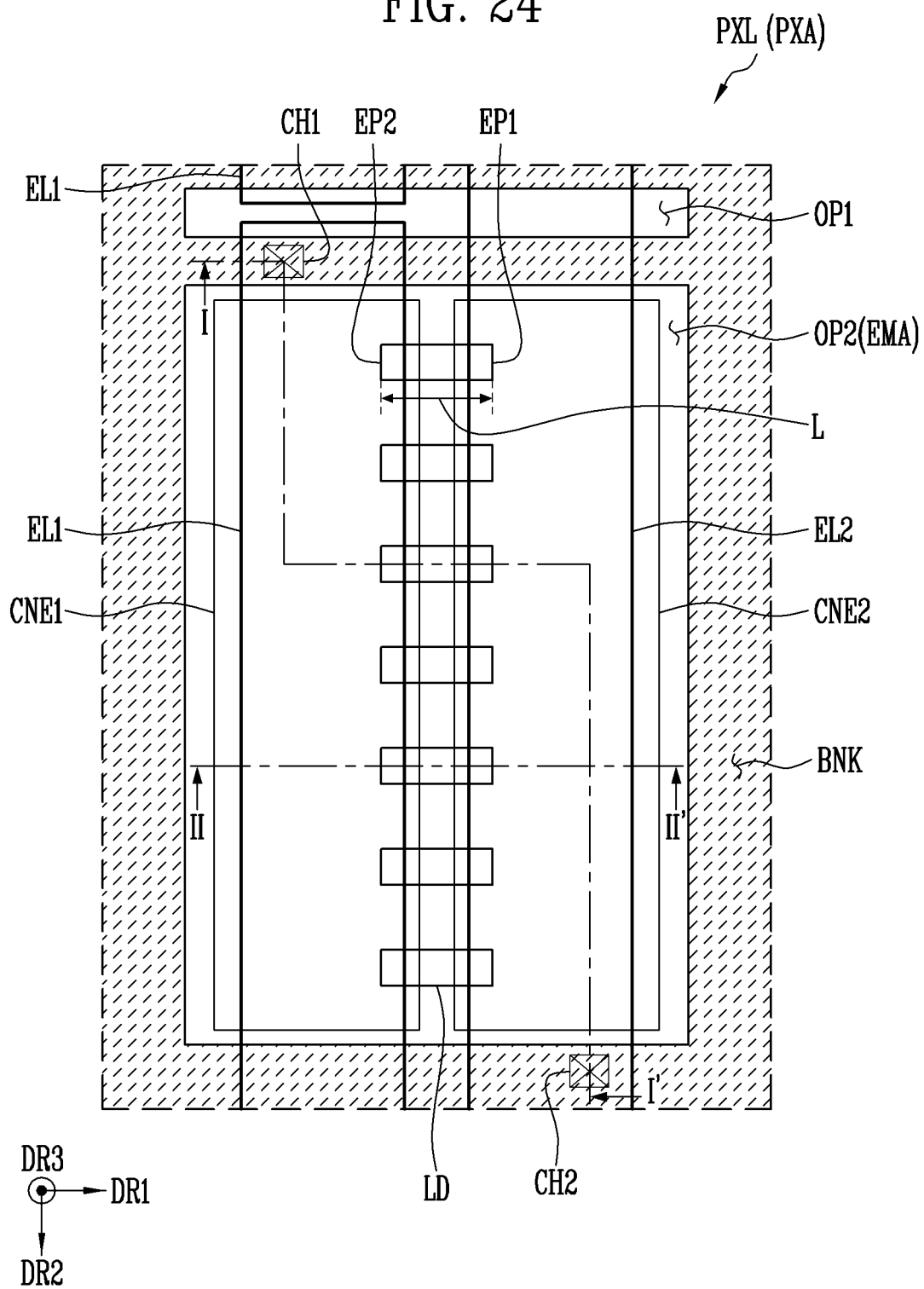
FIG. 24 is a schematic plan view illustrating one pixel from among the pixels shown in FIG. 22.

FIG. 24 is a schematic plan view illustrating one pixel PXL from among the pixels shown in FIG. 22.

In FIG. 24, illustration of transistors T electrically connected to light emitting elements LD and signal lines electrically connected to the transistors T is omitted for convenience of description.

In an embodiment of the present disclosure, for convenience of description, a lateral direction (or horizontal direction) on a plane is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may represent the directions DR1, DR2, and DR3 as shown on FIG. 24.

Referring to FIG. 24, each pixel PXL may be provided and/or formed in a pixel area PXA provided on a substrate (see "SUB" shown in FIG. 22). The pixel area PXA may include an emission area EMA and a peripheral area. In an embodiment, the peripheral circuit may include a non-emission area in which no light is emitted.

In some embodiments, each pixel PXL may include a bank BNK located in the peripheral area.

The bank BNK is a structure defining (or partitioning) a pixel area PXA or an emission area EMA of each of a corresponding pixel PXL and adjacent pixels PXL adjacent thereto. By way of example, the bank BNK may be a pixel defining layer. In an embodiment, in a process of supplying light emitting elements LD to each pixel PXL, the bank BNK may be a pixel defining layer or a dam structure that defines each emission area EMA to which the light emitting elements LD are to be supplied. By way of example, an emission area EMA of each pixel PXL is partitioned by the bank BNK, so that a mixed liquor (e.g., ink) including a desired amount and/or a desired kind of light emitting elements LD may be supplied (or input) to the emission area EMA.

The bank BNK includes at least one light blocking material and/or at least one reflective material, to prevent a light leakage defect in which light (or light beam) is leaked between each pixel PXL and pixels PXL adjacent thereto. In some embodiments, the bank BNK may include a transparent material (or substance). By way of example, the transparent material may include polyam ides resin, polyim ides resin, etc., but the present disclosure is not limited thereto. In another embodiment, a reflective material layer may be separately provided and/or formed on the bank BNK so as to further improve the efficiency of light emitted from each pixel PXL.

The bank BNK may include at least one opening exposing components located under the bank BNK in a pixel area PXA of a corresponding pixel PXL. By way of example, the bank BNK may include a first opening OP1 and a second opening OP2 that expose the components located under the bank BNK in the pixel area PXA of the corresponding pixel PXL. In an embodiment, the emission area EMA of each pixel PXL and the second opening OP2 of the bank BNK may correspond to each other.

In the pixel area PXA, the first opening OP1 of the bank BNK may be located to be spaced from the second opening OP2 along the second direction DR2, and may be located adjacent to one side (e.g., an upper side or lower side) of the pixel region PXA. By way of example, the first opening OP1 of the bank BNK may be located at the upper side of the pixel area PXA.

Each pixel PXL may include a first electrode EU and a second electrode EL2 that are spaced from each other along the first direction DR1. The first electrode EL1 may correspond to the first electrode EU described with reference to FIG. 23, and the second electrode EL2 may correspond to the second electrode EL2 described with reference to FIG. 23.

The first electrode EL1 may be separated from a first electrode provided in each of other pixels (e.g., adjacent pixels PXL adjacent to each other in the second direction DR2) after light emitting elements LD are supplied and arranged in the pixel area PXA in a manufacturing process of the display device. That is, the first opening OP1 of the bank BNK may be provided to perform a separation process on the first electrode EL1.

The first electrode EL1 may be electrically connected to the first transistor T1 described with reference to FIG. 23 through a first contact hole CH1, and the second electrode EL2 may be electrically connected to the second driving power source VSS (or the second power line PL2) described with reference to FIG. 23 via the contact hole CH2.

The first electrode EL1 and the second electrode EL2 may have a multi-layer structure including a reflective electrode and a conductive capping layer. In addition, the reflective electrode may have a single or multi-layer structure. By way of example, the reflective electrode may include at least one opaque metal layer, and selectively further include at least one transparent conductive layer disposed on the top and/or bottom of the opaque metal layer.

Each pixel PXL may have a plurality of light emitting elements LD. In some embodiments, each pixel PXL may further include the reverse light emitting element LDr described with reference to FIG. 23.

The light emitting elements LD may be disposed between the first electrode EL1 and the second electrode EL2. Each of the light emitting elements LD may include a first end portion EP1 (or one end portion) and a second end portion EP2 (or the other end portion) that are located at both ends in a length L direction thereof. In an embodiment, an n-type semiconductor layer may be located at the first end portion EP1, and an additional electrode (see "15" shown in FIG. 1) in ohmic contact with a p-type semiconductor layer may be located at the second end portion EP2. The p-type semiconductor layer may be the second semiconductor layer 13 described with reference to FIGS. 1 and 2, and the n-type semiconductor layer may be the first semiconductor layer 11 described with reference to FIGS. 1 and 2. The light emitting elements LD may be connected in parallel to each other between the first electrode EL1 and the second electrode EL2. Each of the light emitting elements LD may have the same configuration as the light emitting element LD described with reference to FIGS. 1 and 2 or 14A and 14B.

In an embodiment, the second end portion EP2 of each of the light emitting elements LD is not directly provided on the first electrode EL1, but may be electrically connected to the first electrode EL1 through at least one contact electrode, e.g., a first contact electrode CNE1. In addition, the first end portion EP1 of each of the light emitting elements LD is not directly provided on the second electrode EL2, but may be electrically connected to the second electrode EL2 through at least another contact electrode, e.g., a second contact electrode CNE2.

Each of the light emitting elements LD may be a light emitting diode having a micro scale size, e.g., a small size in a range of nanometer scale to micrometer scale, which is manufactured by using a material having an inorganic crystalline structure.

At least two light emitting elements LD to a few tens of light emitting elements LD may be aligned and/or provided in the emission area EMA of each pixel PXL, but a number of the light emitting elements LD is not limited thereto. In some embodiments, the number of the light emitting elements LD aligned and/or provided in the emission area EMA may be variously changed.

Each of the light emitting elements LD may emit any one of colored light and/or white light. Each of the light emitting elements LD may be aligned between the first electrode EL1 and the second electrode EL2 such that the extending direction (or the length L direction) thereof is parallel to the first direction DR1. The light emitting elements LD may be provided in a form in which the light emitting elements LD are sprayed in a solution, to be input (or supplied) to the emission area EMA of each pixel PXL.

The light emitting elements LD may be input (or supplied) to the emission area EMA of each pixel through an inkjet printing process, a slit coating process, or various processes. By way of example, the light emitting elements LD may be mixed with a volatile solvent, to be input (or supplied) to the emission area EMA through an inkjet printing process or a slit coating process. In case that a corresponding alignment signal is applied to the first electrode EL1 and the second electrode EL2, an electric field may be formed between the first electrode EU and the second electrode EL2. Therefore, the light emitting elements LD may be aligned between the first electrode EL1 and the second electrode EL2. After the light emitting elements LD are aligned, the solvent may be volatilized or be removed through another process, so that the light emitting elements LD can be stably aligned between the first electrode EU and the second electrode EL2.

In some embodiments, each pixel PXL may include the first contact electrode CNE1 and the second contact electrode CNE2.

The first contact electrode CNE1 may be provided and/or formed on the second end portion EP2 of each of the light emitting elements LD and one area of the first electrode EL1, which corresponds thereto, to physically and/or electrically connect the second end portion EP2 of each of the light emitting elements LD to the first electrode EL1. The first contact electrode CNE1 may be provided and/or formed on the first electrode EU, to overlap with the first electrode EL1. When viewed on a plane, the first contact electrode CNE1 may have a bar shape extending in the second direction DR2, but the present disclosure is not limited thereto. In some embodiments, the shape of the first contact electrode CNE1 may be variously modified within a range in which the first contact electrode CNE1 is electrically stably connected to each of the light emitting elements LD. Also, the shape of the first contact electrode CNE1 may be variously modified by considering a connection relationship between the first contact electrode CNE1 and the first electrode EU disposed thereunder.

The second contact electrode CNE2 may be provided and/or formed on the first end portion EP1 of each of the light emitting elements LD and one area of the second electrode EL2, which corresponds thereto, to physically and/or electrically connect the first end portion EP1 of each of the light emitting elements LD to the second electrode EL2. The second contact electrode CNE2 may be provided and/or formed on the second electrode EL2, to overlap with the second electrode EL2. When viewed on a plane, the second contact electrode CNE2 may have a bar shape extending in the second direction DR2, but the present disclosure is not limited thereto. In some embodiments, the shape of the second contact electrode CNE2 may be variously modified within a range in which the second contact electrode CNE2 is electrically stably connected to each of the light emitting elements LD. Also, the shape of the second contact electrode CNE2 may be variously modified by considering a connection relationship between the second contact electrode CNE2 and the second electrode EL2 disposed thereunder.

Hereinafter, a stacked structure of the pixel PXL in accordance with the above-described embodiment will be described with reference to FIGS. 25-27.

Figure 25:
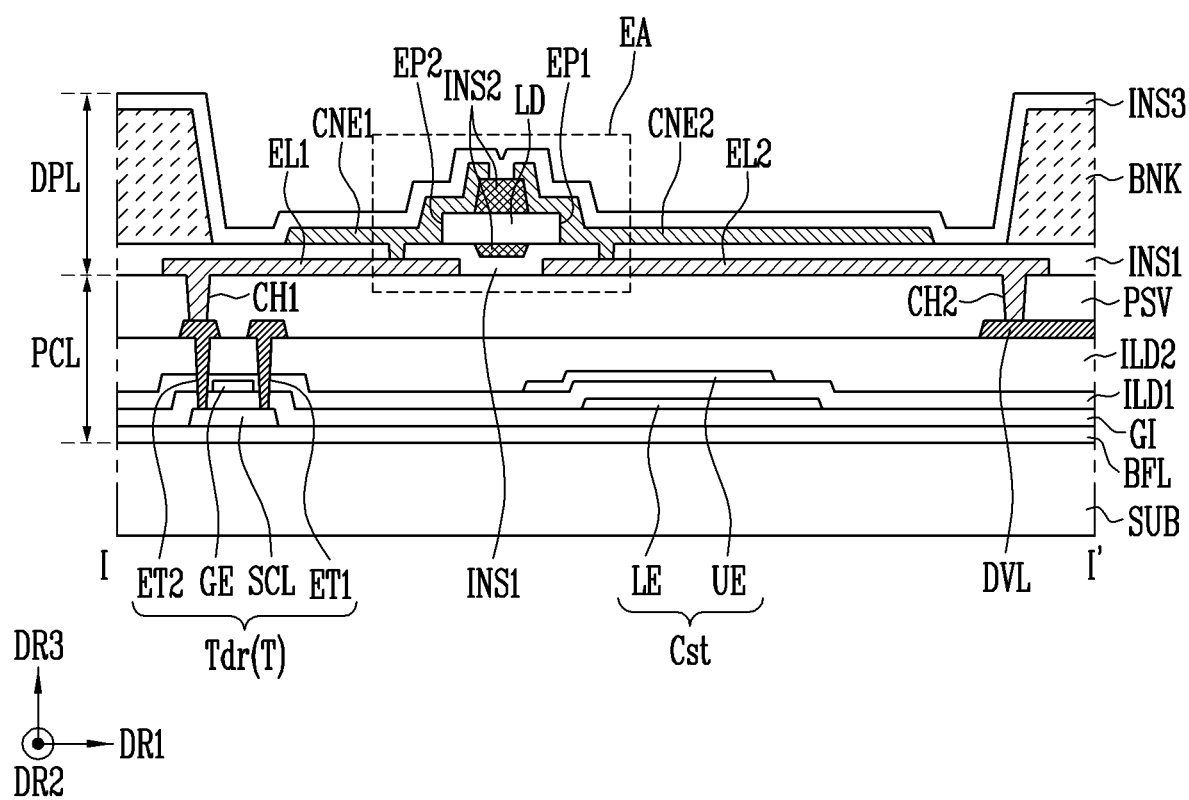
FIG. 25 is a schematic cross-sectional view taken along the line I-I' shown in FIG. 24.

FIG. 25 is a schematic cross-sectional view taken along the line I-I' shown in FIG. 24. FIG. 26 is a schematic enlarged sectional view of portion EA shown in FIG. FIG. 27 is a schematic cross-sectional view taken along the line II-II' shown in FIG. 24.

Figure 26:
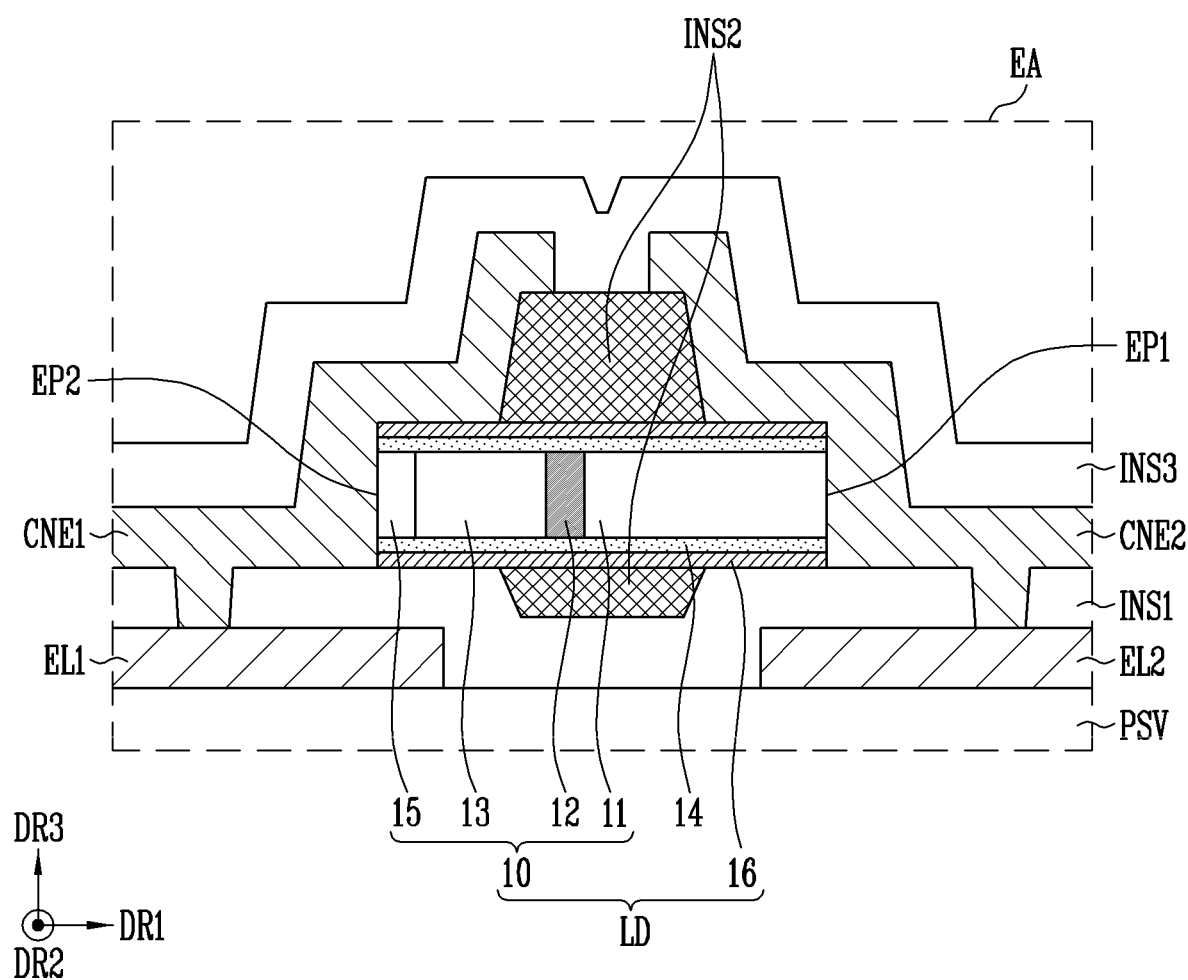
FIG. 26 is a schematic enlarged sectional view of portion EA shown in FIG.
Figure 27:
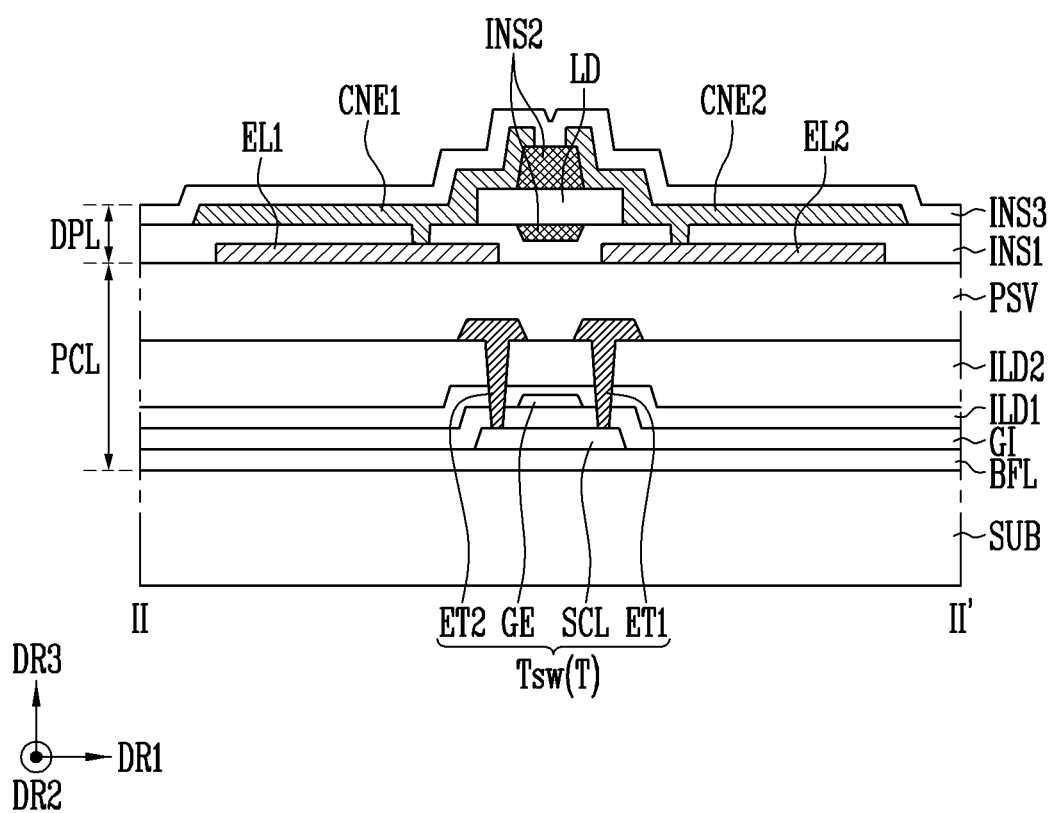
FIG. 27 is a schematic cross-sectional view taken along the line II-11' shown in FIG. 24.

In FIGS. 25-27, the one pixel PXL is simplified and illustrated, such as a case where each electrode is illustrated as only a single-layer electrode and a case where each insulating layer is illustrated as only a single-layer insulating layer. However, the present disclosure is not limited thereto.

Referring to FIGS. 24-27, the pixel PXL may include a substrate SUB, a pixel circuit layer PCL, and a display element layer DPL.

The substrate SUB may include a transparent insulating material to enable light to be transmitted therethrough. The substrate SUB may be a rigid substrate or a flexible substrate.

The rigid substrate may include, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, at least one transistor T, at least one storage capacitor Cst, and a passivation layer PSV.

The buffer layer BFL may prevent an impurity from being diffused into the transistor T included in the pixel circuit (see "PXC" shown in FIG. 23). The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, but be provided as a multi-layer including at least two layers. When the buffer layer BFL is provided as the multi-layer, the layers may be formed of the same material or be formed of different materials. The buffer layer BFL may be omitted according to the material and process conditions of the substrate SUB.

The transistor T may include a driving transistor Tdr for controlling a driving current of light emitting elements LD and a switching transistor Tsw electrically connected to the driving transistor Tdr. However, the present disclosure is not limited thereto, and the pixel circuit PXC may further include circuit elements for performing another function in addition to the driving transistor Tdr and the switching transistor Tsw. The driving transistor Tdr may be the first transistor T1 described with reference to FIG. 23, and the switching transistor Tsw may be the second transistor T2 described with reference to FIG. 23. In the following embodiment, when the driving transistor Tdr and the switching transistor Tsw are inclusively designated, each of the transistors or the transistors are referred to as a transistor T or transistors T.

Each of the driving transistor Tdr and the switching transistor Tsw may include a semiconductor pattern SCL, a gate electrode GE, a first terminal ET1, and a second terminal ET2. The first terminal ET1 may be any one of a source electrode and a drain electrode, and the second terminal ET2 may be the other one of the source electrode and the drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap with the gate electrode GE of the corresponding transistor T in the third direction DR3. The transistor semiconductor pattern SCL may be made of poly-silicon, amorphous silicon, oxide semiconductor, etc. The channel region is a semiconductor pattern undoped with an impurity, and may be an intrinsic semiconductor. Each of the first contact region and the second contact region may be a semiconductor pattern doped with an impurity.

The gate electrode GE may be provided and/or formed on a gate insulating layer GI to correspond to the channel region of the semiconductor pattern SCL. The gate insulating layer GI may be provided on the semiconductor pattern SCL and the buffer layer BFL. The gate electrode GE may be provided on the gate insulating layer GI to overlap with the channel region of the semiconductor pattern SCL in the third direction DR3. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layer structure including molybdenum (Mo), titanium (Ti), copper (Cu), aluminum (Al) or silver (Ag), which is a low-resistance material so as to decrease wiring resistance.

The gate insulating layer GI may be an inorganic insulating layer including an inorganic material. By way of example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In some embodiments, the gate insulating layer GI may be an organic insulating layer including an organic material. The gate insulating layer GI may be provided as a single layer, but be provided as a multi-layer including at least two layers.

The first terminal ET1 and the second terminal ET2 may be provided and/or formed on a second interlayer insulating layer ILD2, and may be respectively in contact with the first contact region and the second contact region of the semiconductor pattern SCL through contact holes sequentially penetrating a first interlayer insulating layer ILD1 and the second interlayer insulating layer ILD2. The first interlayer insulating layer ILD1 and the second interlayer insulating layer ILD2 may be sequentially disposed on the gate electrode GE and the gate insulating layer GI. By way of example, the first terminal ET1 may be in contact with the first contact region of the semiconductor pattern SCL, and the second terminal ET2 may be in contact with the second contact region of the semiconductor pattern SCL. Each of the first and second terminals ET1 and ET2 may include the same material as the gate electrode GE or may include at least one selected from the materials discussed as the material constituting the gate electrode GE.

The first interlayer insulating layer ILD1 may include the same material as the gate insulating layer GI or may include at least one selected from the materials discussed as the material constituting the gate insulating layer GI. The first interlayer insulating layer ILD1 may be disposed and/or formed on the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. In some embodiments, the second interlayer insulating layer ILD2 may include the same material as the first interlayer insulating layer ILD1, but the present disclosure is not limited thereto. The second interlayer insulating layer ILD2 may be provided as a single layer, but be provided as a multi-layer including at least two layers. In some embodiments, at least one of the first and second interlayer insulating layers ILD1 and ILD2 may be omitted.

In the above-described embodiment, it has been described that the first and second terminals ET1 and ET2 of the transistor T are separate electrodes electrically connected to the semiconductor pattern SCL through corresponding contact holes sequentially penetrating the gate insulating layer GI and the first and second interlayer insulating layers ILD1 and ILD2, but the present disclosure is not limited thereto. In some embodiments, the first terminal ET1 of the transistor T may be the first contact region adjacent to the channel region of the corresponding semiconductor pattern SCL, and the second terminal ET2 of the transistor T may be the second contact region adjacent to the channel region of the corresponding semiconductor pattern SCL. The second terminal ET2 of the transistor T may be electrically connected to the light emitting elements LD of the corresponding pixel PXL through a separate connection means such as a bridge electrode.

In an embodiment of the present disclosure, the transistors T may be implemented with a low temperature polycrystalline silicon (LTPS) thin film transistor (TFT), but the present disclosure is not limited thereto. In some embodiments, the transistors T may be implemented with an oxide semiconductor thin film transistor. Also, although a case where the transistors T are implemented with a thin film transistor having a top gate structure has been described in the above-described embodiment, the present disclosure is not limited thereto, and the structure of the transistors T may be variously modified.

The storage capacitor Cst may include a lower electrode LE provided on the gate insulating layer GI and an upper electrode UE provided on the first interlayer insulating layer ILD1 to overlap with the lower electrode LE in the third direction DR3.

The lower electrode LE may be provided at the same layer as the gate electrode GE of the driving transistor Tdr, and may include the same material as the gate electrode GE of the driving transistor Tdr. The lower electrode LE may be integrally provided with the gate electrode GE of the driving transistor Tdr. The lower electrode LE may be considered as one region of the driving transistor Tdr. In some embodiments, the lower electrode LE may be provided as a separate component from (or non-integrally with) the gate electrode GE of the driving transistor Tdr. The lower electrode LE and the gate electrode GE of the driving transistor Tdr may be electrically connected to each other through a separate connection means.

The upper electrode UE may overlap with the lower electrode LE in the third direction DR3, and cover the lower electrode LE in a plan view. The overlapping area of the upper electrode UE and the lower electrode LE are widened, so that the capacitance of the storage capacitor Cst may be increased. In some embodiments, the upper electrode UE may be electrically connected to a first power line. The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may be the same component as the second power line PL2 described with reference to FIG. 23. Accordingly, a voltage of the second driving power source VSS may be applied to the driving voltage line DVL. The pixel circuit layer PCL may further include the first power line PL1 connected to the first driving power source VDD. Although not directly shown in the drawings, the first power line PL1 may be provided at the same layer as the driving voltage line DVL or may be provided in a layer different from that of the driving voltage line DVL. Although a case where the driving voltage line is provided at the same layer as the first and second electrodes ET1 and ET2 of the transistors T has been described in the above-described embodiment, the present disclosure is not limited thereto. In some embodiments, the driving voltage line DVL may be provided at the same layer as any one conductive layer from among the conductive layers provided in the pixel circuit layer PCL. That is, the position of the driving voltage line DVL in the pixel circuit layer PCL may be variously changed.

The driving voltage line DVL may include a conductive material (or substance). By way of example, the driving voltage line DVL may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layer structure including molybdenum (Mo), titanium (Ti), copper (Cu), aluminum (Al) or silver (Ag), which is a low-resistance material so as to decrease wiring resistance. By way of example, the driving voltage line DVL may be configured as a double layer in which titanium (Ti)/copper (Cu) are sequentially stacked.

The first power line PL1 may be electrically connected to one component, e.g., a first electrode EL1 of the display element layer DPL, and the driving voltage line DVL may be electrically connected to another component, e.g., a second electrode EL2 of the display element layer DPL.

The passivation layer PSV may be provided and/or formed over the transistors T and the driving voltage line DVL.

The passivation PSV may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The passivation layer PSV may include a first contact hole CH1 exposing the second terminal ET2 of the driving transistor Tdr and a second contact hole CH2 exposing the driving voltage line DVL.

The display element layer DPL may be provided on the passivation layer PSV.

The display element layer DPL may include a bank BNK, the first and second electrodes EL1 and EL2, light emitting elements LD, first and second contact electrodes CNE1 and CNE2, and first to third insulating layers INS1 to INS3.

The bank BNK may be provided and/or formed on the first insulating layer INS1, and define (or partition) an emission area EMA of a corresponding pixel PXL. The bank BNK may include a first opening OP1 and a second opening OP2 spaced apart from the first opening OP1. The second opening OP2 of the bank BNK may correspond to the emission area EMA of each of the pixels PXL.

The first electrode EL1 and the second electrode EL2 may be disposed to be spaced from each other along the first direction DR1. An end portion of the first electrode EL1 may be located in the first opening OP1 of the bank BNK. The first electrode EU may be separated from a first electrode provided in another pixel PXL (e.g., a first electrode provided in adjacent pixels PXL adjacent to each other in the second direction DR2 when viewed on a plane) in the first opening after light emitting elements LD are supplied and arranged in the emission area EMA of the corresponding pixel PXL in a manufacturing process of the display device. The first opening OP1 of the bank BNK may be provided for the purpose of a separation process for the first electrode EL1.

In the above-described embodiment, although it has been described that only the first electrode EL1 is separated from another electrode in the first opening OP1 of the bank BNK, the present disclosure is not limited thereto. In some embodiments, the second electrode EL2 may also be separated from another electrode (e.g., a second electrode provided in adjacent pixels PXL adjacent in the second direction DR2) in the first opening OP1 of the bank BNK. The first opening OP1 of the bank BNK may be provided for the purpose of a separation process for the first electrode EL1 and the second electrode EL2.

Each of the first electrode EL1 and the second electrode EL2 may be made of a material having a constant reflectivity so as to allow light emitted from each of the light emitting elements LD to advance in an image display direction (or front direction) of the display device. By way of example, each of the first electrode EL1 and the second electrode EL2 may be made of a conductive material (or substance) having a constant reflectivity. The conductive material (or substance) may include an opaque metal suitable in reflecting lights emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the first electrode EL1 and the second electrode EL2 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylene-dioxythiophene) PEDOT, and the like. When each of the first electrode EL1 and the second electrode EL2 includes the transparent conductive material, a separate conductive layer may be additionally included, which is made of an opaque metal for reflecting lights emitted from the light emitting elements LD in the image display direction of the display device. However, the material of each of the first electrode EL1 and the second electrode EL2 is not limited to the above-described materials.

Also, each of the first electrode EL1 and the second electrode EL2 may be provided and/or formed as a single layer, but the present disclosure is not limited thereto. In some embodiments, each of the first electrode EL1 and the second electrode EL2 may be provided and/or formed as a multi-layer in which two or more materials from among metals, alloys, conductive oxides, and conductive polymers are stacked. Each of the first electrode EL1 and the second electrode EL2 may be provided as a multi-layer including at least two layers so as to reduce or minimize distortion caused by a signal delay when a signal (or voltage) is transferred to both end portions EP1 and EP2 of each of the light emitting elements LD. By way of example, each of the first electrode EL1 and the second electrode EL2 may be provided as a multi-layer in which indium tin oxide (ITO)/silver (Ag)/indium tin oxide (ITO) are sequentially stacked.

The first electrode EL1 may be electrically connected to the driving transistor Tdr of the pixel circuit layer PCL through the first contact hole CH1 of the passivation layer PSV, and the second electrode EL2 may be electrically connected to the driving voltage line DVL of the pixel circuit layer PCL through the second contact hole CH2 of the passivation layer PSV. The first and second electrodes EL1 and EL2 may be used as an alignment electrode for aligning light emitting element LD of each pixel PXL. Also, the first and second electrodes EU and EL2 may be used as a driving electrode for driving light emitting elements LD after the light emitting elements LD are aligned.

The first insulating layer INS1 may be provided and/or formed over the first electrode EL1 and the second electrode EL2.

The first insulating layer INS1 may include an inorganic insulating layer made of an inorganic material or an organic insulating layer made of an organic material. The first insulating layer INS1 may be configured as an inorganic insulating layer suitable for protecting the light emitting elements LD from the pixel circuit layer PCL of each pixel PXL. By way of example, the first insulating layer INS1 may include at least one of silicon oxide (SiO$_x$), silicon nitride (SiN$_x$), silicon oxynitride (SiO$_x$N$_y$), and metal oxide such as aluminum oxide (AlO$_x$), but the present disclosure is not limited thereto. In some embodiments, the first insulating layer INS1 may be configured as an organic insulating layer suitable for planarizing a supporting surface of the light emitting elements LD.

The first insulating layer INS1 may be provided and/or formed on the passivation layer PSV to entirely cover the first electrode EL1 and the second electrode EL2. After light emitting elements LD are supplied and aligned on the first insulating layer INS1, the first insulating layer INS1 may be partially opened to expose one region of each of the first and second electrodes EU and EL2 as shown in FIGS. 25-27.

The first insulating layer INS1 may be patterned in the shape of an individual pattern locally disposed on the bottom of the light emitting elements LD after the light emitting elements are supplied and aligned. The first insulating layer INS1 may cover the other regions except the one region of each of the first and second electrodes EL1 and EL2. In some embodiments, the first insulating layer INS1 may be omitted.

The bank BNK may be provided and/or formed on the first insulating layer INS1. The bank BNK may be formed between other pixels PXL (e.g., between two adjacent pixels PXL) to surround the emission area EMA of each pixel PXL. Therefore, the bank BNK may constitute a pixel defining layer partitioning the emission area EMA of the corresponding pixel PXL. The bank BNK may serve as a dam structure which prevent a solution in which light emitting elements LD are mixed from being introduced to an emission area EMA of an adjacent pixel PXL or controls a constant amount of solution to be supplied to each emission area EMA, in a process of supplying the light emitting elements LD to the emission area EMA.

Light emitting elements LD may be supplied and aligned in the emission area EMA of each pixel PXL, in which the first insulating layer INS1 is formed. By way of example, the light emitting elements LD are supplied (or input) to the emission area EMA through an inkjet process or the like, and may be aligned between the first electrode EL1 and the second electrode EL2 by an alignment voltage (e.g., a predetermined alignment voltage) (or alignment signal) applied to each of the first electrode EL1 and the second electrode EL2.

Each of the light emitting elements LD may include a first end portion EP1 and a second end portion EP2 that are located in the length L direction parallel to the first direction DR1. Each of the light emitting elements LD may include a light emitting stack pattern 10 and an insulating film 14 surrounding an outer surface (e.g., an outer circumferential surface or an outer peripheral surface) (or surface) of the light emitting stack pattern 10. In some embodiments, each of the light emitting elements LD may include a light emitting stack pattern 10, an insulating film 14 surrounding an outer surface (e.g., an outer circumferential surface or an outer peripheral surface) (or surface) of the light emitting stack pattern 10, and a protective film 16 surrounding an outer surface (e.g., an outer circumferential surface or an outer peripheral surface) (or surface) of the insulating film 14.

The light emitting stack pattern 10 may include a first semiconductor layer 11, an active layer 12, a second semiconductor layer 13, and an additional electrode that are sequentially stacked in a direction toward the second end portion EP2 from the first end portion EP1 along a length L direction of a corresponding light emitting element LD that is parallel to the first direction DR1. In an embodiment, the first semiconductor layer 11 may include an n-type semi-conductor layer doped with an n-type dopant, and the second semiconductor layer 13 may include a p-type semiconductor layer doped with a p-type dopant.

The second insulating layer INS2 may be provided and/or formed on each of the light emitting elements LD. The second insulating layer INS2 may be provided and/or formed on light emitting elements LD aligned between the first electrode EL1 and the second electrode EL2 to partially cover an outer surface (e.g., an outer circumferential surface or an outer peripheral surface) (or surface) of each of the light emitting elements LD, and expose the first end portion EP1 and the second end portion EP2 of each of the light emitting elements LD to the outside.

The second insulating layer INS2 may be configured as a single layer or a multi-layer, and include an inorganic insulating layer including at least one inorganic material or an organic insulating layer including at least one organic material. The second insulating layer INS2 may include an inorganic insulating layer suitable for protecting the active layer 12 of each of the light emitting elements LD from external oxygen, moisture, and the like. However, the present disclosure is not limited thereto. The second insulating layer INS2 may be configured as an organic insulating layer including an organic material according to design conditions of the display device to which the light emitting elements LD are applied. After alignment of light emitting elements LD in the pixel area PXA of each of the pixels PXL is completed, the second insulating layer INS2 is formed on the light emitting elements LD, so that the light emitting elements LD can be prevented from being separated from positions at which the light emitting elements LD are aligned.

When an empty gap (or space) exists between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured as an organic insulating layer suitable for filling the empty gap between the first insulating layer INS1 and the light emitting elements LD.

The first contact electrode CNE1 that is electrically and/or physically stably connects the first electrode EL1 to one of the first and second end portions EP1 and EP2 of each of the light emitting elements LD, e.g., the second end portion EP2, may be provided and/or formed on the first electrode EL1.

The first contact electrode CNE1 may be provided and/or formed on the first electrode EU and the second end portion EP2 of each of the light emitting elements LD. The first contact electrode CNE1 may be disposed to be in contact with the first electrode EL1 on one region of the first electrode EU that is not covered by the first insulating layer INS1. In some embodiments, when a conductive capping layer is disposed on the first electrode EL1, the first contact electrode CNE1 may be disposed on the conductive capping layer to be connected to the first electrode EL1 through the conductive capping layer. The conductive capping layer may protect the first electrode EL1 from a failure occurring in a manufacturing process of the display device, and further reinforce adhesion between the first electrode EL1 and the pixel circuit layer PCL located on the bottom thereof. The conductive capping layer may include a transparent conductive material (or substance) such as indium zinc oxide (IZO).

Also, the first contact electrode CNE1 may be disposed on the second end portion EP2 of each of light emitting elements LD adjacent to the first electrode EL1 to be in contact with the second end portion EP2 of each of the light emitting elements LD. That is, the first contact electrode CNE1 may be disposed to cover the second end portion EP2 of each of the light emitting elements LD and at least one region of the first electrode EL1, which corresponds thereto.

The second contact electrode CNE2 that is electrically and/or physically stably connects the second electrode EL2 to the other one of the first and second end portions EP1 and EP2 of each of the light emitting elements LD, e.g., the first end portion EP1, may be provided and/or formed on the second electrode EL2.

The second contact electrode CNE2 may be provided and/or formed on the second electrode EL2 and the first end portion EP1 of each of the light emitting elements LD. The second contact electrode CNE2 may be disposed on one region of the second electrode EL2 that is not covered by the first insulating layer INS1, to be in contact with the second electrode EL2. In some embodiments, when a conductive capping layer is disposed on the second electrode EL2, the second contact electrode CNE2 may be disposed on the conductive capping layer to be connected to the second electrode EL2 through the conductive capping layer.

Also, the second contact electrode CNE2 may be disposed on the first end portion EP1 of each of light emitting elements LD adjacent to the second electrode EL2 to be in contact with the first end portion EP1 of each of the light emitting elements LD. That is, the second contact electrode CNE2 may be disposed to cover the first end portion EP1 of each of the light emitting elements LD and at least one region of the second electrode EL2, which corresponds thereto.

The first and second contact electrodes CNE1 and CNE2 may be made of various transparent conductive materials (or substances) so as to allow light that is emitted from each of the light emitting elements LD and then reflected by the first and second electrodes EL1 and EL2 to advance in the image display direction of the display device without loss of light. By way of example, the first and second contact electrodes CNE1 and CNE2 may include at least one of various transparent conductive materials (or substances) including indium tin oxide (ITO), indium zinc oxide (IZO), zinc oxide (ZnO), indium gallium zinc oxide (IGZO), and indium tin zinc oxide (ITZO), and may be substantially transparent or translucent to satisfy a desired transmittance (e.g., a set or predetermined transmittance) (or transmittancy). However, the material of the first and second contact electrodes CNE1 and CNE2 is not limited to the above-described embodiment. In some embodiments, the first and second contact electrodes CNE1 and CNE2 may be made of various opaque conductive materials. The first and second contact electrodes CNE1 and CNE2 may be formed as a single layer or a multi-layer.

The first contact electrode CNE1 and the second contact electrode CNE2 may be disposed to be spaced from each other in the first direction DR1. By way of example, the first contact electrode CNE1 and the second contact electrode CNE2 may be disposed on the second insulating layer INS2 of the light emitting elements LD to be spaced apart from each other at a certain distance.

The first contact electrode CNE1 and the second contact electrode CNE2 may be provided at the same layer. The first contact electrode CNE1 and the second contact electrode CNE2 may be formed of the same conductive material through the same process, but the present disclosure is not limited thereto. In some embodiments, the first contact electrode CNE1 and the second contact electrode CNE2 may be formed in different processes to be provided in different layers. This will be described later with reference to FIG. 31.

The third insulating layer INS3 may be provided and/or formed over the first contact electrode CNE1 and the second contact electrode CNE2 and/or the bank BNK. The third insulating layer INS3 may be an inorganic insulating layer including an inorganic material or an organic insulating layer including an organic material. By way of example, the third insulating layer INS3 may have a structure in which at least one inorganic insulating layer and at least one organic insulating layer are alternately stacked. The third insulating layer INS3 may entirely cover the display element layer DPL to block moisture, humidity or the like from the outside from being introduced to the display element layer DPL including the light emitting elements LD.

In some embodiments, the display element layer DPL may selectively further include an optical layer in addition to the third insulating layer. By way of example, the display element layer DPL may further include a color conversion layer including color conversion particles for converting light emitted from the light emitting elements LD into light of a desired color.

In other embodiments, at least one overcoat layer (e.g., a layer planarizing a top surface of the display element layer DPL) may be further disposed on the top of the third insulating layer INS3.

In some embodiments, the light emitting stack pattern 10 of each light emitting element LD may include a first semiconductor layer 11, an active layer 12, a second semiconductor layer 13, and an additional electrode 15, that are sequentially stacked toward the second end portion EP2 from the first end portion EP1 along a length L direction of the corresponding light emitting element LD. In an embodiment, the additional electrode 15 may be made of a transparent conductive material having a desired transmittance.

Each light emitting element LD may include an insulating film 14 surrounding an outer surface (e.g., an outer circumferential surface or an outer peripheral surface) (or surface) of the above-described light emitting stack pattern 10 and a protective film 16 surrounding an outer surface (e.g., an outer circumferential surface or an outer peripheral surface) (or surface) of the insulating film 14.

In an embodiment, the insulating film 14 may be a zinc oxide (ZnO) thin film layer doped with a Group III transition metal, and may be provided and/or formed on the outer surface (e.g., an outer circumferential surface or an outer peripheral surface) (or surface) of the light emitting stack pattern 10 by using a wet chemical process or the like. The insulating film 14 may be in direct contact with the outer surface (e.g., an outer circumferential surface or an outer peripheral surface) (or surface) of the light emitting stack pattern 10.

The protective film 16 may include an inorganic insulating material, and be provided and/or formed on the outer surface (e.g., an outer circumferential surface or an outer peripheral surface) (or surface) of the insulating film 14. The protective film 16 may be in direct contact with the outer surface (e.g., an outer circumferential surface or an outer peripheral surface) (or surface) of the insulating film 14.

Each of the insulating film 14 and the protective film 16 may expose a portion of each of the first semiconductor layer 11 located at the first end portion EP1 of the light emitting stack pattern 10 and the additional electrode 15 located at the second end portion EP2 of the light emitting stack pattern 10. The first end portion EP1 and the second end portion EP2 may have different polarities.

When the insulating film 14 configured as a zinc oxide (ZnO) thin film layer is located on the outer surface (e.g., an outer circumferential surface or an outer peripheral surface) (or surface) of the light emitting stack pattern 10, a surface defect of the light emitting stack pattern 10 may be decreased due to a material characteristic of the insulating film 14. For example, although a defect portion such as a vacancy exists at the surface of the light emitting stack pattern 10 in a manufacturing process of the light emitting stack pattern 10, a surface defect concentration is decreased or the defect portion is protected due to the material characteristic of zinc oxide (ZnO) constituting the insulating film 14, so that the surface defect of the light emitting stack pattern 10 may be reduced or minimized. Further, when the protective film 16 made of an inorganic insulating material is located on the outer surface (e.g., an outer circumferential surface or an outer peripheral surface) (or surface) of the insulating film 14 located on the outer surface (e.g., an outer circumferential surface or an outer peripheral surface) (or surface) of the light emitting stack pattern 10, the active layer 12 of the light emitting stack pattern 10 may be further prevented from being short-circuited with the first and second contact electrodes CNE and CNE2. Accordingly, the electrical stability of the light emitting element LD may be further ensured.

Figure 28:
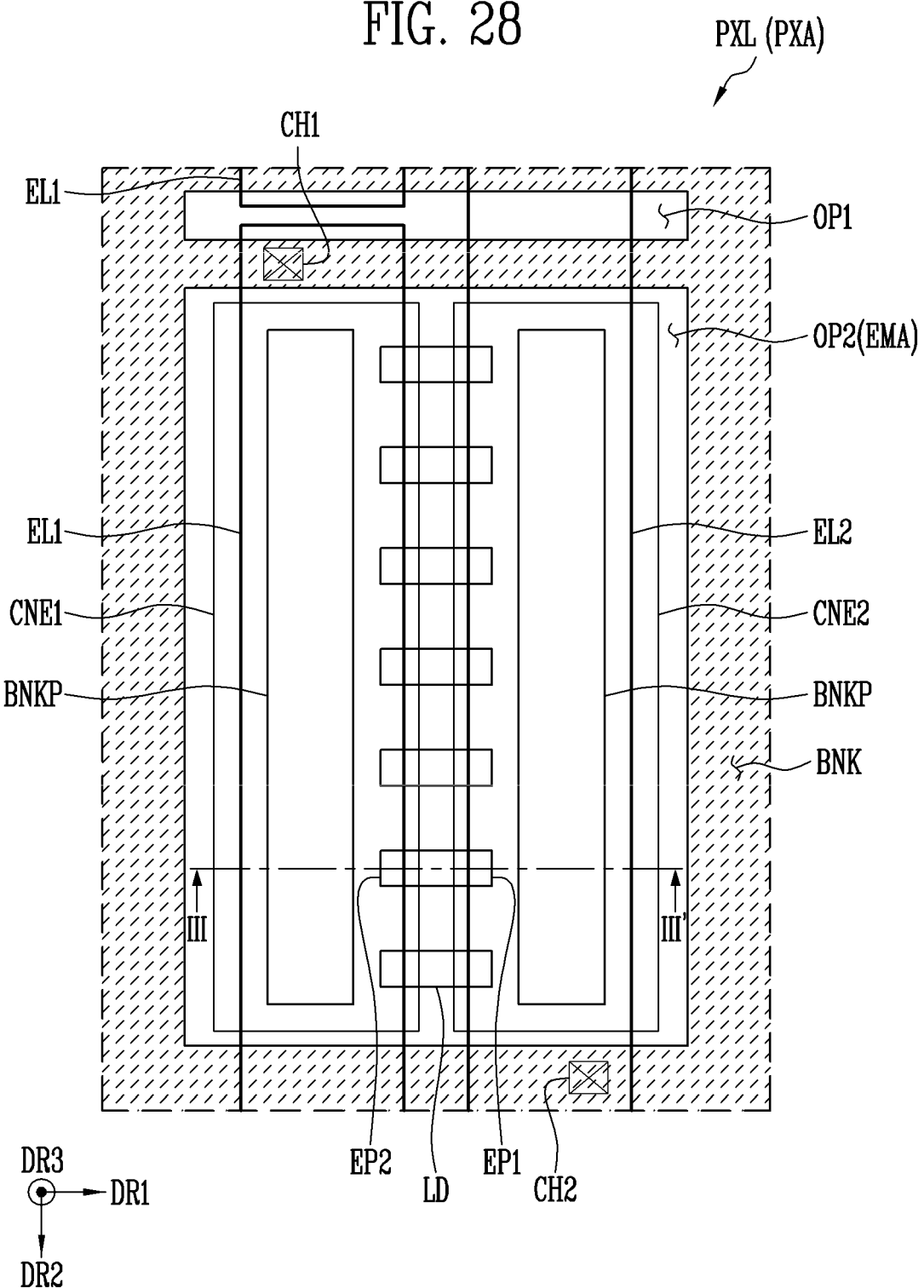
FIG. 28 is a schematic plan view illustrating a pixel in accordance with another embodiment of the present disclosure.
Figure 29:
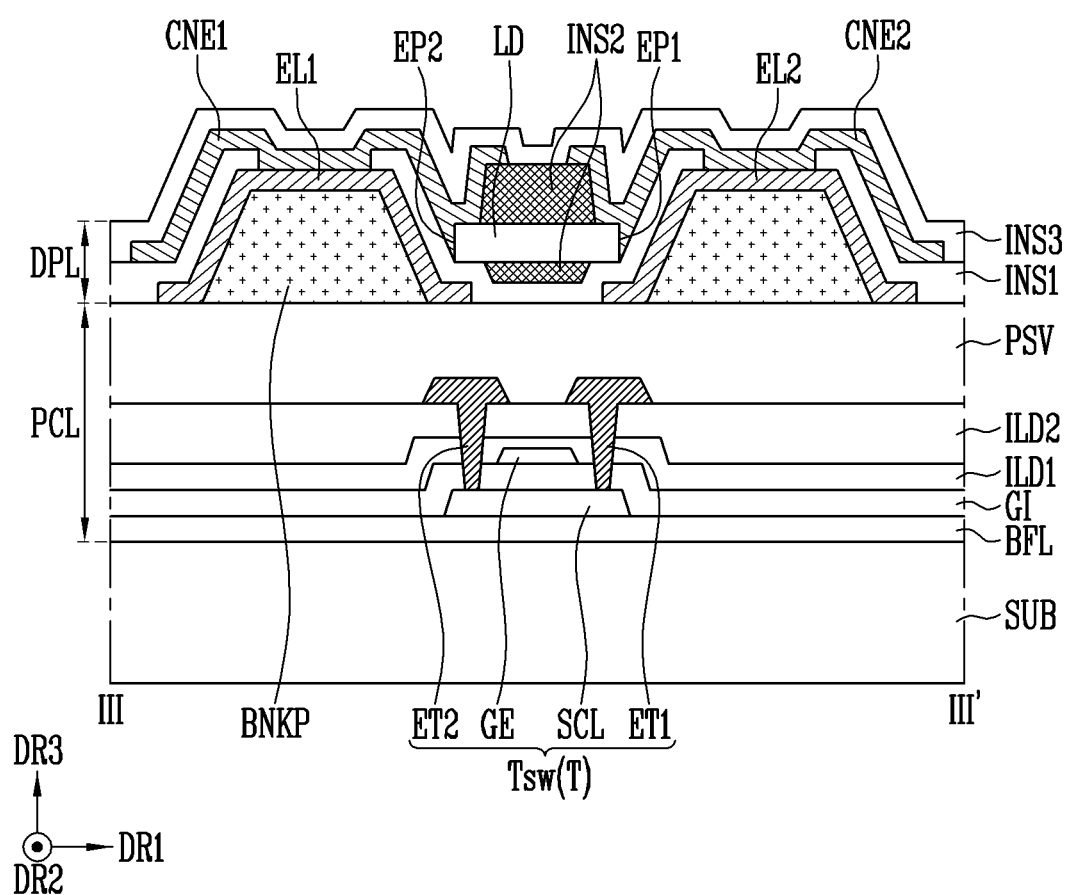
FIG. 29 is a schematic cross-sectional view taken along the line III-III' shown in FIG. 28.
Figure 30:
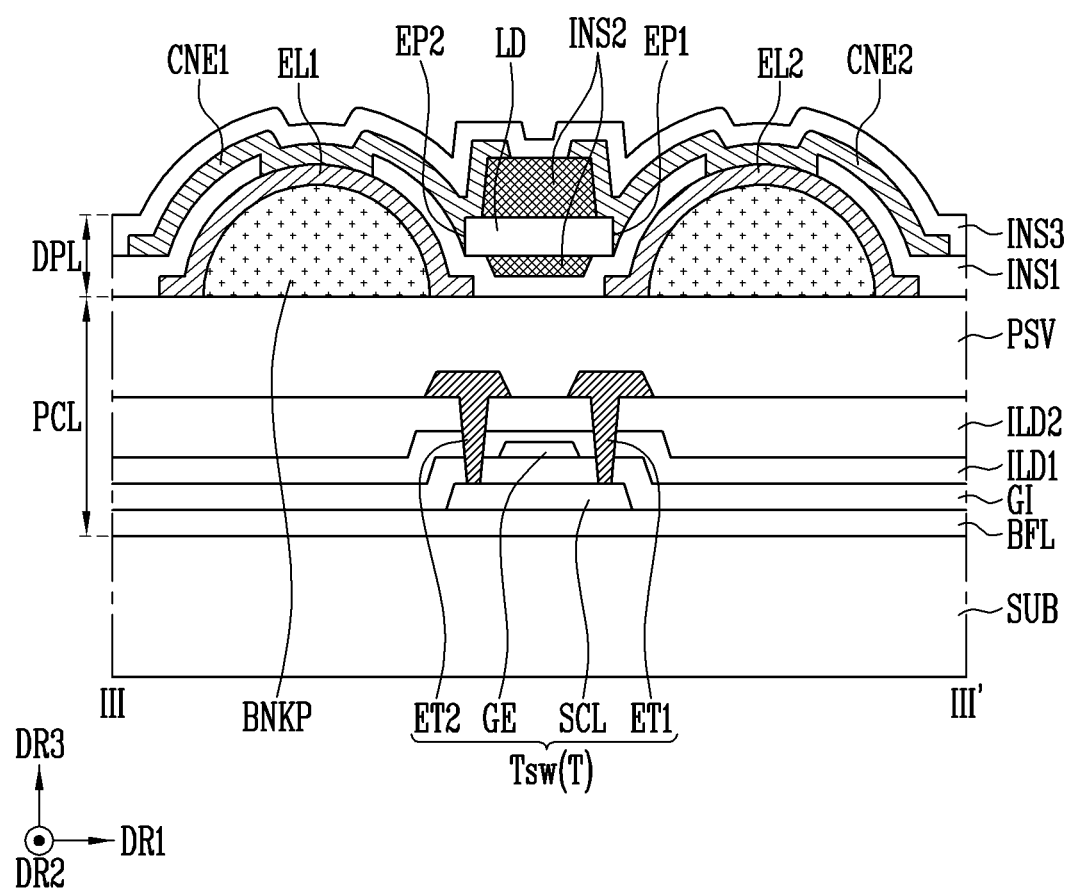
FIG. 30 illustrates a bank pattern implemented in accordance with an embodiment of the present disclosure, and is a schematic cross-sectional view corresponding to the line III-III' shown in FIG. 28.
Figure 31:
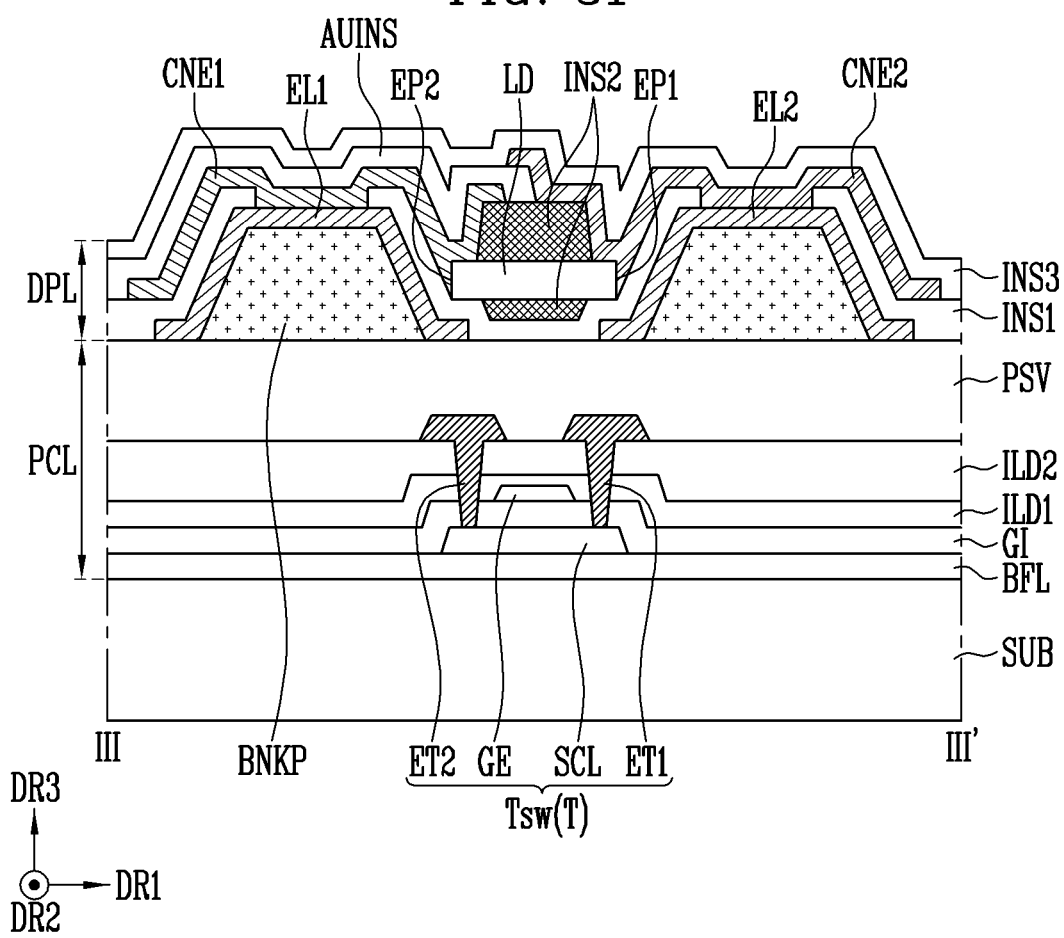
FIG. 31 illustrates first and second contact electrodes in accordance with another embodiment of the present disclosure, and is a schematic cross-sectional view corresponding to the line III-III' shown in FIG. 28.

FIG. 28 is a schematic plan view illustrating a pixel PXL in accordance with an embodiment of the present disclosure. FIG. 29 is a schematic cross-sectional view taken along the line III-III' shown in FIG. 28. FIG. 30 illustrates a bank pattern BNKP implemented in accordance with an embodiment of the present disclosure, and is a schematic cross-sectional view corresponding to the line III-III' shown in FIG. 28. FIG. 31 illustrates first and second contact electrodes CNE1 and CNE2 in accordance with an embodiment of the present disclosure, and is a schematic cross-sectional view corresponding to the line III-III' shown in FIG. 28.

The pixel PXL shown in FIGS. 28-31 may have a configuration substantially identical or similar to the pixel shown in FIGS. 24-27, except that bank patterns BNKP are respectively disposed between a passivation layer PSV and first and second electrodes EL1 and EL2.

Accordingly, in relation to the pixel shown in FIGS. 28-31, portions different from those of the above-described embodiment will be mainly described to avoid redundancy.

Referring to FIGS. 28-31, a supporting member (or pattern) may be located between each of the first and second electrodes EL1 and EL2 and the passivation layer PSV. By way of example, as shown in FIGS. 29-31, a bank pattern BNKP (or pattern) may be located between each of the first and second electrodes EL1 and EL2 and the passivation layer PSV.

The bank pattern BNKP may be located in an emission area EMA in which light is emitted in a pixel area PXA of each pixel PXL. The bank pattern BNKP may be a supporting member for supporting each of the first and second electrodes EL1 and EL2 to change a surface profile (or shape) of each of the first and second electrode EL1 and EL2 such that light emitted from light emitting elements LD is guided in the image display direction of the display device.

The bank pattern BNKP may be provided between the passivation layer PSV and the first and second electrodes EL1 and EL2 in an emission area EMA of a corresponding pixel PXL.

The bank pattern BNKP may be an inorganic insulating layer including an inorganic material or an organic insulating layer including an organic material. In some embodiments, the bank pattern BNKP may include a single-layer organic insulating layer and/or a single-layer inorganic insulating layer, but the present disclosure is not limited thereto. In some embodiments, the bank pattern BNKP may be provided in the form of a multi-layer in which at least one organic insulating layer and at least one inorganic insulating layer are stacked. However, the material of the bank pattern BNKP is not limited to the above-described embodiment. In some embodiments, the bank pattern BNKP may include a conductive material.

The bank pattern BNKP may have a section having a trapezoidal shape of which width becomes narrower toward the top thereof along the third direction DR3 from one surface (e.g., an upper surface) of the passivation layer PSV, but the present disclosure is not limited thereto. In some embodiments, as shown in FIG. 30, the bank pattern BNKP may include a curved surface having a section of a semi-elliptical shape, a semicircular shape (or hemispherical shape), or the like, of which width becomes narrower toward the top thereof along the third direction DR3 from one surface of the passivation layer PSV. When viewed on a section, the shape of the bank pattern BNKP is not limited to the above-described embodiments, and may be variously changed within a range in which the efficiency of light emitted from each of the light emitting elements LD may be improved.

Each of the first and second electrodes EL1 and EL2 may be provided and/or formed on a corresponding bank pattern BNKP. Each of the first and second electrodes EU and EL2 may have a surface profile corresponding to the shape of the bank pattern BNKP disposed on the bottom thereof, when viewed on a section. Accordingly, light emitted from the light emitting elements LD is reflected by each of the first and second electrodes EU and EL2, to further advance in the image display direction of the display device. Each of the bank pattern BNKP and the first and second electrodes EL1 and EL2 may be used as a reflective member for improving the light efficiency of the display device by guiding light emitted from the light emitting elements LD in a desired direction. Accordingly, the light emission efficiency of the light emitting elements LD may be further improved.

A first contact electrode CNE1 and a second contact electrode CNE2 may be disposed to be spaced from each other along the first direction DR1 when viewed on a plane. By way of example, the first contact electrode CNE1 and the second contact electrode CNE2 may be disposed on a second insulating layer INS2 on the light emitting elements LD to be spaced from each other at a certain distance. The first contact electrode CNE1 and the second contact electrode CNE2 may be provided at the same layer, and may be formed through the same process. However, the present disclosure is not limited thereto. In some embodiments, the first and second contact electrodes CNE1 and CNE2 may be provided at different layers, and may be formed through different processes. As shown in FIG. 31, an additional insulating layer AUINS may be provided and/or formed between the first contact electrode CNE1 and the second contact electrode CNE2. The additional insulating layer AUINS may be provided on the first contact electrode CNE1 such that the first contact electrode CNE1 is not exposed to the outside, thereby preventing corrosion of the first contact electrode CNE1. The additional insulating layer AUINS may include an inorganic insulating layer made of an inorganic material or an organic insulating layer made of an organic material. By way of example, the additional insulating layer AUINS may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. Also, the additional insulating layer AUINS may be formed as a single layer or a multi-layer.

A third insulating layer INS3 may be provided and/or formed over the first and second contact electrodes CNE1 and CNE2. The third insulating layer INS3 may be an inorganic insulating layer including an inorganic material or an organic insulating layer including an organic material. By way of example, the third insulating layer INS3 may have a structure in which at least one inorganic insulating layer and at least one organic insulating layer are alternately stacked. The third insulating INS3 may entirely cover a display element layer DPL, to block moisture, humidity or the like from the outside from being introduced to the display element layer DPL including the light emitting elements LD. In some embodiments, at least one overcoat layer (e.g., a layer for planarizing a top surface of the display element layer DPL) may be further disposed on the top of the third insulating layer INS3.

In accordance with the present disclosure, an insulating film configured as a zinc oxide (ZnO) thin film layer is formed on an outer surface (e.g., an outer circumferential surface or an outer peripheral surface) (or surface) of a light emitting stack pattern by using a wet chemical process, so that a surface defect of a light emitting element can be effectively controlled, thereby improving the lifetime and efficiency of the light emitting element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present disclosure, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A light emitting element comprising:
    a light emitting stack pattern comprising a first semiconductor layer, an active layer, and a second semiconductor layer that are sequentially stacked along one direction; and
    an insulating film surrounding an outer surface of at least one of the first semiconductor layer, the active layer, and the second semiconductor layer,
    wherein the insulating film comprises a zinc oxide (ZnO) thin film layer, and
    wherein the insulating film is doped with at least one of Group III transition metals including yttrium (Y), scandium (Sc), lanthanum (La), actinium (Ac), lutetium (Lu), and lawrencium (Lr).

2. The light emitting element of claim 1,
    wherein the insulating film is directly located on the outer surface of each of the first semiconductor layer, the active layer, and the second semiconductor layer.

3. The light emitting element of claim 2, wherein the first semiconductor layer comprises an n-type semiconductor layer doped with an n-type dopant, and the second semiconductor layer comprises a p-type semiconductor layer doped with a p-type dopant.

4. The light emitting element of claim 1,
    further comprising a protective film surrounding an outer surface of the insulating film.

5. The light emitting element of claim 4, wherein the protective film comprises an inorganic material.

6. The light emitting element of claim 5, wherein the inorganic material comprises at least one of $SiO_x$, $SiN_x$, $SiO_xN_y$, $AlO_x$, $AlN_x$, $ZrO_x$, $HfO_x$, and $TiO_x$.

7. The light emitting element of claim 5, further comprising an additional protective film surrounding an outer surface of the protective film, wherein the additional protective film comprises a same material as the protective film.

8. The light emitting element of claim 1,
further comprising a protective film located between the light emitting stack pattern and the insulating film, the protective film surrounding an outer surface of the light emitting stack pattern,
wherein the protective film comprises an inorganic material.

9. The light emitting element of claim 8, further comprising an additional protective film surrounding an outer surface of the insulating film, wherein the additional protective film comprises a same material as the protective film.

10. The light emitting element of claim 8, further comprising an additional protective film located between the protective film and the insulating film, the additional protective film surrounding an outer surface of the protective film, wherein the additional protective film comprises a same material as the protective film.

11. The light emitting element of claim 10, wherein the insulating film entirely surrounds an outer surface of the additional protective film.

12. The light emitting element of claim 1,
wherein the insulating film comprises a first insulating film surrounding an outer surface of the light emitting stack pattern and a second insulating film surrounding an outer surface of the first insulating film, and
wherein the first insulating film and the second insulating film comprise a same material.

13. The light emitting element of claim 12, further comprising a protective film located between the first insulating film and the second insulating film, the protective film surrounding the outer surface of the first insulating film,
wherein the protective film comprises an inorganic material.

14. A display device comprising:
a substrate;
a first electrode and a second electrode, spaced from each other along a first direction on one surface of the substrate, the first electrode and the second electrode extending in a second direction different from the first direction; and
a plurality of light emitting elements located between the first electrode and the second electrode, each of the plurality of light emitting elements comprising one end portion electrically connected to the first electrode and the other end portion electrically connected to the second electrode,
wherein each of the light emitting elements comprises:
a first semiconductor layer;
an active layer on the first semiconductor layer;
a second semiconductor layer on the active layer; and
an insulating film surrounding an outer surface of at least one of the first semiconductor layer, the active layer, and the second semiconductor layer, and
wherein the insulating film comprises a zinc oxide (ZnO) thin film layer doped with at least one of Group III transition metals including yttrium (Y), scandium (Sc), lanthanum (La), actinium (Ac), lutetium (Lu) ruthenium (Ru), and lawrencium (Lr).

15. The display device of claim 14, wherein each of the light emitting elements further comprises a protective film surrounding an outer surface of the insulating film, the protective film including an inorganic material.

16. The display device of claim 15, comprising:
a first contact electrode located on the first electrode and the one end portion of each of the light emitting elements; and
a second contact electrode located on the second electrode and the other end portion of each of the light emitting elements,
wherein the first contact electrode is electrically connected to the first electrode, and the second contact electrode is electrically connected to the second electrode.

* * * * *